United States Patent
Ohashi et al.

(10) Patent No.: US 8,980,527 B2
(45) Date of Patent: Mar. 17, 2015

(54) PATTERN FORMING PROCESS AND RESIST COMPOSTION

(71) Applicant: Shin-Etsu Chemical Co., Ltd., Tokyo (JP)

(72) Inventors: Masaki Ohashi, Joetsu (JP); Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 40 days.

(21) Appl. No.: 13/734,241

(22) Filed: Jan. 4, 2013

(65) Prior Publication Data

US 2013/0183621 A1    Jul. 18, 2013

(30) Foreign Application Priority Data

Jan. 13, 2012   (JP) .................................. 2012-004701

(51) Int. Cl.
*G03F 7/004* (2006.01)
*G03F 7/028* (2006.01)
*G03F 7/039* (2006.01)
*G03F 7/20* (2006.01)

(52) U.S. Cl.
CPC ............... *G03F 7/004* (2013.01); *G03F 7/028* (2013.01); *G03F 7/0045* (2013.01); *G03F 7/0046* (2013.01); *G03F 7/0397* (2013.01); *G03F 7/2041* (2013.01); *Y10S 430/12* (2013.01); *Y10S 430/122* (2013.01); *Y10S 430/126* (2013.01)
USPC ........ 430/270.1; 430/326; 430/919; 430/921; 430/925

(58) Field of Classification Search
CPC ......... G03F 7/004; G03F 7/029; G03F 7/039; G03F 7/0392; G03F 7/20; G03F 7/2041; G03F 7/26
USPC ............... 430/270.1, 326, 910, 919, 921, 925
See application file for complete search history.

(56) References Cited

U.S. PATENT DOCUMENTS

| | | | |
|---|---|---|---|
| 5,650,483 A | 7/1997 | Malik et al. | |
| 6,312,867 B1 | 11/2001 | Kinsho et al. | |
| 6,479,210 B2 | 11/2002 | Kinoshita et al. | |
| 6,485,883 B2 | 11/2002 | Kodama et al. | |
| 6,492,091 B2 | 12/2002 | Kodama et al. | |
| 6,830,866 B2 | 12/2004 | Kobayashi et al. | |
| 7,214,467 B2 | 5/2007 | Kanna et al. | |
| 7,511,169 B2 | 3/2009 | Ohsawa et al. | |
| 7,527,912 B2 | 5/2009 | Ohsawa et al. | |
| 7,569,326 B2 | 8/2009 | Ohsawa et al. | |
| 7,622,242 B2 | 11/2009 | Hatakeyama et al. | |
| 7,771,914 B2 | 8/2010 | Hatakeyama et al. | |
| 8,057,981 B2 | 11/2011 | Harada et al. | |
| 8,057,985 B2 | 11/2011 | Ohashi et al. | |
| 8,062,828 B2 | 11/2011 | Ohsawa et al. | |
| 8,101,335 B2 | 1/2012 | Harada et al. | |
| 8,105,748 B2 | 1/2012 | Ohashi et al. | |
| 8,110,711 B2 | 2/2012 | Jodry et al. | |
| 8,114,570 B2 | 2/2012 | Ohsawa et al. | |
| 8,173,354 B2 | 5/2012 | Ohsawa et al. | |
| 8,252,504 B2 | 8/2012 | Harada et al. | |
| 8,268,528 B2 | 9/2012 | Harada et al. | |
| 8,283,104 B2 | 10/2012 | Ohashi et al. | |
| 8,313,886 B2 | 11/2012 | Harada et al. | |
| 2008/0038661 A1 | 2/2008 | Chiba et al. | |
| 2009/0274978 A1 | 11/2009 | Ohashi et al. | |
| 2010/0035185 A1 | 2/2010 | Hagiwara et al. | |
| 2010/0112482 A1 | 5/2010 | Watanabe et al. | |
| 2010/0233617 A1 | 9/2010 | Wada | |
| 2011/0034721 A1* | 2/2011 | Hagiwara et al. | ............. 560/117 |
| 2011/0223537 A1* | 9/2011 | Ebata et al. | ................. 430/270.1 |
| 2012/0065291 A1 | 3/2012 | Matsumura et al. | |
| 2012/0082936 A1* | 4/2012 | Serizawa et al. | ........... 430/285.1 |
| 2012/0101205 A1 | 4/2012 | Chiba et al. | |
| 2012/0149916 A1* | 6/2012 | Utsumi et al. | .................. 549/49 |
| 2012/0214101 A1* | 8/2012 | Shimizu et al. | ............ 430/285.1 |

FOREIGN PATENT DOCUMENTS

| | | | |
|---|---|---|---|
| JP | 11-327143 A | 11/1999 | |
| JP | 2000-336121 A | 12/2000 | |
| JP | 2003-66612 A | 3/2003 | |
| JP | 2007-145797 A | 6/2007 | |
| JP | 3955384 B2 | 8/2007 | |
| JP | 2007-298569 A | 11/2007 | |
| JP | 2008-106045 A | 5/2008 | |
| JP | 2008-122932 A | 5/2008 | |
| JP | 2008-133448 A | 6/2008 | |
| JP | 4116340 B2 | 7/2008 | |
| JP | 2009-7327 A | 1/2009 | |
| JP | 4226803 B2 | 2/2009 | |
| JP | 4231622 B2 | 3/2009 | |
| JP | 2009-91350 A | 4/2009 | |
| JP | 2009-093137 A | 4/2009 | |
| JP | 2009-98638 A | 5/2009 | |
| JP | 2009-191151 A | 8/2009 | |

(Continued)

OTHER PUBLICATIONS

Japanese Office Action dated Oct. 28, 2014, issued in corresponding JP Application No. 2012-004701 (4 pages).

*Primary Examiner* — Anca Eoff

(74) *Attorney, Agent, or Firm* — Westerman, Hattori, Daniels & Adrian, LLP

(57) ABSTRACT

A resist composition is provided comprising a polymer comprising recurring units having a carboxyl group substituted with an acid labile group, an acid generator, a sulfonium or iodonium salt of fluoroalkanesulfonamide and an organic solvent. A positive pattern is formed by applying the resist composition onto a substrate, prebaking to form a resist film, exposing the resist film to high-energy radiation, baking, and immersing in an alkaline developer to dissolve away the exposed region of resist film, but not the unexposed region.

5 Claims, 2 Drawing Sheets

(56) References Cited

FOREIGN PATENT DOCUMENTS

| | | |
|---|---|---|
| JP | 2009-192784 A | 8/2009 |
| JP | 2009-217253 A | 9/2009 |
| JP | 2009-258695 A | 11/2009 |
| JP | 2009-269953 A | 11/2009 |
| JP | 2009-274963 A | 11/2009 |
| JP | 2009-276363 A | 11/2009 |
| JP | 2010-20204 A | 1/2010 |
| JP | 2010-77404 A | 4/2010 |
| JP | 2010-107695 A | 5/2010 |
| JP | 2010-116550 A | 5/2010 |
| JP | 2010-134012 A | 6/2010 |
| JP | 2010-215608 A | 9/2010 |
| JP | 2010-250105 A | 11/2010 |
| JP | 2010-265435 A | 11/2010 |
| JP | 2011-16746 A | 1/2011 |
| JP | 2011-42789 A | 3/2011 |
| JP | 2012-121830 A | 6/2012 |
| WO | 2006/035790 A1 | 4/2006 |
| WO | 2011/115190 A1 | 9/2011 |

* cited by examiner

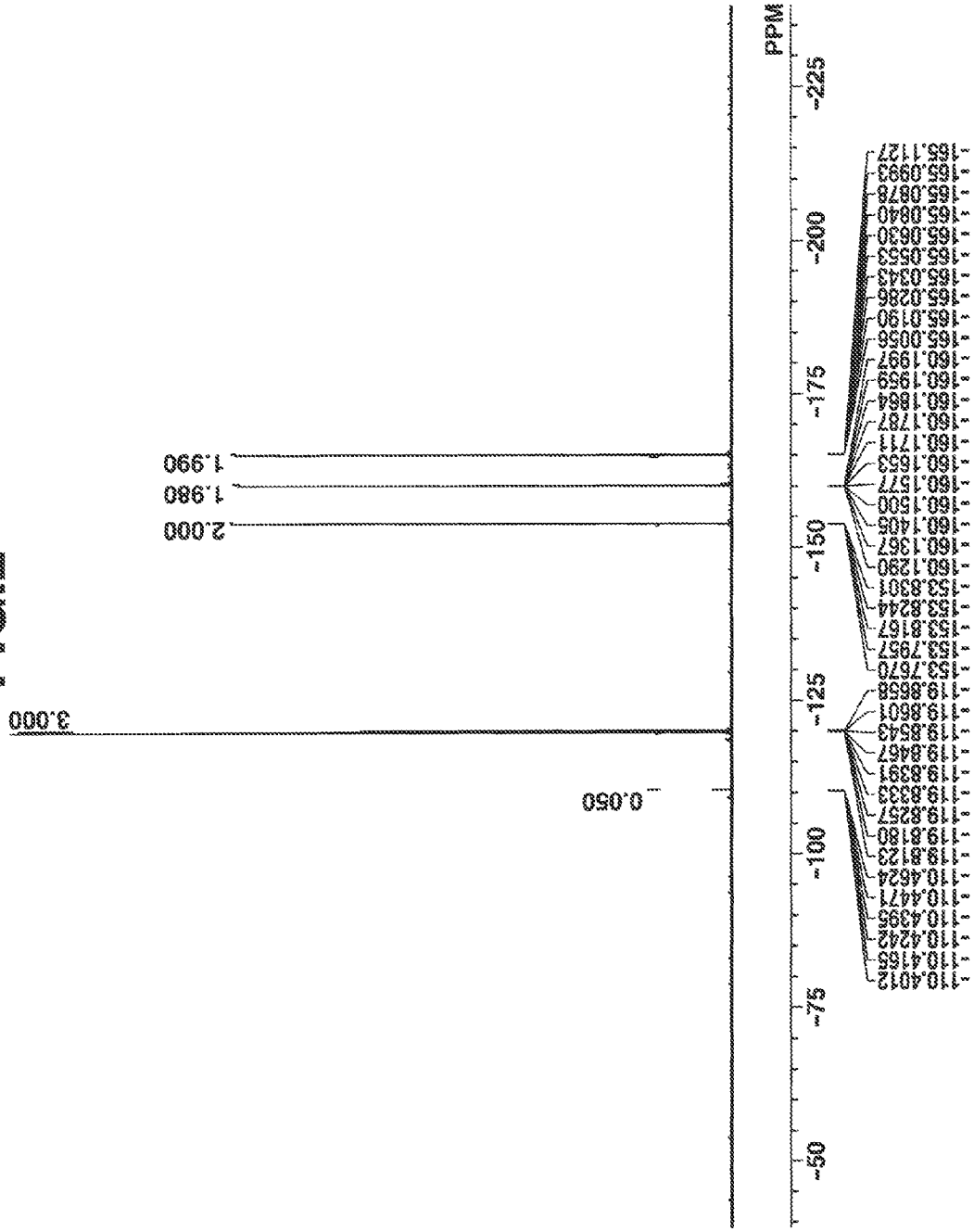

PATTERN FORMING PROCESS AND RESIST COMPOSTION

CROSS-REFERENCE TO RELATED APPLICATION

This non-provisional application claims priority under 35 U.S.C. §119(a) on Patent Application No. 2012-004701 filed in Japan on Jan. 13, 2012, the entire contents of which are hereby incorporated by reference.

TECHNICAL FIELD

This invention relates to a chemically amplified resist composition comprising a sulfonium or iodonium salt of fluoroalkanesulfonamide, and a pattern forming process using the resist composition.

BACKGROUND ART

While a number of recent efforts are being made to achieve a finer pattern rule in the drive for higher integration and operating speeds in LSI devices, DUV and EUV lithography is thought to hold particular promise as the next generation in microfabrication technology. In particular, photolithography using an ArF excimer laser as the light source is thought requisite to the micropatterning technique capable of achieving a feature size of 0.13 μm or less.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. While the ArF immersion lithography has entered the commercial stage, the technology still needs a resist material which is substantially non-leachable in water.

In the ArF lithography (193 nm), a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polyacrylic acid and derivatives thereof, norbornene-maleic anhydride alternating copolymers, polynorbornene, ring-opening metathesis polymerization (ROMP) polymers, and hydrogenated ROMP polymers have been proposed as the base resin. This choice is effective to some extent in enhancing the transparency of a resin alone.

Studies have also been made on photoacid generators (PAGs) and diffusion regulators. Sulfonium salts such as triphenylsulfonium nonafluorobutanesulfonate are typically used as the PAG because of stability in resist compositions. Amines and weak acid onium salts are typically used as the diffusion regulator. JP 3955384 describes that the addition of triphenylsulfonium acetate ensures to form a satisfactory resist pattern without T-top profile, a difference in line width between isolated and grouped patterns, and standing waves. JP-A H11-327143 reports improvements in sensitivity, resolution and exposure margin by the addition of sulfonic acid ammonium salt or carboxylic acid ammonium salt. Also, JP 4231622 describes that a resist composition for KrF or EB lithography comprising a PAG capable of generating a fluorinated carboxylic acid is improved in resolution and process latitude such as exposure margin and depth of focus. Further, JP 4116340 describes that a resist composition for $F_2$ laser lithography comprising a PAG capable of generating a fluorinated carboxylic acid is improved in line edge roughness (LER) and solves the footing problem. While these four patent documents refer to the KrF, EB and $F_2$ lithography, JP 4226803 describes a positive photosensitive composition for ArF excimer laser lithography comprising a carboxylic acid onium salt. These systems are based on the mechanism that a salt exchange occurs between a weak acid onium salt and a strong acid (sulfonic acid) generated by another PAG upon exposure, to form a weak acid and a strong acid onium salt. That is, the strong acid (sulfonic acid) having high acidity is replaced by a weak acid (carboxylic acid), thereby suppressing acid-aided decomposition reaction of acid labile group and reducing or controlling the distance of acid diffusion. The onium salt apparently functions as a quencher. However, the foregoing carboxylic acids, carboxylic acid ammonium salts, and fluorocarboxylic acid onium salts undergo salt exchange reaction with sulfonic acid at a slow rate, indicating a poor quencher function.

JP-A 2010-265435 discloses a base resin having incorporated therein an onium salt of alkylsulfonamide which is a weak acid onium salt. When this base resin is applied to the upcoming generation of ultrafine processing using ArF lithography or ArF immersion lithography, the line width roughness (LWR), indicative of pattern roughness, and resolution are yet short. There is still a need for a weak acid onium salt having improved quencher function.

CITATION LIST

Patent Document 1: JP 3955384 (U.S. Pat. No. 6,479,210)
Patent Document 2: JP-A H11-327143
Patent Document 3: JP 4231622 (U.S. Pat. No. 6,485,883)
Patent Document 4: JP 4116340 (U.S. Pat. No. 7,214,467)
Patent Document 5: JP 4226803 (U.S. Pat. No. 6,492,091)
Patent Document 6: JP-A 2010-265435 (US 20120065291)

DISCLOSURE OF INVENTION

An object of the invention is to provide a chemically amplified resist composition which is processed by DUV lithography and EUV lithography to form a resist pattern with improved resolution, LWR and minimal defects after development, and a pattern forming process using the resist composition.

The inventors have found that a resist composition comprising a sulfonium or iodonium salt of fluoroalkanesulfonamide can be processed by lithography to form a resist pattern with improved resolution, LWR and minimal defects after development, and is suited for high accuracy micropatterning.

In one aspect, the invention provides a pattern forming process comprising the steps of applying a resist composition onto a substrate, prebaking to form a resist film, exposing the resist film to high-energy radiation, baking, and immersing in an alkaline developer to form a positive pattern wherein the exposed region of resist film is dissolved away, but not the unexposed region, the resist composition comprising a polymer comprising recurring units having a carboxyl group substituted with an acid labile group and an acid generator, or a polymer comprising recurring units having a carboxyl group substituted with an acid labile group and recurring units capable of generating acid upon exposure, a sulfonium or iodonium salt of fluoroalkanesulfonamide, and an organic solvent.

In a preferred embodiment, the polymer comprising recurring units having a carboxyl group substituted with an acid labile group is a polymer comprising recurring units having an acid labile group represented by the general formula (1) and recurring units of at least one type selected from the general formulae (2) and (3).

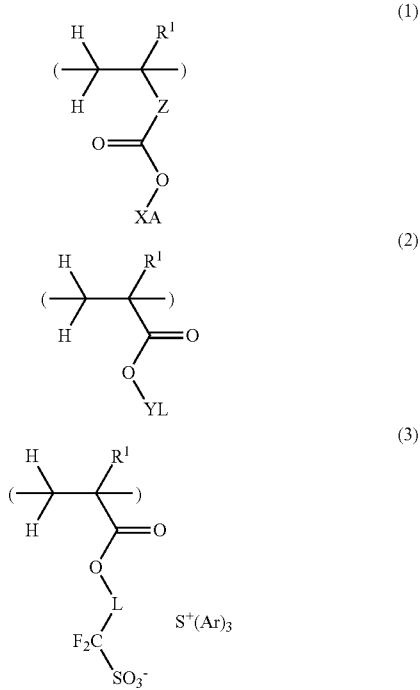

Herein $R^1$ is hydrogen, fluorine, methyl or trifluoromethyl, Z is a single bond, phenylene, naphthylene or (backbone)-C(=O)—O—Z'—, Z' is a straight, branched or cyclic $C_1$-$C_{10}$ alkylene group which may contain a hydroxyl radical, ether bond, ester bond, or lactone ring, or a phenylene or naphthylene group, XA is an acid labile group, YL is hydrogen, or a polar group having one or more structures selected from the group consisting of hydroxyl, cyano, carbonyl, carboxyl, ether bond, ester bond, sulfonic acid ester, carbonate bond, lactone ring, sultone ring, and carboxylic anhydride, L is a single bond, or a divalent hydrocarbon group which may have an ether bond or ester bond, and Ar is a substituted or unsubstituted $C_6$-$C_{20}$ aryl group which may contain a heteroatom, a plurality of Ar groups may bond together directly or via an oxygen atom, methylene, sulfonyl or carbonyl moiety.

In a preferred embodiment, the sulfonium or iodonium salt of fluoroalkanesulfonamide is a salt (Q1) or (Q2) having the general formula (4).

(4)

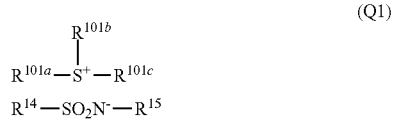
(Q1)

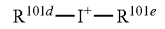
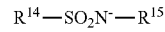
(Q2)

Herein $R^{101a}$, $R^{101b}$ and $R^{101c}$ are each independently a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by an oxygen atom, oxycarbonyl, carbonyl, carbonate, hydroxyl, carboxyl, halogen atom, cyano, amino, amide, nitro, sulfonyloxy, sulfonyl, or sulfonium salt-containing substituent group, or $R^{101b}$ and $R^{101c}$ may bond together to form a ring with the sulfur atom to which they are attached, $R^{101b}$ and $R^{101c}$ stand for a mono- or polycyclic hydrocarbon group having 4 to 16 carbon atoms in total and optionally containing an oxygen or sulfur atom when they form a ring. $R^{101d}$ and $R^{101e}$ are each independently a $C_6$-$C_{20}$ aryl group which may have a straight, branched or cyclic $C_1$-$C_6$ alkyl or alkoxy radical, or $R^{101d}$ and $R^{101e}$ may bond together to form a ring with the iodine atom to which they are attached, $R^{101d}$ and $R^{101e}$ stand for a mono- or polycyclic hydrocarbon group having 4 to 16 carbon atoms in total when they form a ring. $R^{14}$ is a straight, branched or cyclic $C_1$-$C_{10}$ alkyl group or alkenyl group, which has at least one fluorine atom. $R^{15}$ is hydrogen, or a straight, branched or cyclic $C_1$-$C_{20}$ alkyl group, straight, branched or cyclic $C_2$-$C_{12}$ alkenyl group or $C_6$-$C_{10}$ aryl group, which may have an ether bond, ester bond, carbonyl, amide, hydroxyl or carboxyl radical.

In a preferred embodiment, the step of exposing the resist film to high-energy radiation includes dry or immersion lithography using ArF excimer laser of wavelength 193 nm, EUV lithography of wavelength 13.5 nm, or EB imaging.

In a preferred embodiment, the pattern forming process may comprise the steps of applying the resist composition onto a substrate, prebaking to form a resist film, forming a protective film on the resist film, exposing the resist film to high-energy radiation, baking, and immersing in a developer to dissolve away the protective film and the exposed region of resist film, but not the unexposed region, for thereby forming a positive pattern.

In another aspect, the invention provides a resist composition comprising a polymer, an acid generator, a sulfonium salt (Q1) or iodonium salt (Q2) of fluoroalkanesulfonamide, and an organic solvent, wherein the polymer comprises acid labile group-substituted recurring units having the above formula (1), and the sulfonium salt (Q1) or iodonium salt (Q2) of fluoroalkanesulfonamide has the above formula (4).

The resist composition of the invention allows the feature size of the pattern after development to be reduced by various shrinkage techniques. For example, the hole size can be shrunk by such known techniques as thermal flow, RELACS, SAFIRE, and WASOOM. More effective shrinkage of hole size by thermal flow is possible particularly when a hydrogenated cycloolefin ROMP polymer having a low Tg or the like is blended in the composition.

ADVANTAGEOUS EFFECTS OF INVENTION

Since the sulfonium or iodonium salt of fluoroalkanesulfonamide exerts a satisfactory quencher function, the inventive resist composition comprising the same enables to construct a pattern profile with a high resolution, low LWR, and rectangularity.

BRIEF DESCRIPTION OF ACCOMPANYING DRAWINGS

FIG. 2 is a diagram of $^{19}$F-NMR spectrum of the compound obtained in Synthesis Example 1.

DESCRIPTION OF EMBODIMENTS

Figure 1:
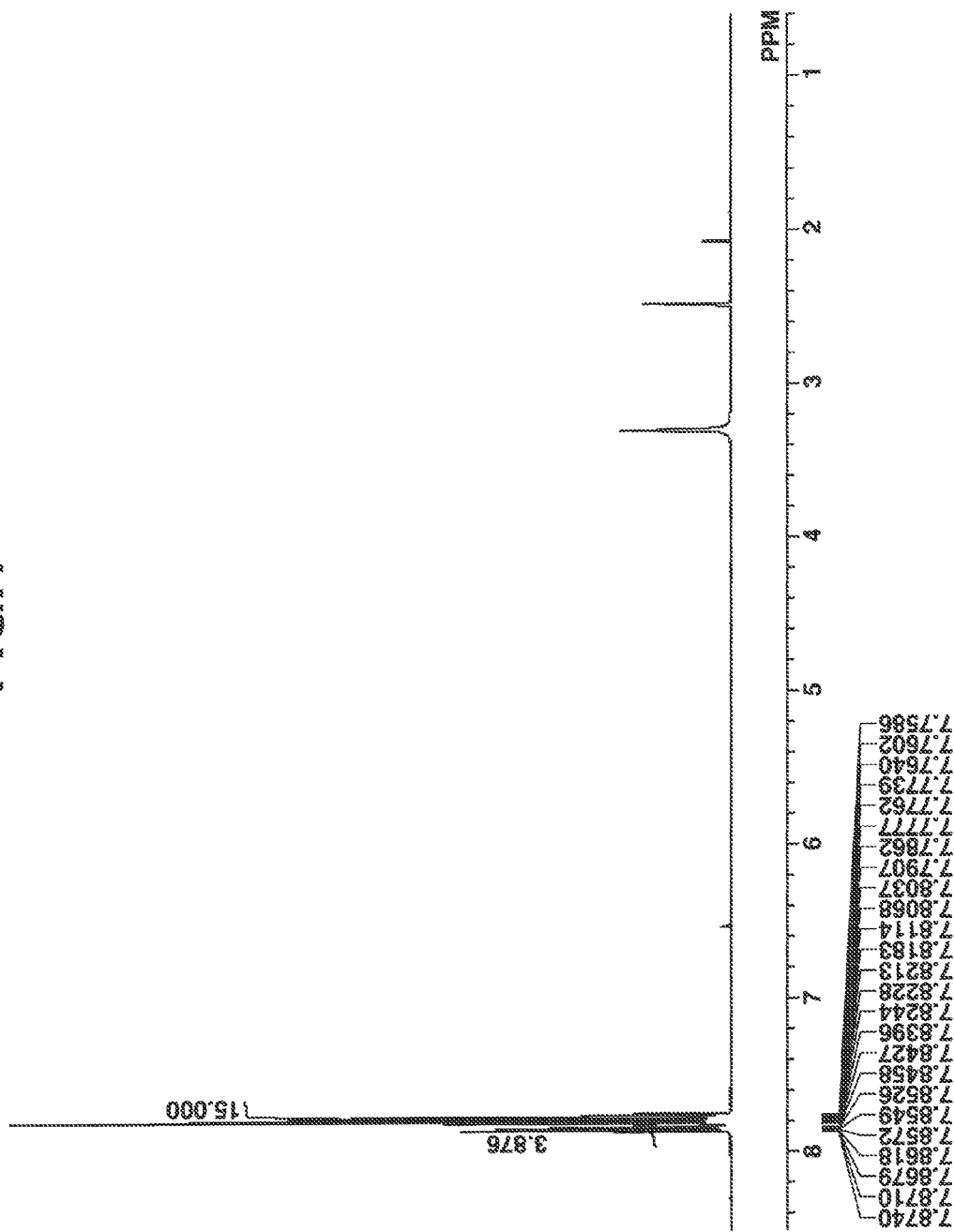
FIG. 1 is a diagram of $^1$H-NMR spectrum of the compound obtained in Synthesis Example 1.

As used herein, the singular forms "a," an and the include plural referents unless the context clearly dictates otherwise. The notation (Cn-Cm) means a group containing from n to m carbon atoms per group.

The abbreviations and acronyms have the following meaning.

DUV: deep ultraviolet
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness In structural formulae, the broken line indicates a valence bond. Ph stands for phenyl and Ac for acetyl.

Briefly stated, one embodiment of the invention is a chemically amplified positive resist composition comprising (A) a polymer comprising recurring units having a carboxyl group substituted with an acid labile group, (B) an acid generator capable of generating an acid upon exposure, (C) a sulfonium or iodonium salt of fluoroalkanesulfonamide, and (D) an organic solvent as essential components.

(A) Polymer

The polymer comprising recurring units having a carboxyl group substituted with an acid labile group as component (A) is typically a polymer comprising essentially recurring units having an acid labile group represented by the general formula (1), and optionally recurring units of at least one type selected from the general formulae (2) and (3).

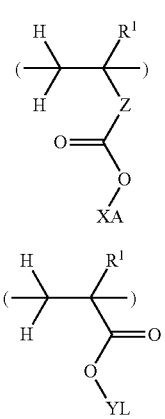

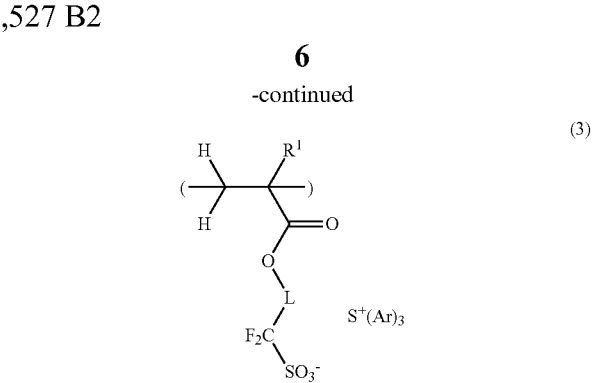

Herein $R^1$ is hydrogen, fluorine, methyl or trifluoromethyl. Z is a single bond, phenylene, naphthylene or (backbone)-C(=O)—O—Z'—, wherein Z' is a straight, branched or cyclic $C_1$-$C_{10}$ alkylene group which may contain a hydroxyl radical, ether bond, ester bond, or lactone ring, or a phenylene or naphthylene group. XA is an acid labile group. YL is hydrogen, or a polar group having one or more structures selected from the group consisting of hydroxyl, cyano, carbonyl, carboxyl, ether bond, ester bond, sulfonic acid ester, carbonate bond, lactone ring, sultone ring, and carboxylic anhydride. L is a single bond, or a divalent hydrocarbon group which may have an ether bond or ester bond. Ar is a substituted or unsubstituted $C_6$-$C_{20}$ aryl group which may contain a heteroatom, a plurality of Ar groups may bond together directly or via an oxygen atom, methylene, sulfonyl or carbonyl moiety.

Examples of the structure of formula (1) wherein Z is a variant are illustrated below.

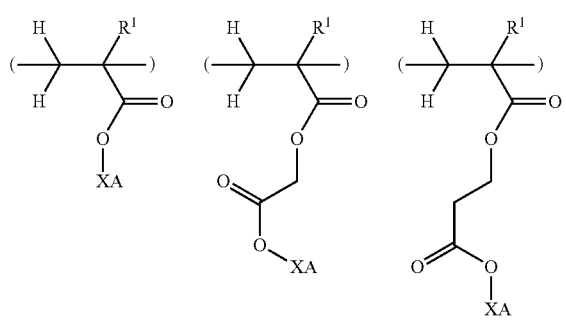

-continued

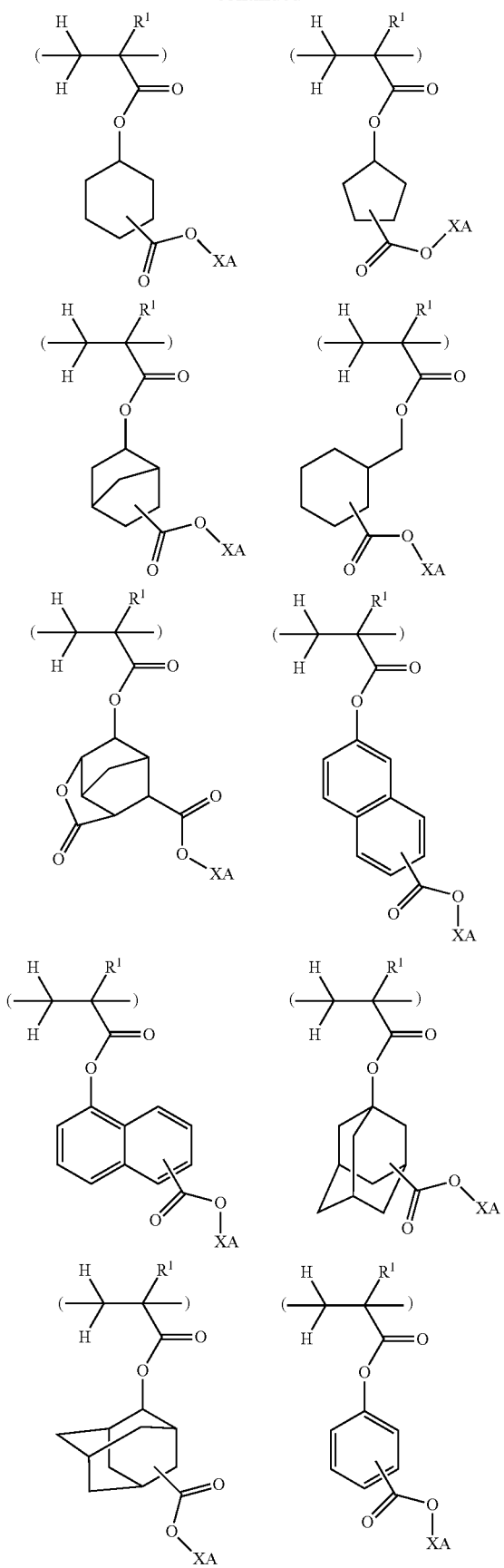
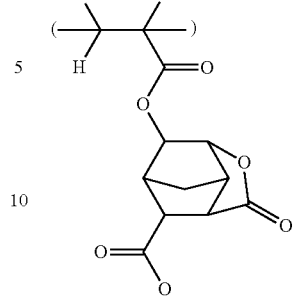
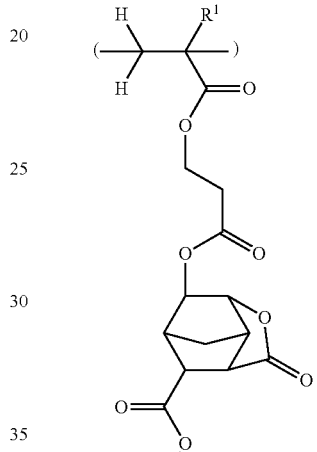
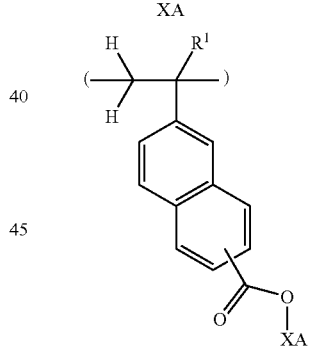
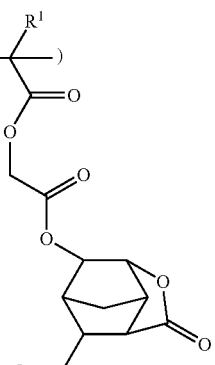
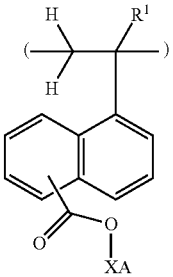
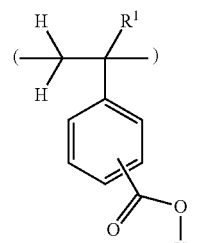

The polymer comprising recurring units having formula (1) functions such that it may be decomposed to generate carboxylic acid under the action of an acid and turn alkali soluble. The acid labile group represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

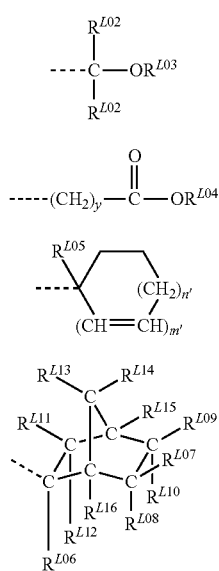

(L1)
(L2)
(L3)
(L4)

It is noted that the broken line denotes a valence bond.

In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

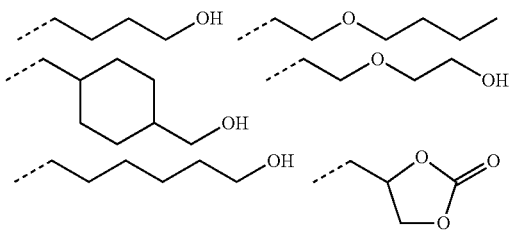

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_8$ alkyl group or an optionally substituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl and cyclohexyl, and substituted forms of the foregoing in which some hydrogen atoms are substituted by hydroxyl, alkoxy, carboxyl, alkoxycarbonyl, oxo, amino, alkylamino, cyano, mercapto, alkylthio, sulfo or the like. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2 m'+n' is equal to 2 or 3.

In formula (L4), $R^{L06}$ is an optionally substituted, straight, branched or cyclic $C_1$-$C_8$ alkyl group or an optionally substituted $C_6$-$C_{20}$ aryl group. Examples of these groups are the same as exemplified for $R^{L05}$. $R^{L07}$ to $R^{L16}$ independently represent hydrogen or $C_1$-$C_{15}$ monovalent hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, $R^{L14}$ and $R^{L15}$, or a similar pair).

Of the acid labile groups of formula (L1), the straight and branched ones are exemplified by the following groups.

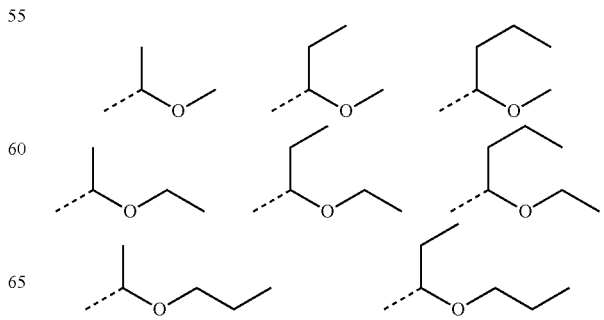

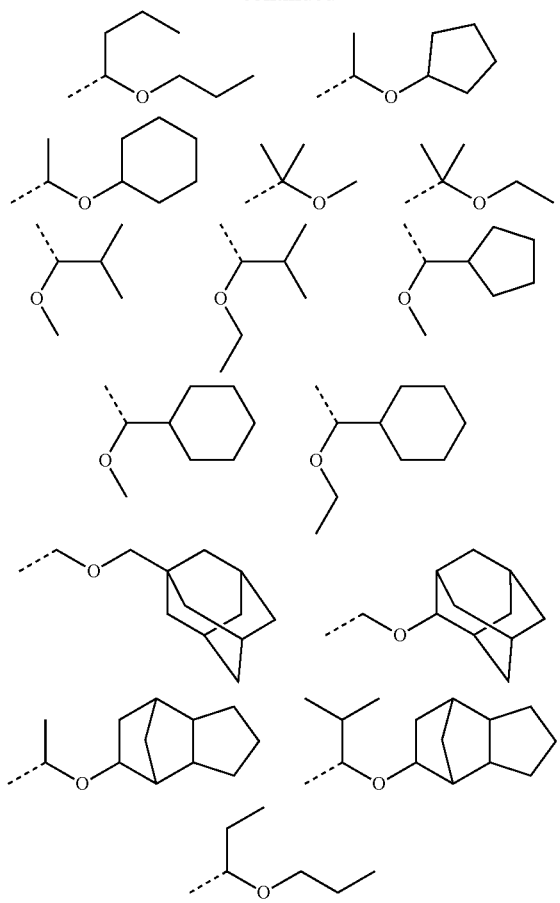

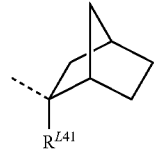
(L4-1)

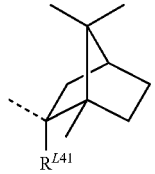
(L4-2)

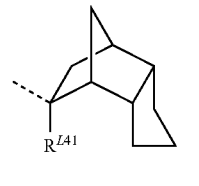
(L4-3)

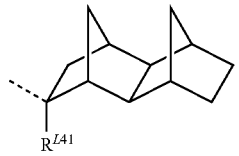
(L4-4)

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

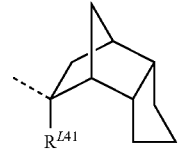
(L4-3-1)

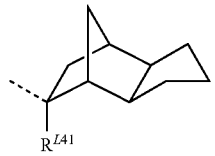
(L4-3-2)

Similarly, the general formula (L4-4) represents one or a mixture of two or more selected from groups having the following general formulas (L4-4-1) to (L4-4-4).

(L4-4-1)
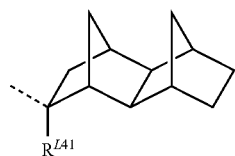

(L4-4-2)
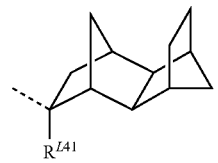

(L4-4-3)
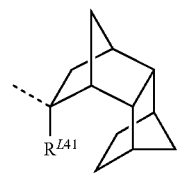

(L4-4-4)
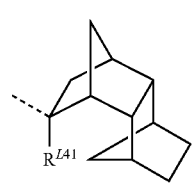

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)
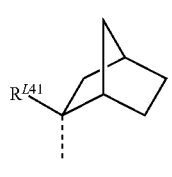

(L4-2-endo)
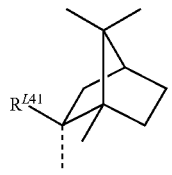

(L4-3-endo)
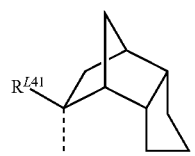

(L4-4-endo)
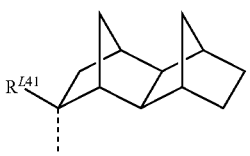

Illustrative examples of the acid labile group of formula (L4) are given below.

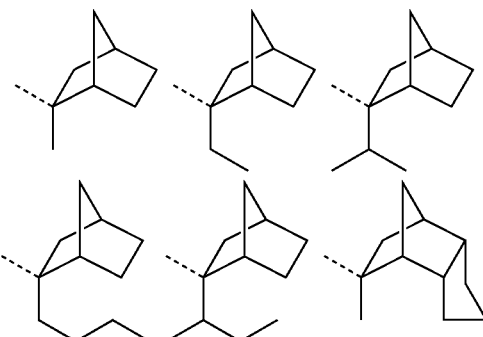
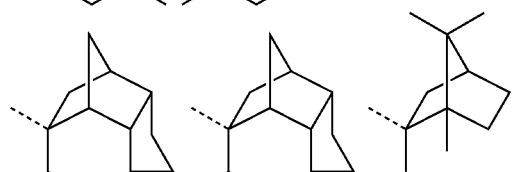
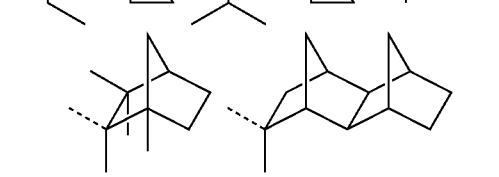
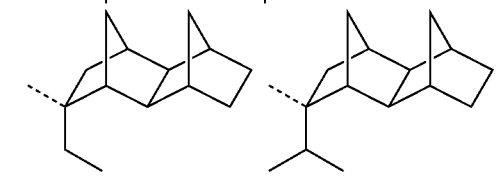

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.

Illustrative examples of the recurring units of formula (1) are given below, but not limited thereto.

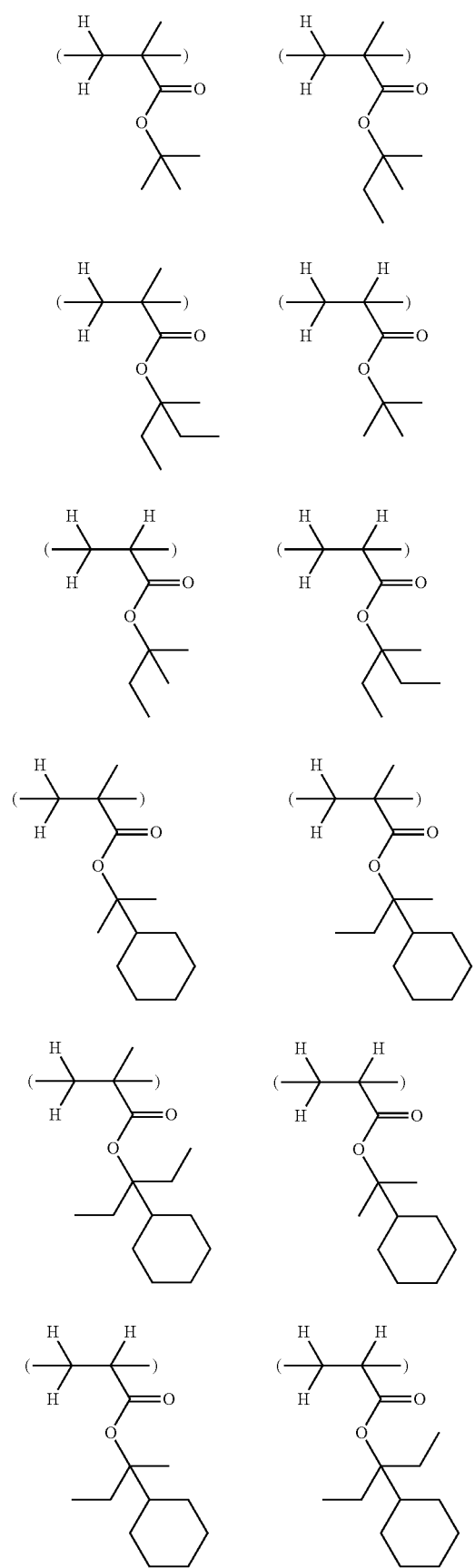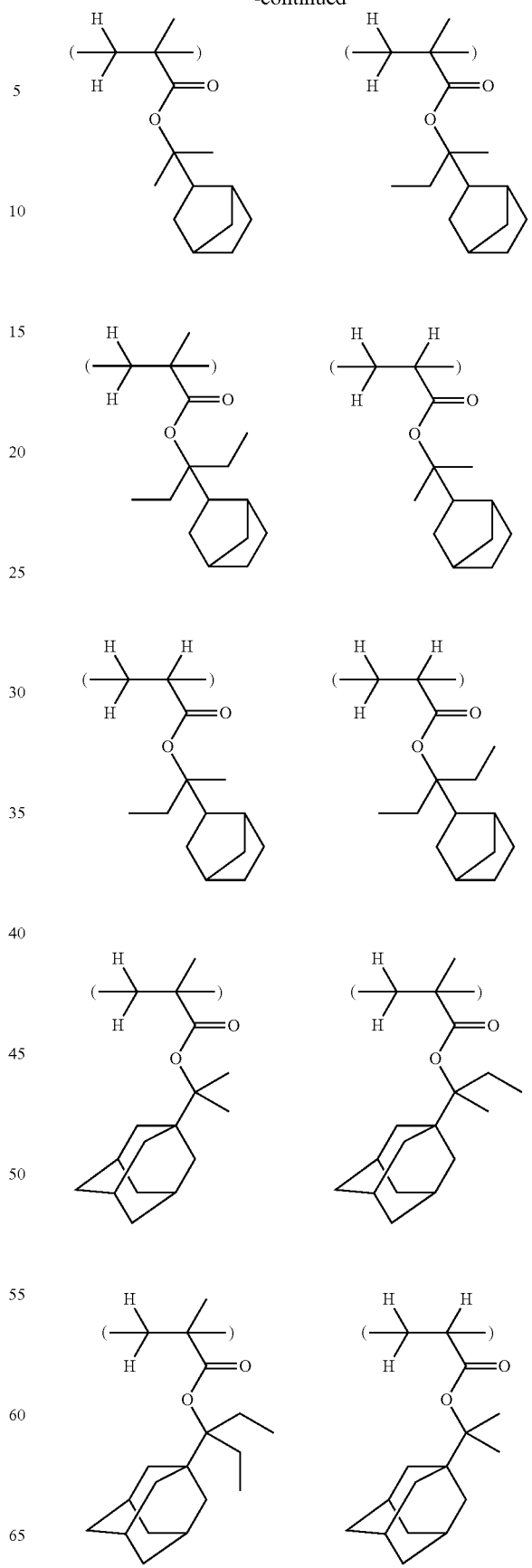

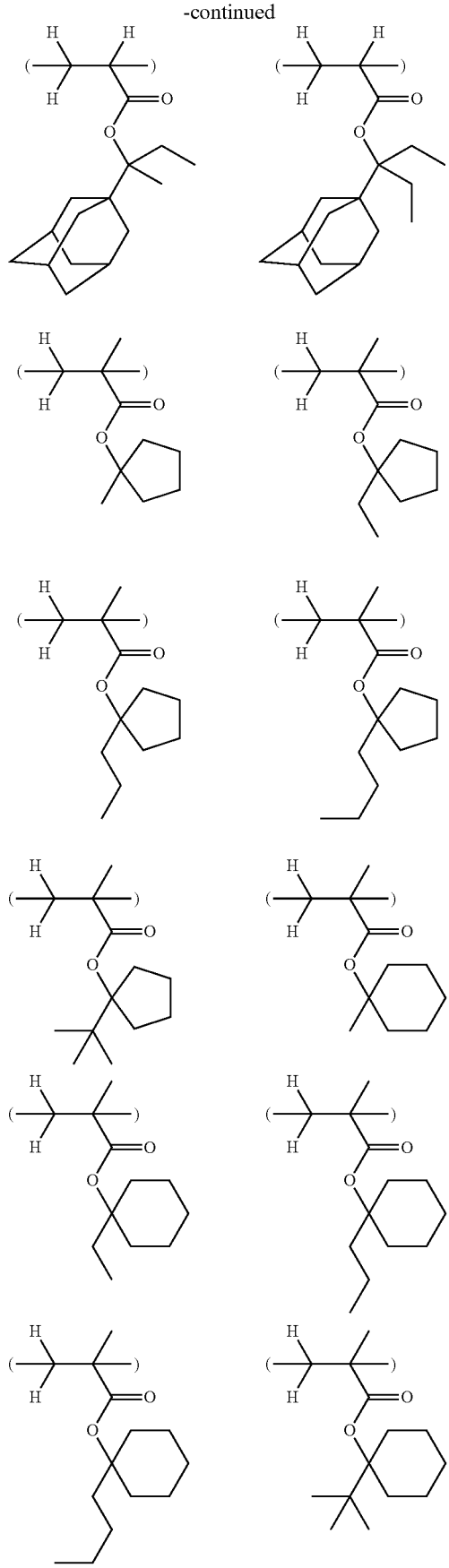
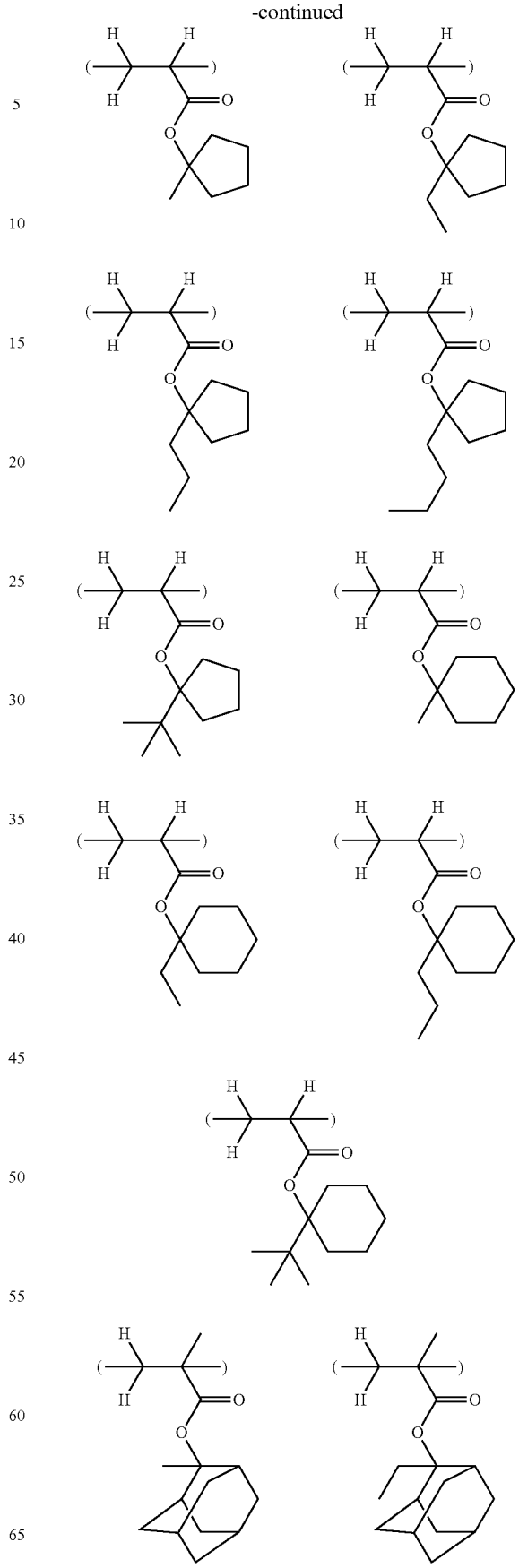

-continued
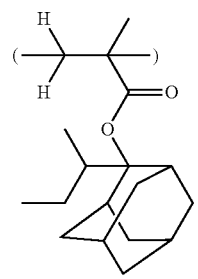 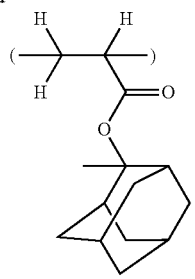 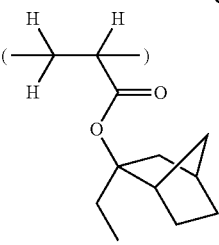 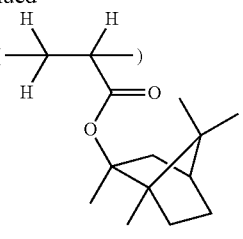
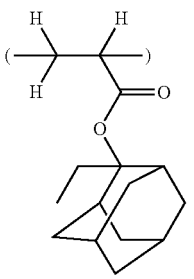 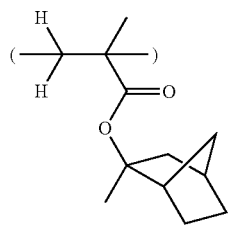 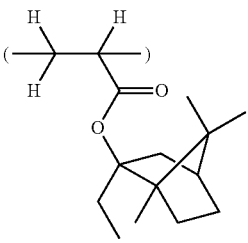 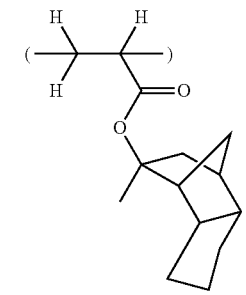
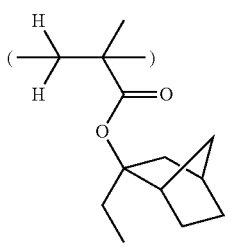 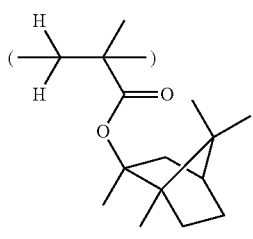 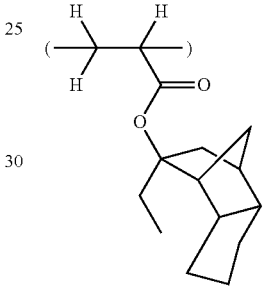 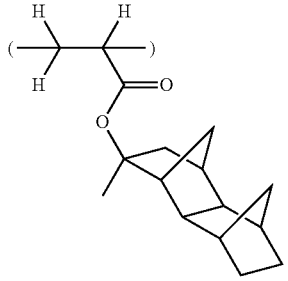
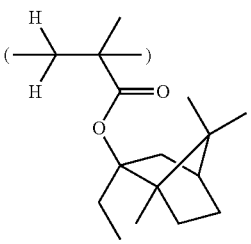 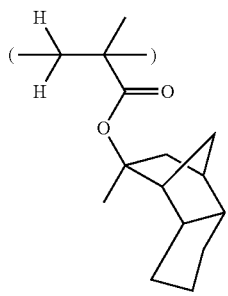 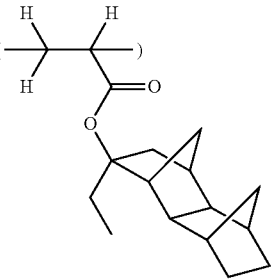 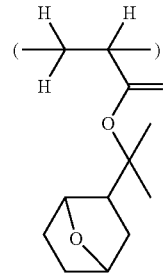
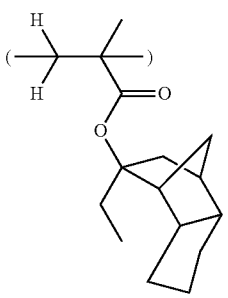 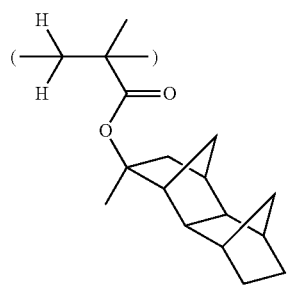 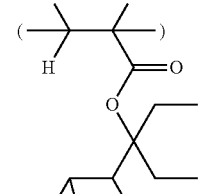 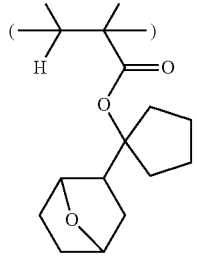
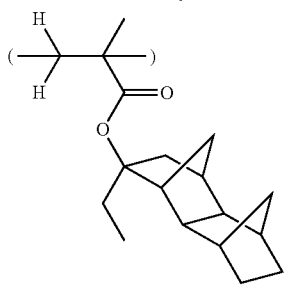 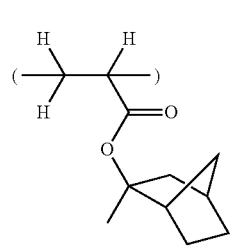 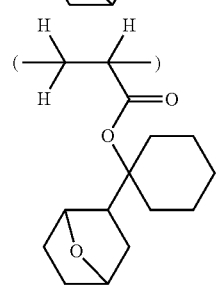 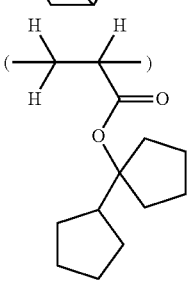

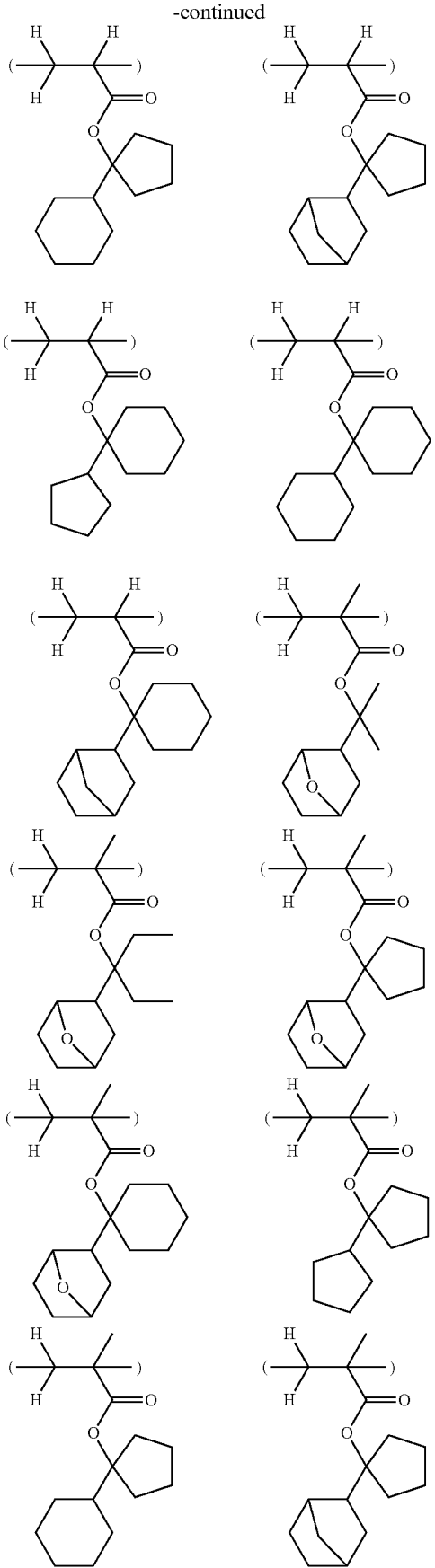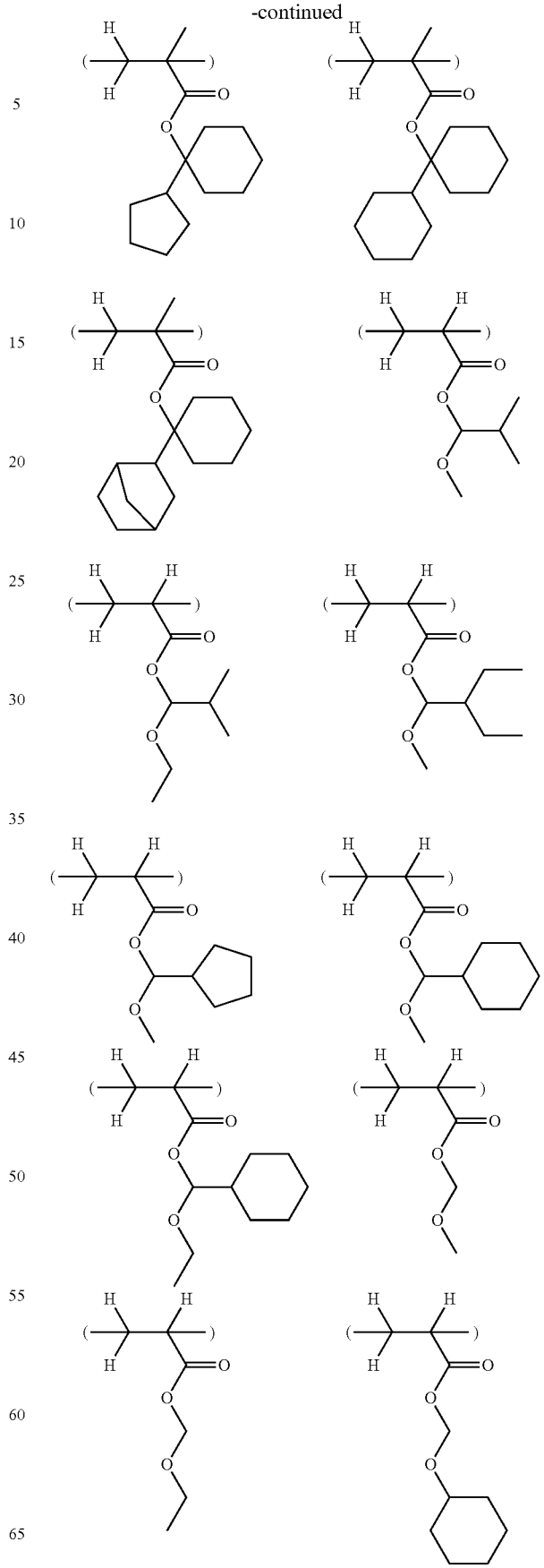

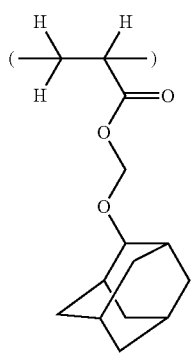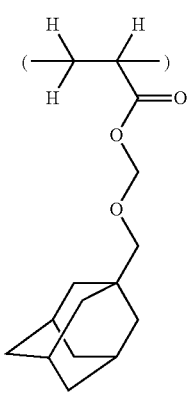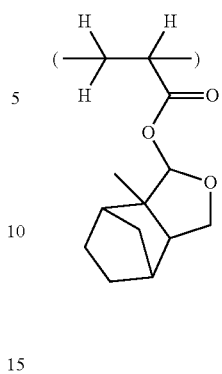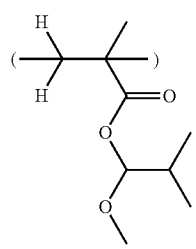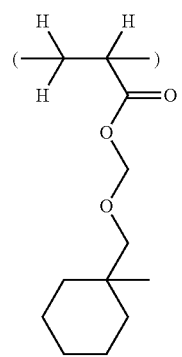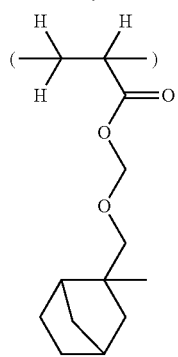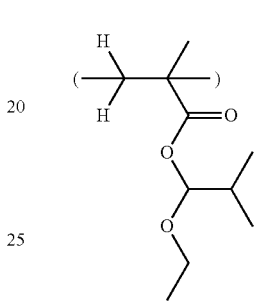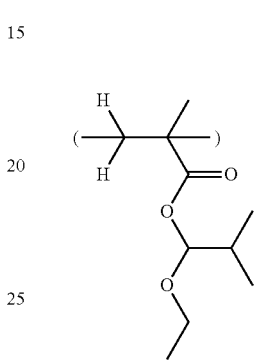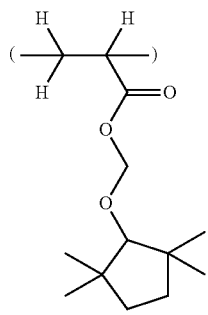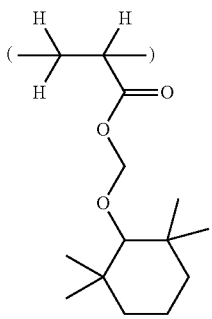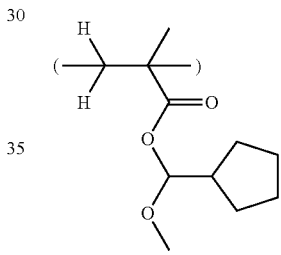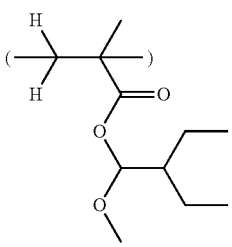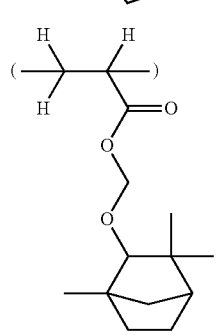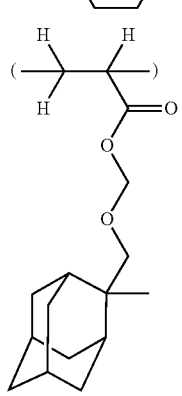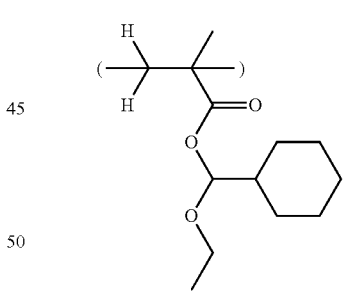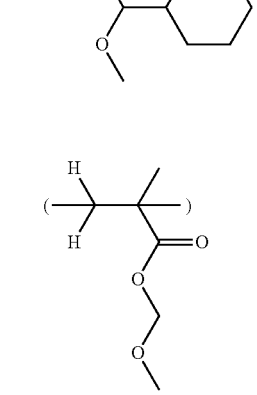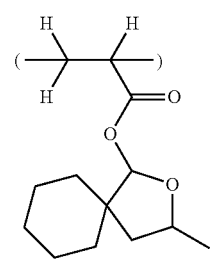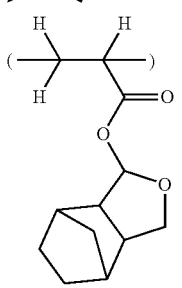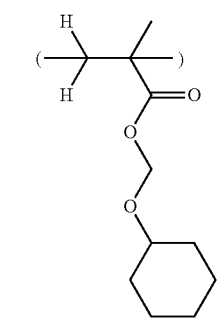

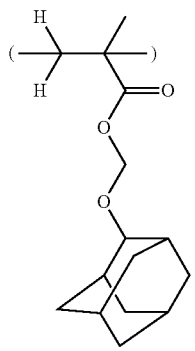
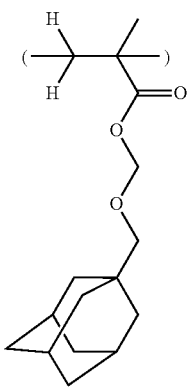
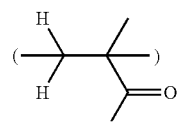
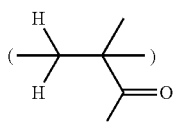
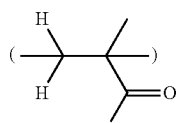
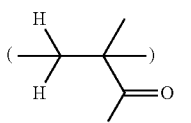
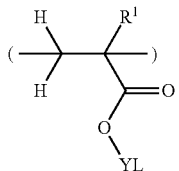

The above examples correspond to those units of formula (1) wherein Z is a single bond. Where Z is other than a single bond, a combination with a similar acid labile group is possible. Thus examples of the recurring units of formula (1) wherein Z is other than a single bond are as illustrated above.

While the polymer comprises essentially recurring units having an acid labile group represented by formula (1), optionally recurring units having the general formula (2) may be incorporated.

$$\text{(2)}$$

Herein $R^1$ is hydrogen, fluorine, methyl or trifluoromethyl. YL is hydrogen, or a polar group having one or more structures selected from the group consisting of hydroxyl, cyano, carbonyl, carboxyl, ether bond, ester bond, sulfonic acid ester, carbonate bond, lactone ring, sultone ring, and carboxylic anhydride.

In formula (2), YL is hydrogen, or YL is a polar group having one or more structures selected from the group consisting of hydroxyl, cyano, carbonyl, carboxyl, ether bond, ester bond, sulfonic acid ester, carbonate bond, lactone ring, sultone ring, and carboxylic anhydride. Further, recurring units derived from a monomer having an adhesive group such as hydroxyl, cyano, carbonyl, ester, ether, lactone ring, carboxyl, carboxylic anhydride, sulfonic acid ester, disulfone, or carbonate may be copolymerized. Inter alia, units having lactone ring as the polar group are most preferred.

Illustrative examples of the recurring units of formula (2) are given below, but not limited thereto.

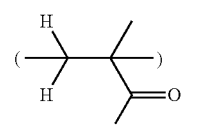
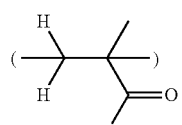
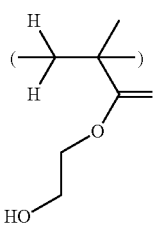
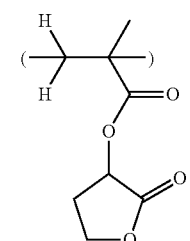
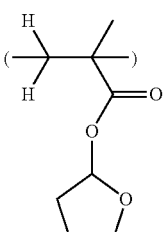

27
-continued
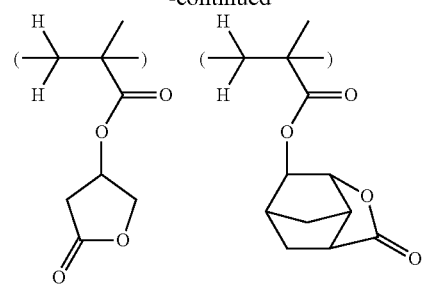
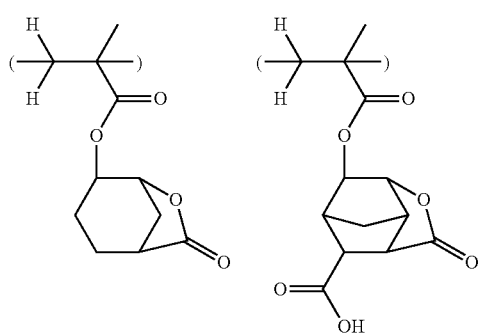
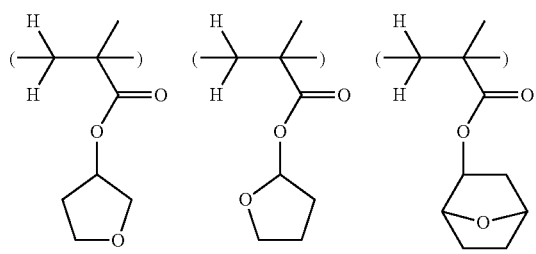
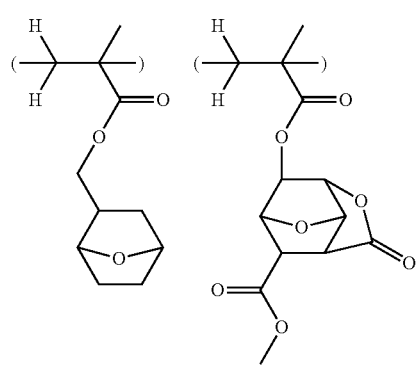
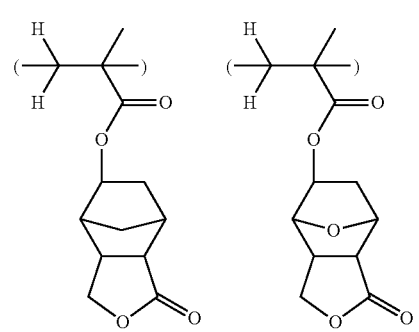
28
-continued
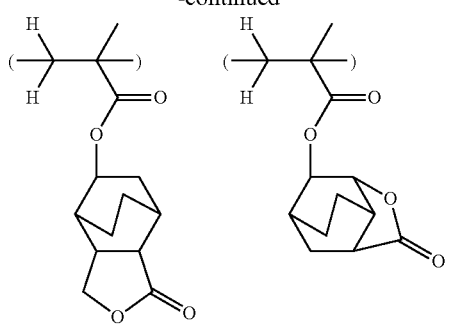
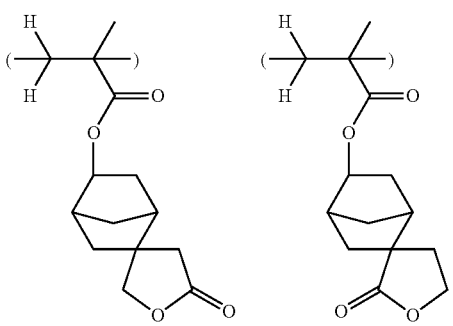
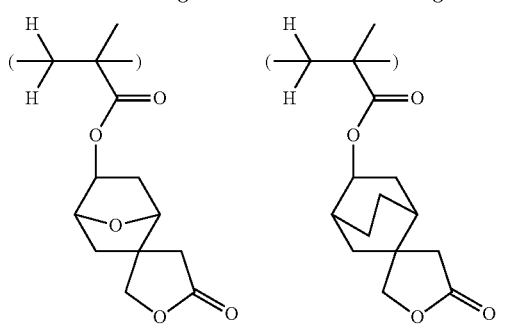
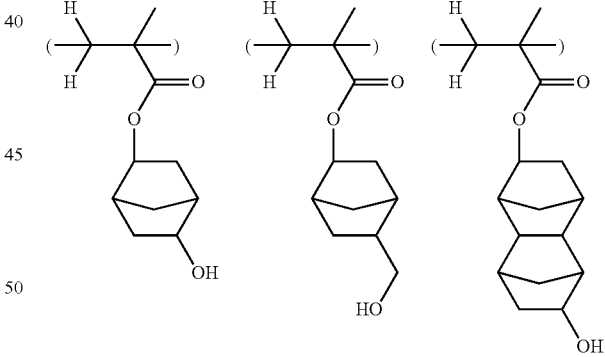
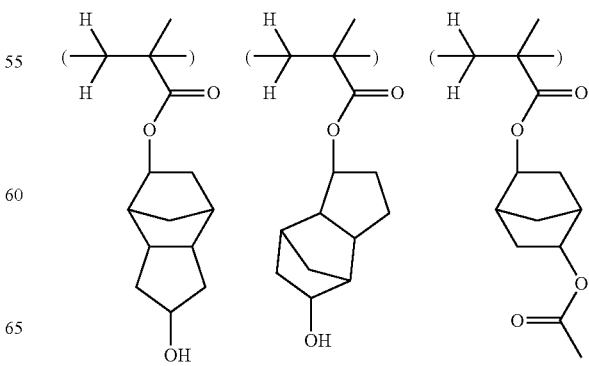

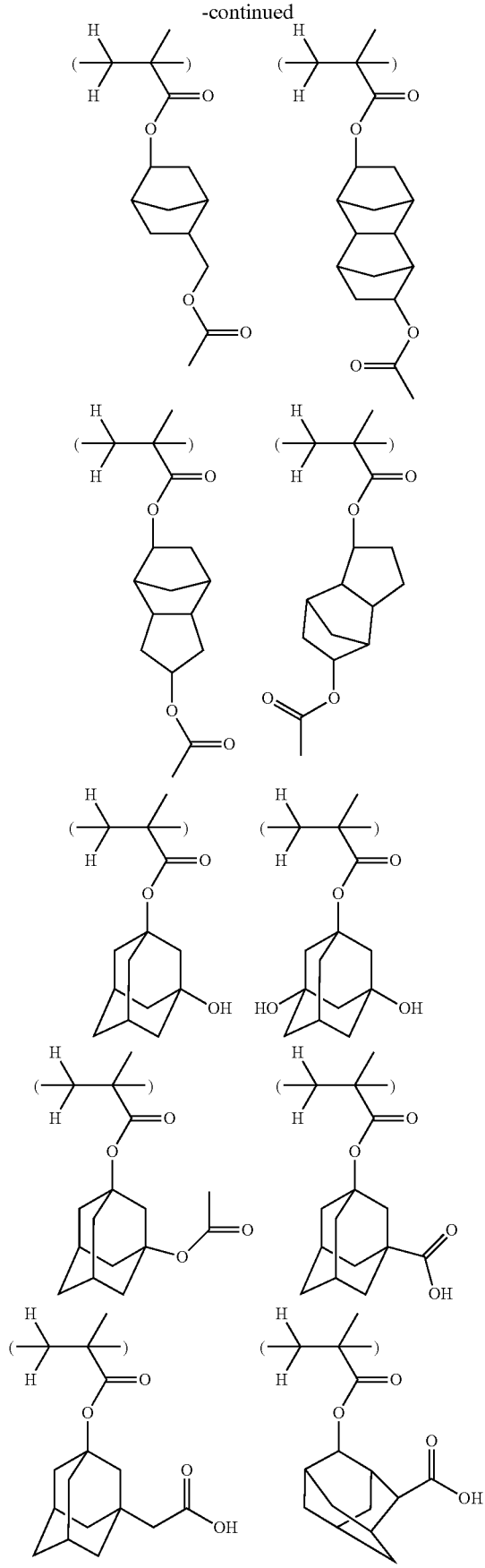
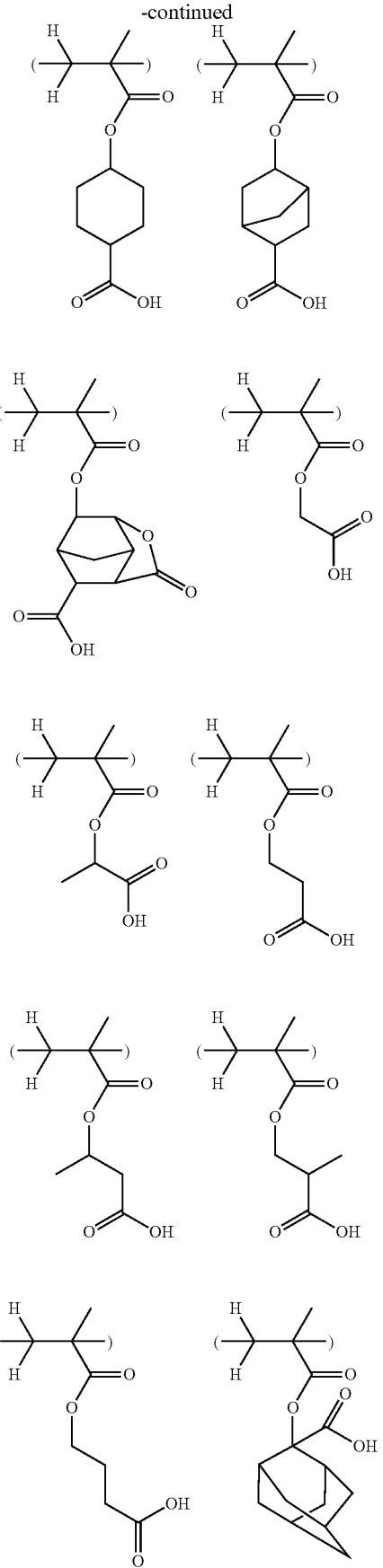

31
-continued
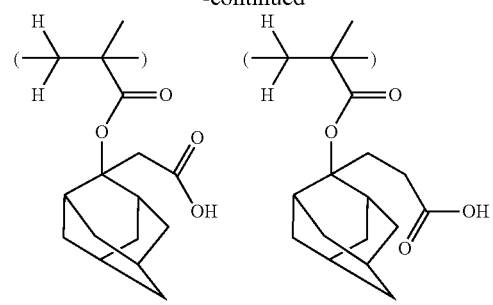
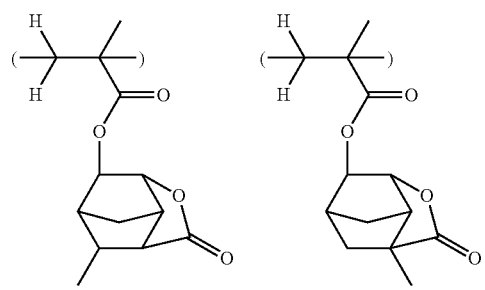
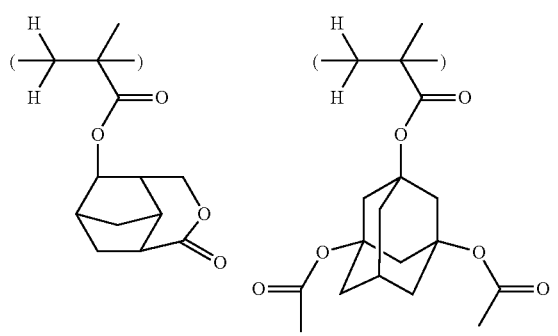
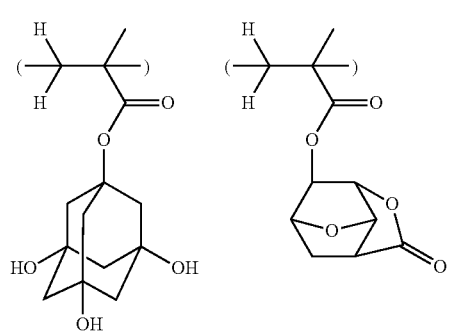
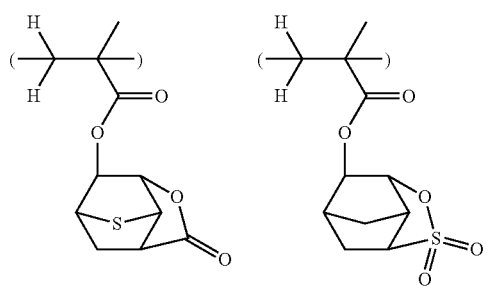
32
-continued
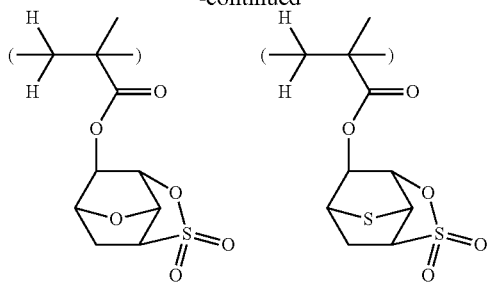
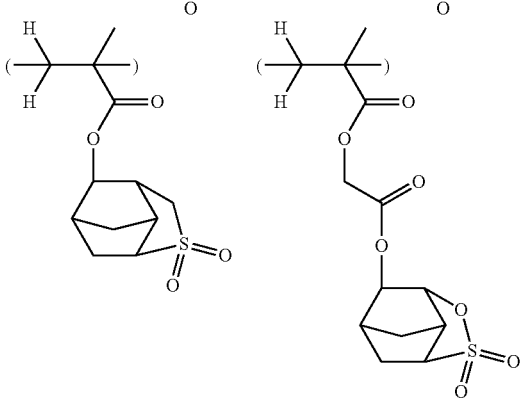
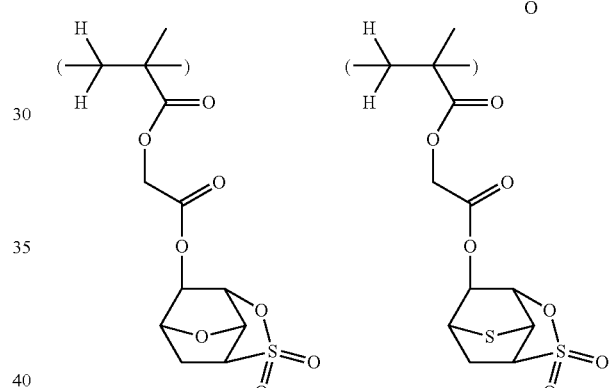
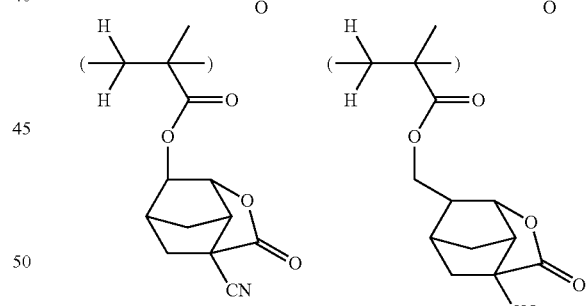
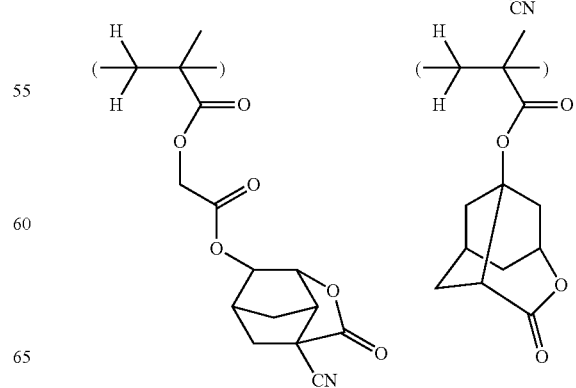

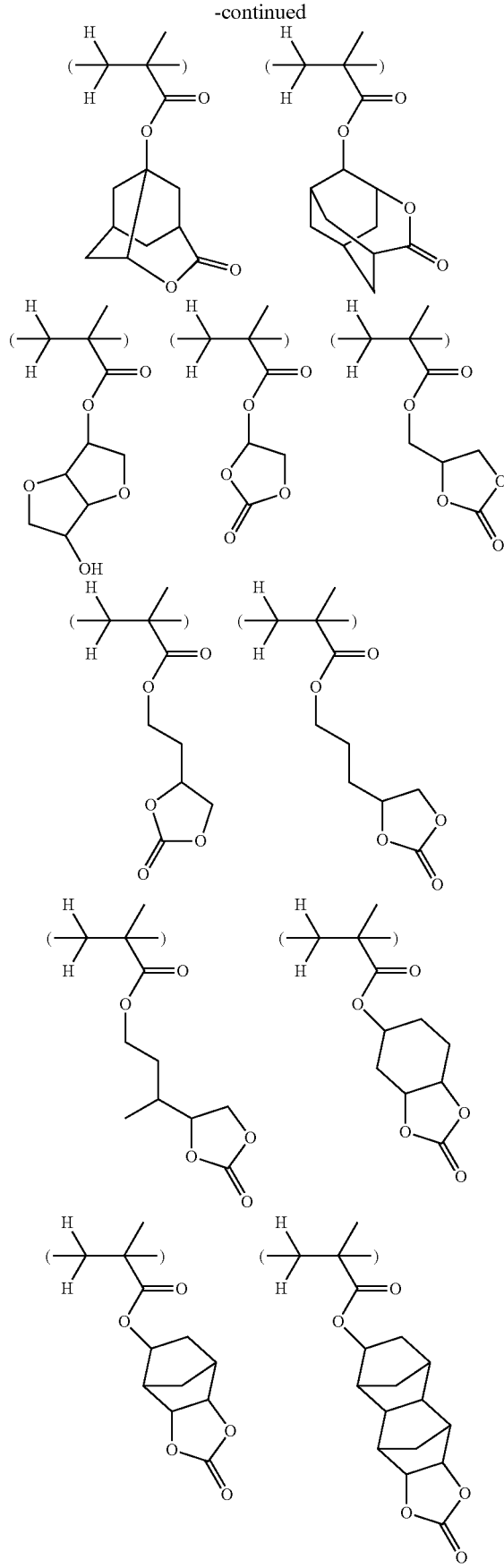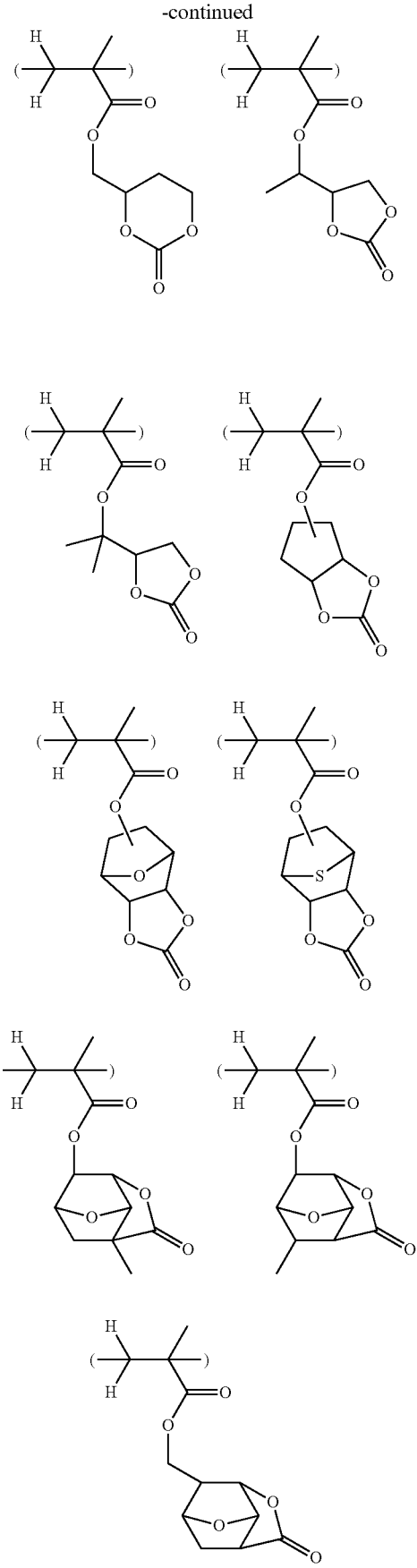

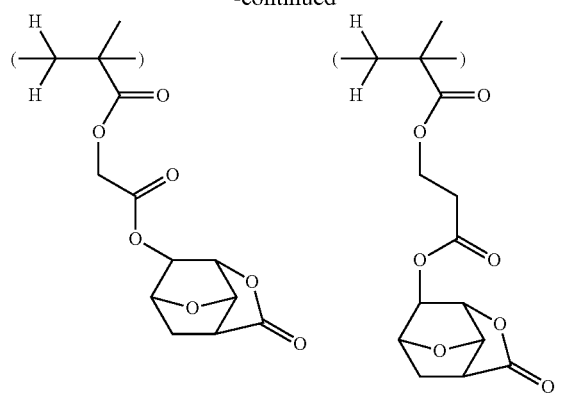
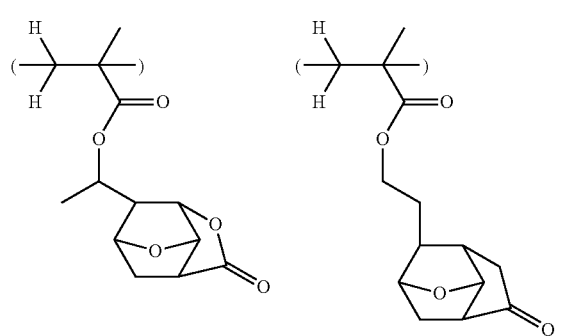
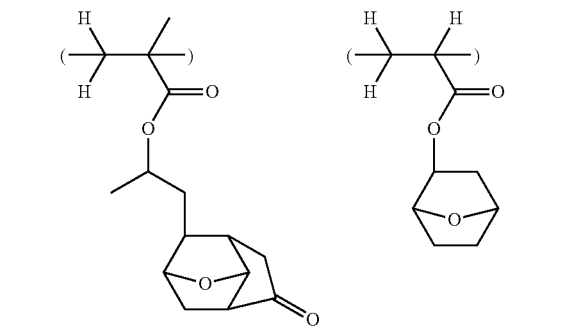
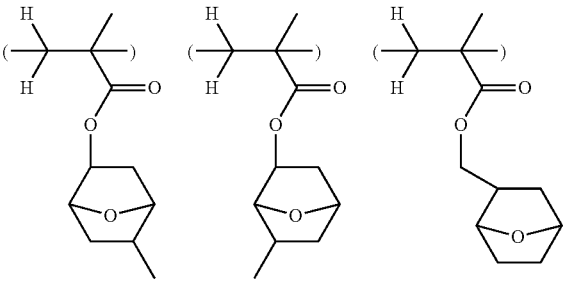
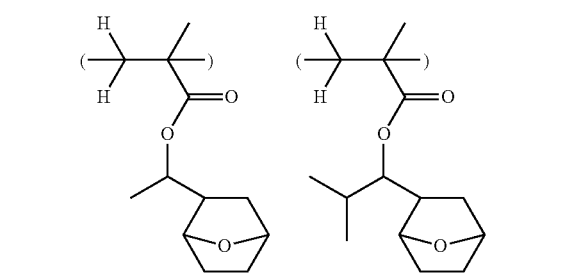
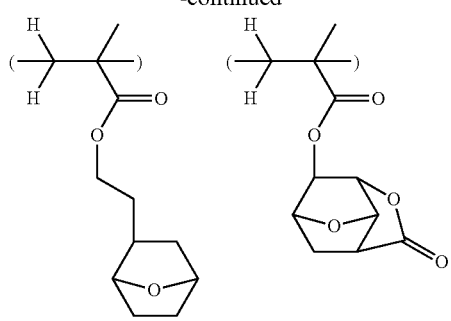
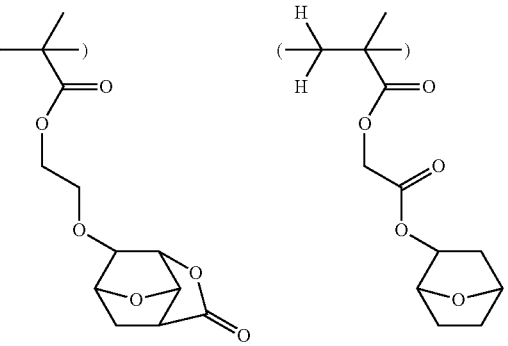
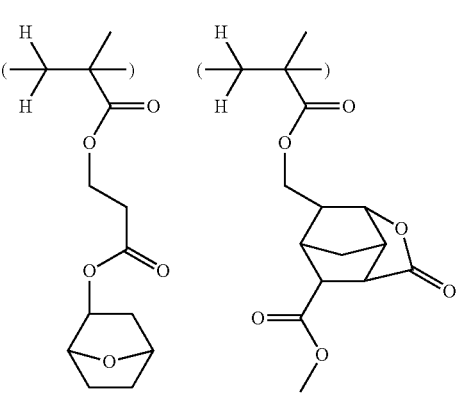
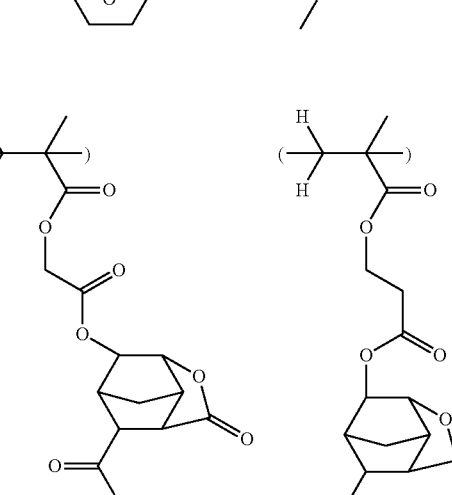

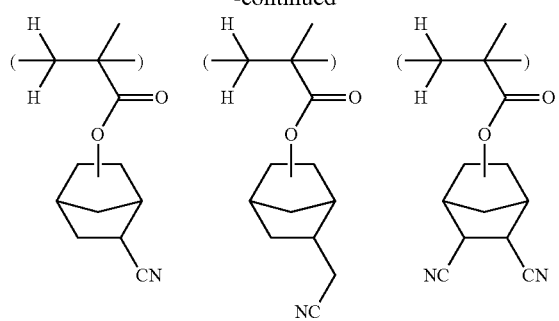
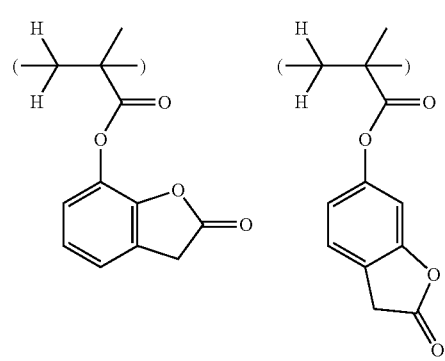
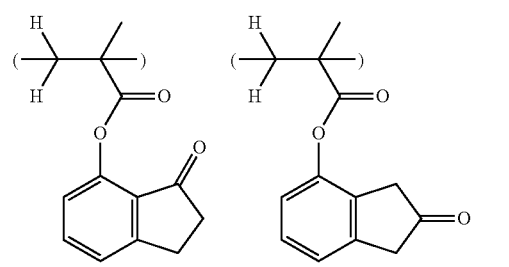
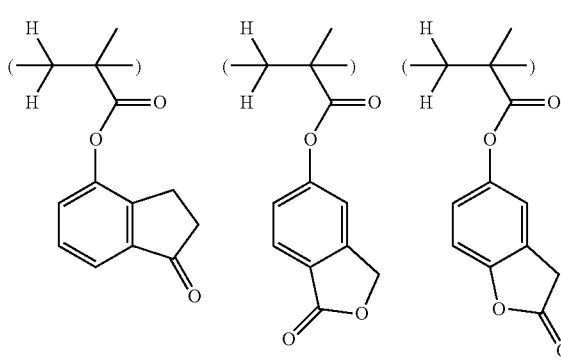
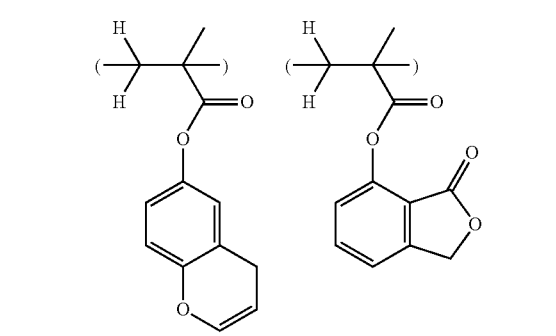
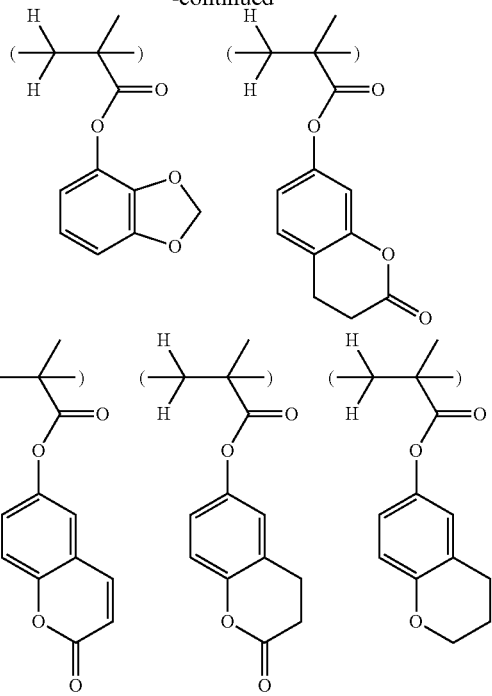
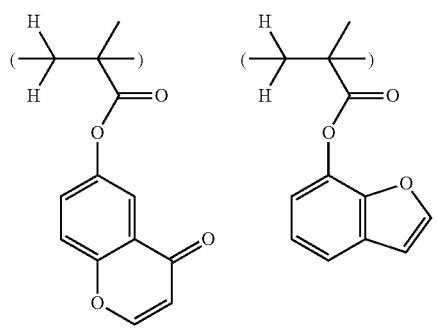
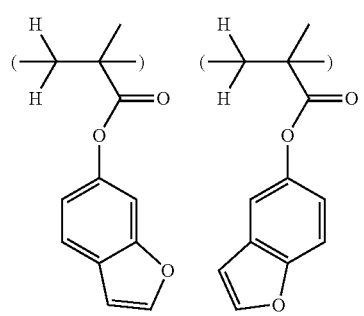
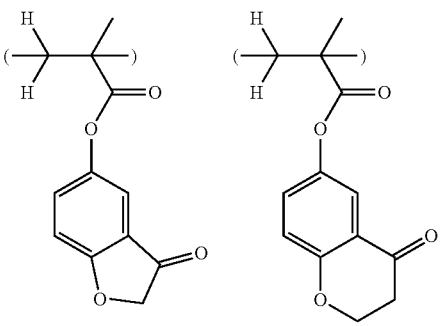

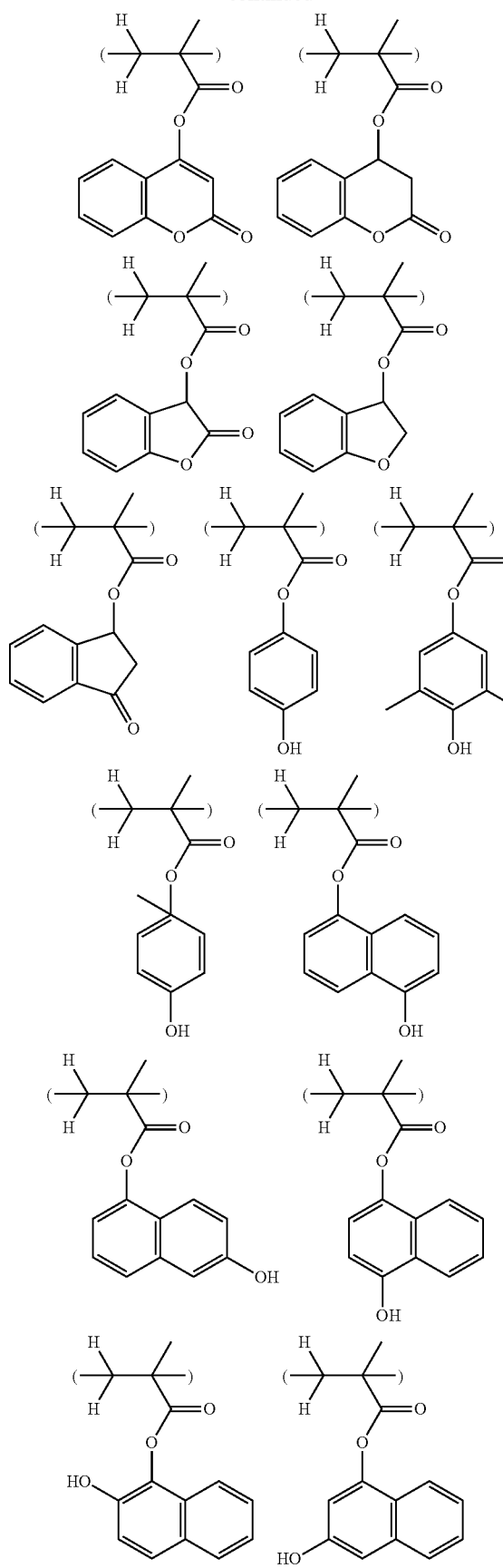
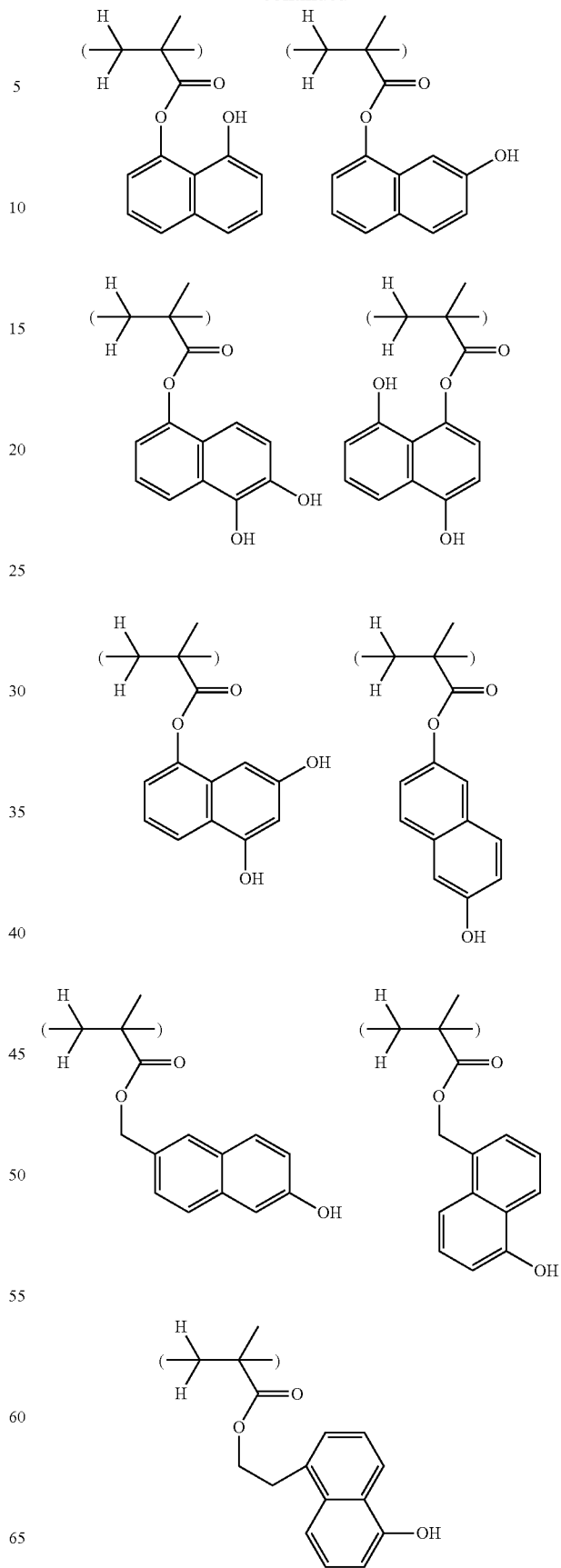

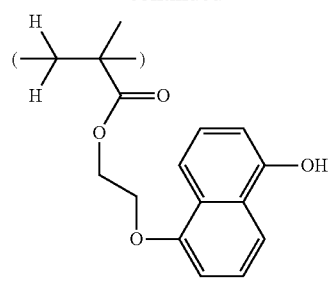
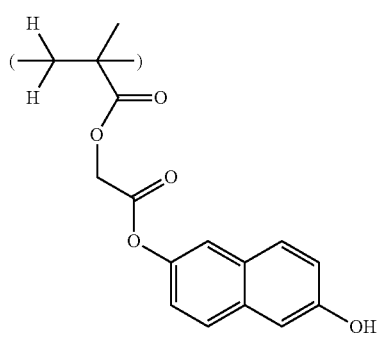
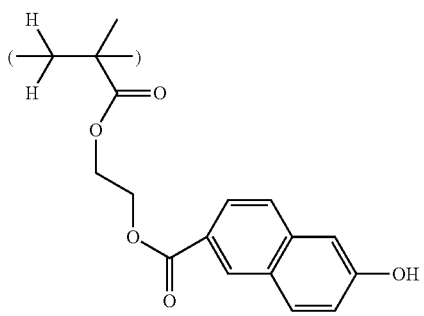
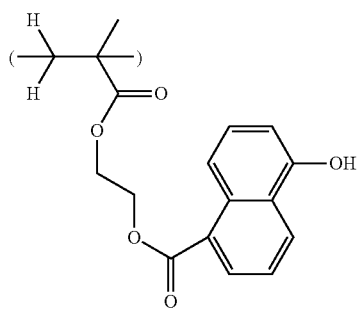
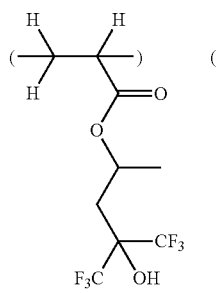
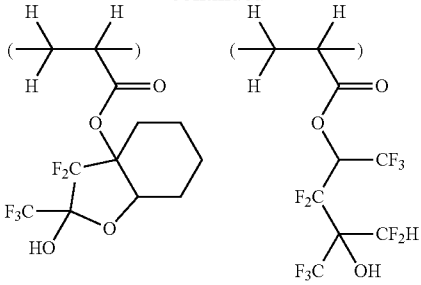
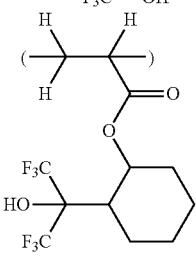
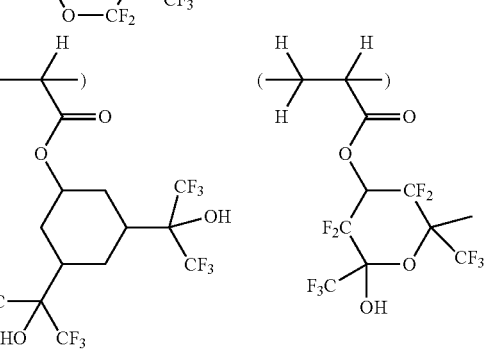
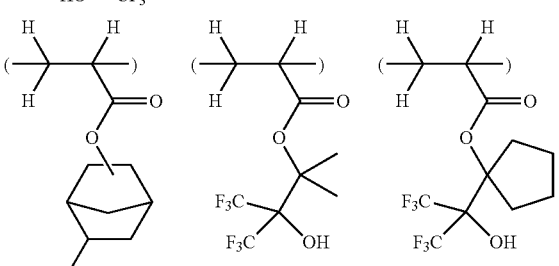
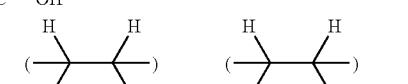
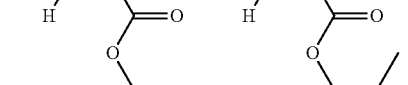
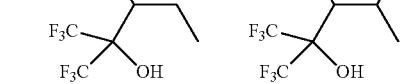
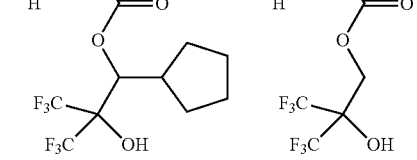

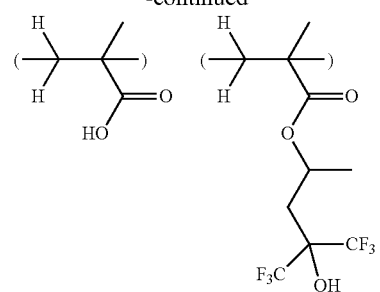
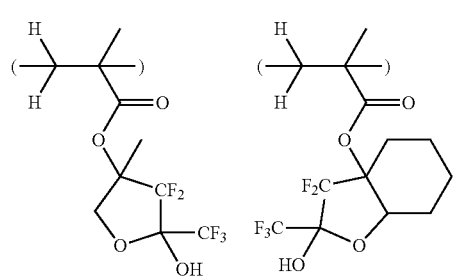
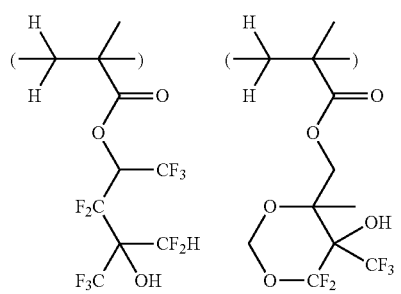
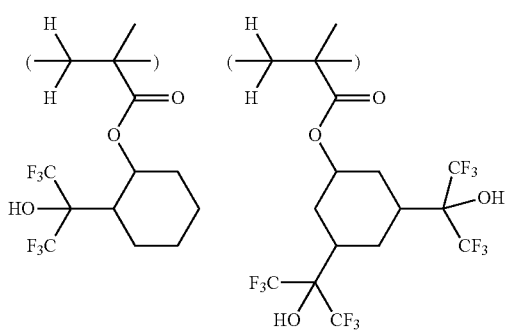
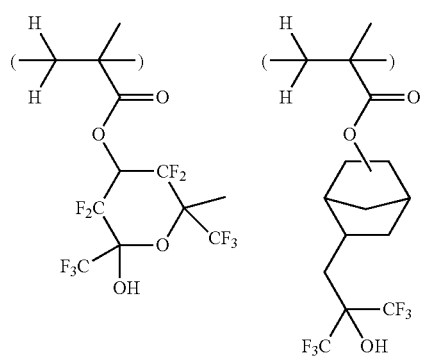
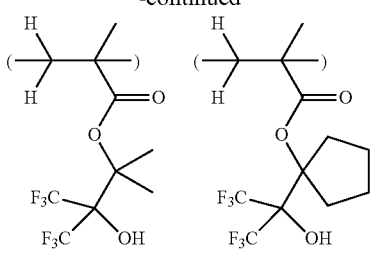
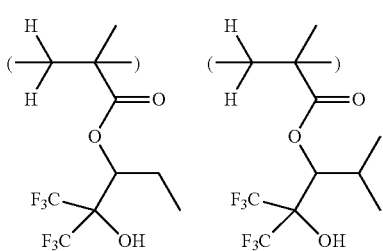
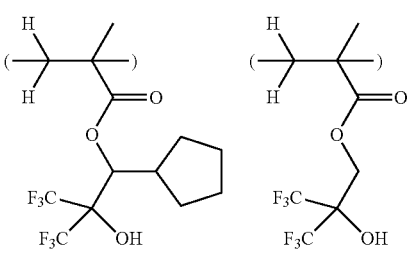
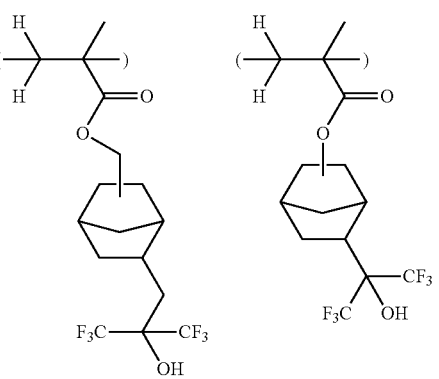
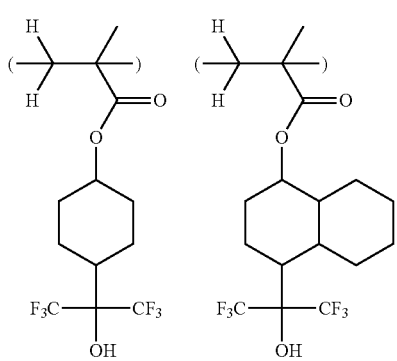

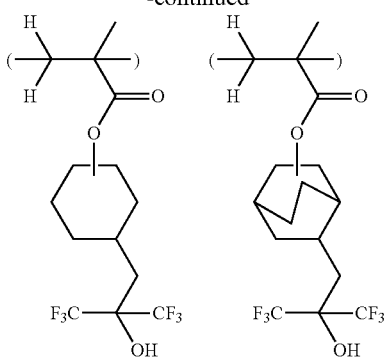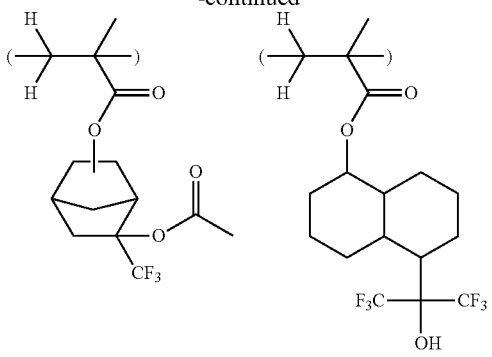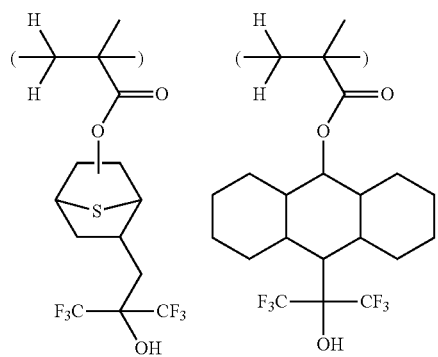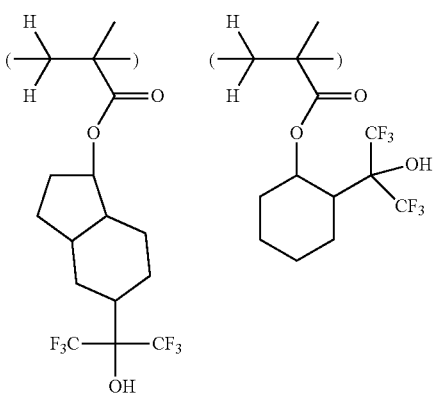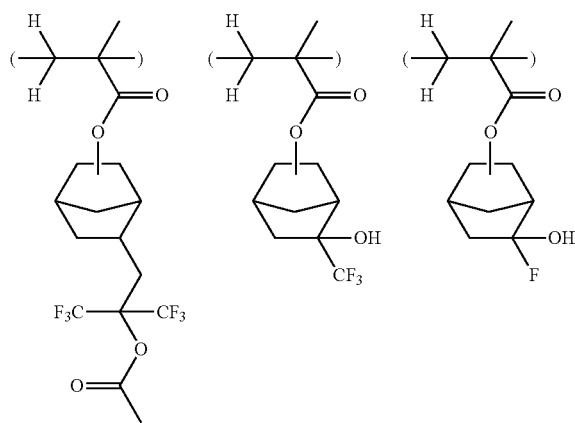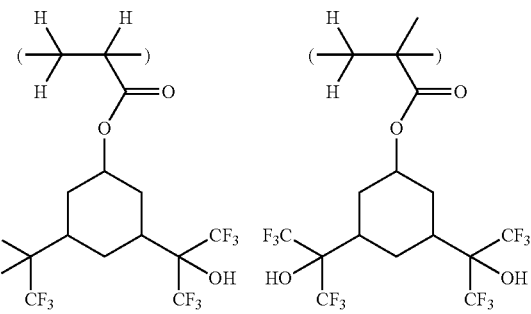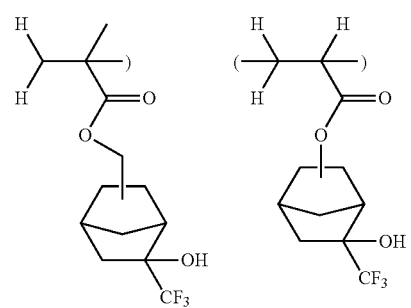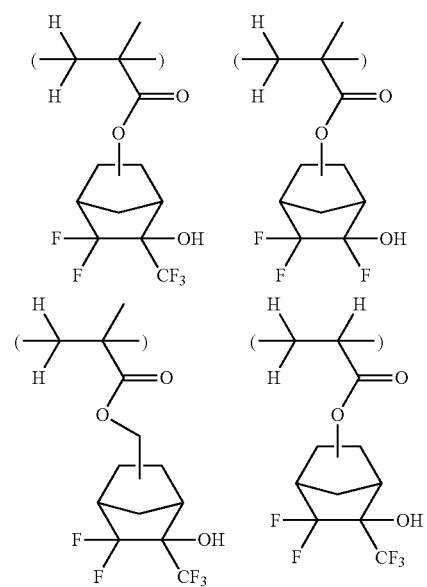

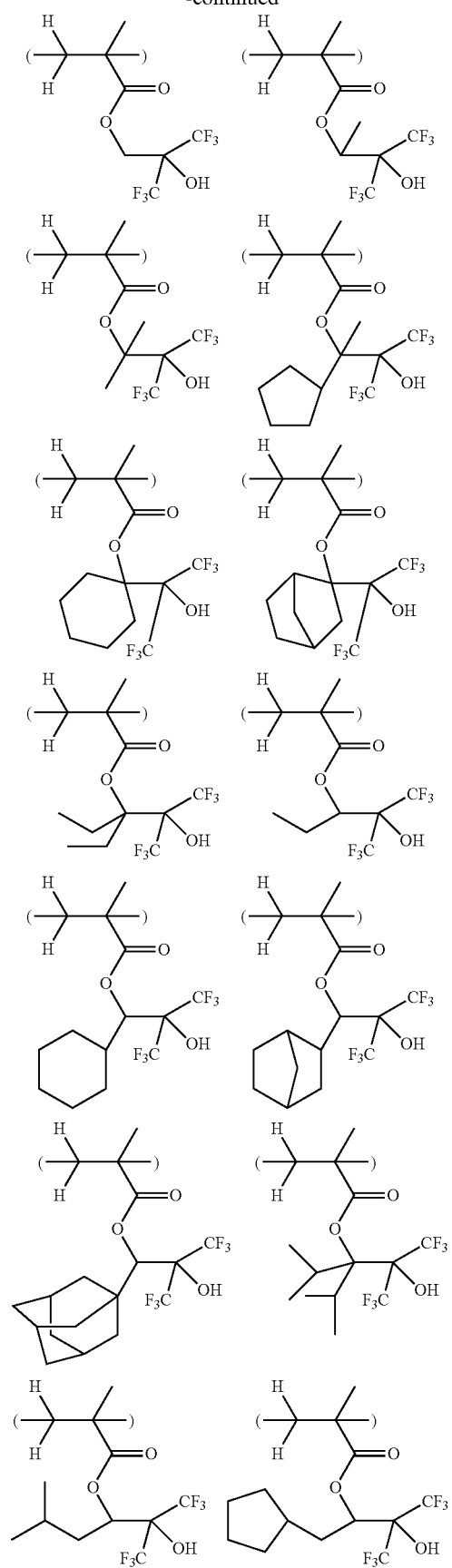
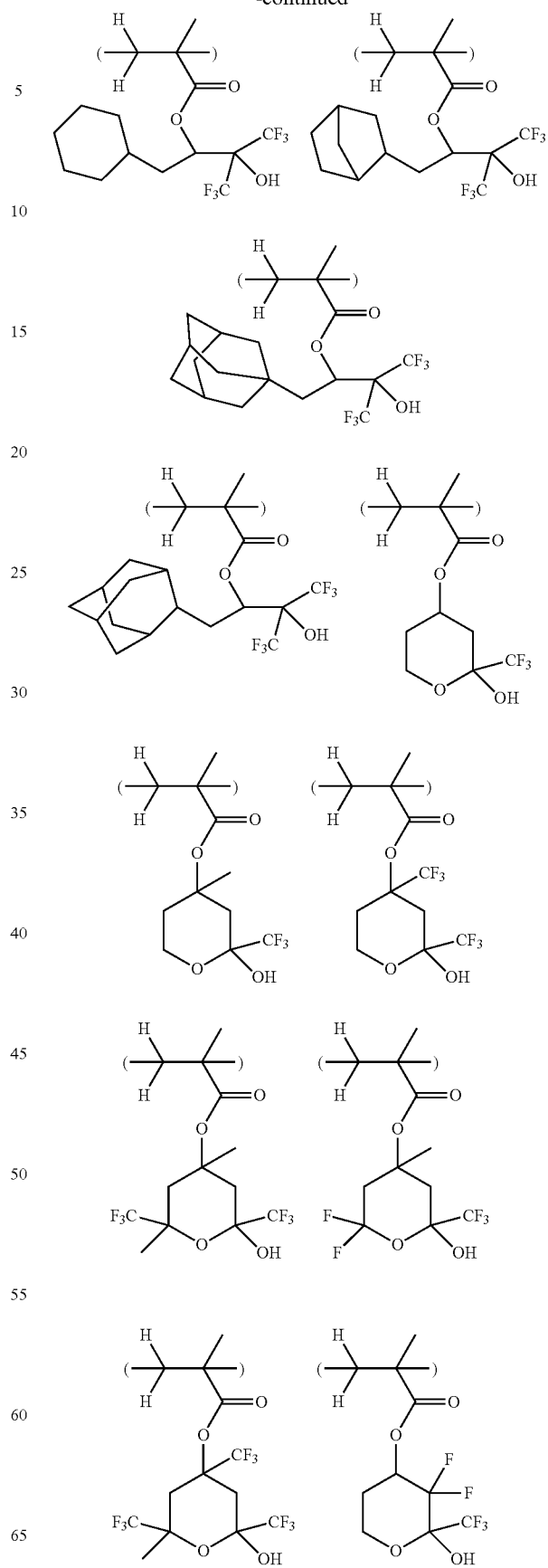

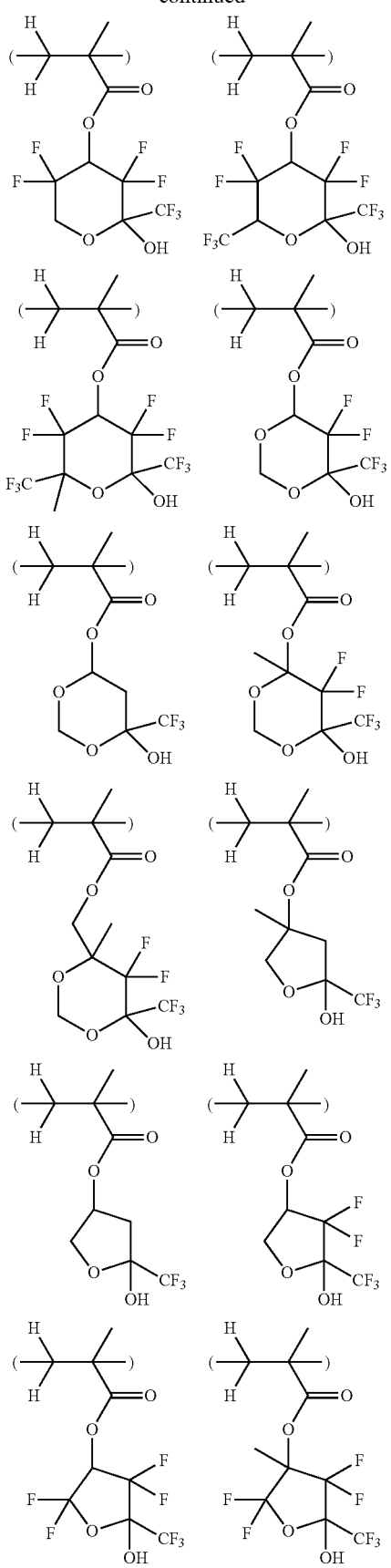
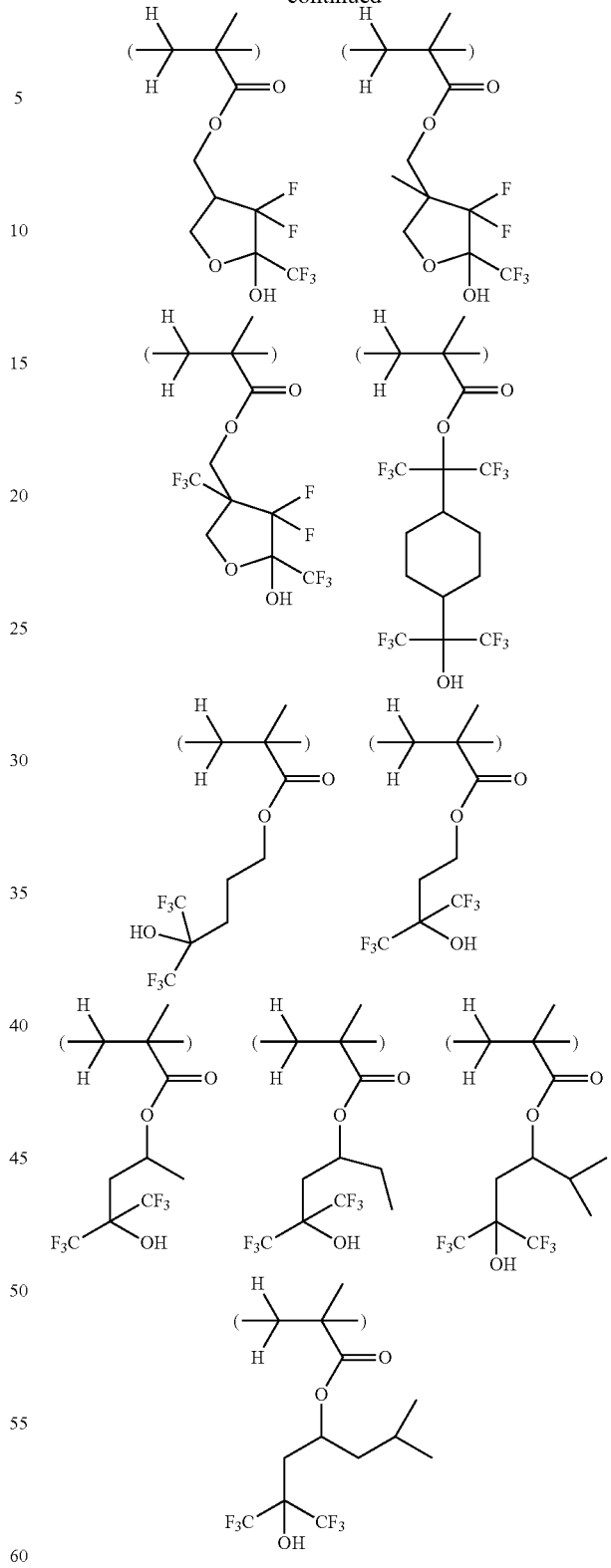
Where the recurring units of formula (2) are incorporated, units having lactone ring as the polar group are most preferably used.

While the polymer comprises essentially recurring units having an acid labile group represented by formula (1), optionally recurring units having the general formula (3) may also be incorporated.

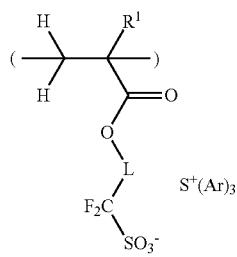

(3)

Herein $R^1$ is hydrogen, fluorine, methyl or trifluoromethyl. L is a single bond, or a divalent hydrocarbon group which may have an ether bond or ester bond. Ar is a substituted or unsubstituted $C_6$-$C_{20}$ aryl group which may contain a heteroatom, a plurality of Ar groups may bond together directly or via an oxygen atom, methylene, sulfonyl or carbonyl moiety.

In formula (3), Ar is a substituted or unsubstituted $C_6$-$C_{20}$ aryl group which may contain a heteroatom, or a plurality of Ar groups may bond directly or via an oxygen atom, methylene, sulfone or carbonyl moiety. Typical of the heteroatom contained are oxygen, nitrogen, sulfur and halogen atoms, with the oxygen and fluorine atoms being preferred. Suitable substituent radicals include straight, branched or cyclic $C_1$-$C_6$ alkyl radicals, straight, branched or cyclic $C_1$-$C_6$ alkoxy radicals, alkoxyalkyl radicals, alkoxyalkoxy radicals, hydroxyl radicals, fluoro, chloro, N,N-dialkylamino radicals in which the alkyl moiety has 1 to 4 carbon atoms, mono- or polycyclic lactone radicals of 4 to 10 carbon atoms, straight, branched or cyclic $C_1$-$C_{14}$ alkyloxycarbonylmethoxy radicals, methylthio radicals, phenylthio radicals, and $C_1$-$C_{11}$ acyloxy radicals. Although the number of substituent radicals is arbitrary, mono or di-substitution is preferred, if any, with mono-substitution being most preferred. Exemplary substituent radicals include methyl, ethyl, propyl, 1-methylethyl, butyl, 1,1-dimethylethyl, hexyl, cyclohexyl, methoxy, ethoxy, propoxy, butoxy, 1,1-dimethylethoxy, hexyloxy, cyclohexyloxy, 2-methoxyethoxy, 2-(2-methoxyethoxy)ethoxy, 2,2,2-trifluoroethoxy, N,N-dimethylamino, 1,1-dimethylethoxycarbonylmethoxy, 1-methyladamantan-1-yloxycarbonylmethoxy, acetyl, pivaloyloxy, and adamantan-1-ylcarbonyloxy.

Suitable groups of Ar include, but are not limited to, phenyl, naphthyl (with any substitution position to the sulfur atom of sulfonium cation), anthryl, phenanthryl, pyrenyl, tolyl, xylyl, trimethylphenyl (with any substitution position to the sulfur atom of sulfonium cation), ethylphenyl, biphenylyl, methoxyphenyl, fluorophenyl, difluorophenyl, tert-butylphenyl, ethoxyphenyl, butoxyphenyl, tert-butoxyphenyl, methylthiophenyl, trifluoromethylphenyl, acetoxyphenyl, hydroxyphenyl, N,N-dimethylaminophenyl, methylnaphthyl, hydroxynaphthyl, dihydroxynaphthyl, methoxynaphthyl, butoxynaphthyl, 2,2,2-trifluoroethoxynaphthyl, and (2-methoxyethoxy)naphthyl.

When a plurality of Ar groups bond directly or via an oxygen atom, methylene, sulfone or carbonyl moiety, dibenzothiophene skeleton, phenoxathiin skeleton, and other partial structures as shown below are exemplary.

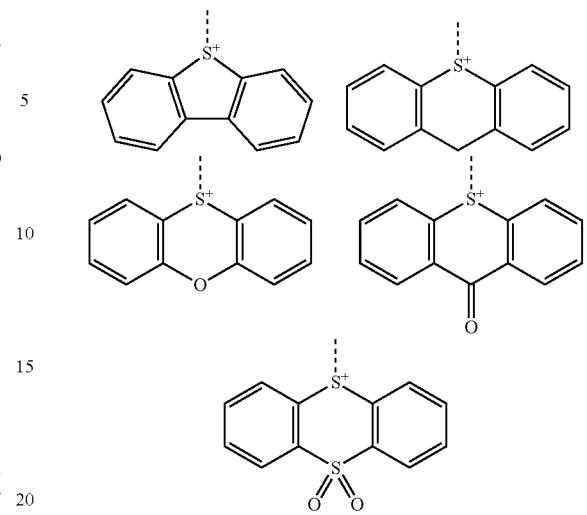

Herein the broken line denotes a bond to another Ar group.

Examples of the sulfonium cation include, but are not limited to, triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 4-tert-butylphenyldiphenylsulfonium, tris(4-tert-butylphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 10-phenylphenoxathiinium, S-phenyldibenzothiophenium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, and (4-n-hexyloxy-3,5-dimethylphenyl)diphenylsulfonium.

Of these, triphenylsulfonium, 4-tert-butylphenyldiphenylsulfonium, 4-tert-butoxyphenyldiphenylsulfonium, 10-phenylphenoxathiinium, and S-phenyldibenzothiophenium are more preferred. Inter alia, triphenylsulfonium, 4-tert-butylphenyldiphenylsulfonium, and 4-tert-butoxyphenyldiphenylsulfonium are most preferred.

The sulfonium cation may be a so-called alkylsulfonium cation that is a cation having an alkyl group directly bonded thereto. However, an alkylsulfonium cation which is highly active to high-energy radiation and a nucleophilic agent (such as 4-butoxynaphthyl-1-thiacyclopentanium cation) often has low stability. When an attempt is made to incorporate the alkylsulfonium cation into a polymer chain, it may be decomposed during polymerization, failing to form the desired polymer. Thus, a so-called triarylsulfonium cation as represented by formula (3) is desirable in order to ensure stability.

The synthesis of the sulfonium cation is well known. Synthesis may be carried out according to the teachings of JP-A 2007-145797, JP-A 2009-007327, and JP-A 2009-091350, for example.

Preferably the recurring unit of formula (3) is represented by the general formula (5).

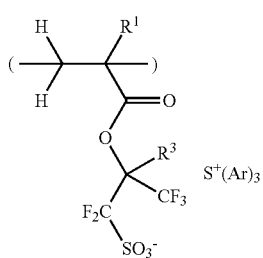
Herein $R^1$ and Ar are as defined above, and $R^3$ is hydrogen or trifluoromethyl.
Examples of the anion having formula (3) or (5) are given below. The following formulae represent monomers prior to polymerization while the counterpart, triarylsulfonium cation is omitted.
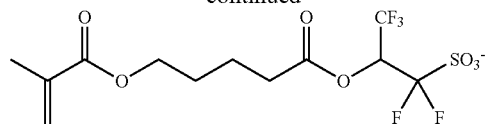
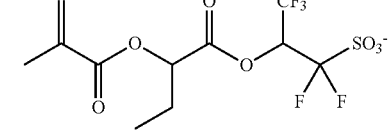
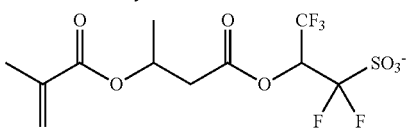
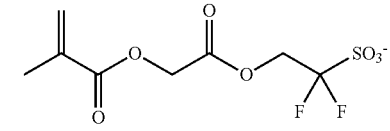
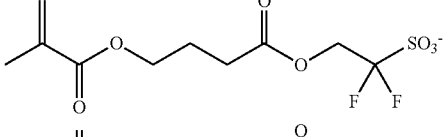
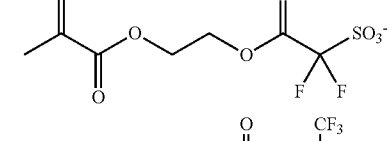
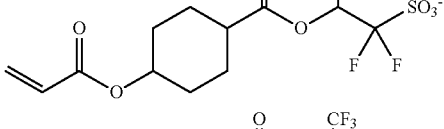
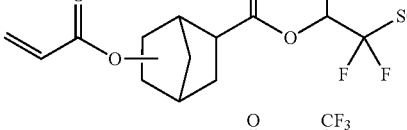
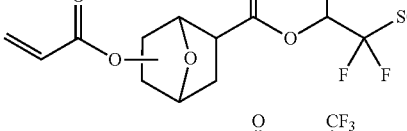
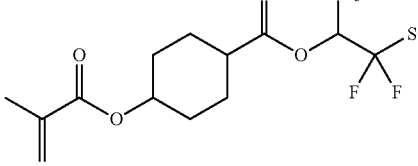
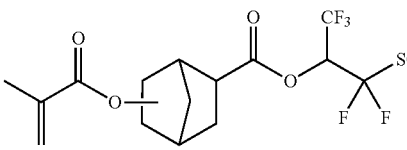
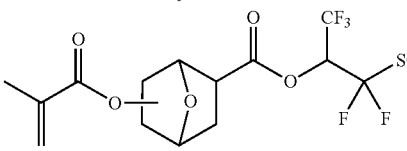

-continued
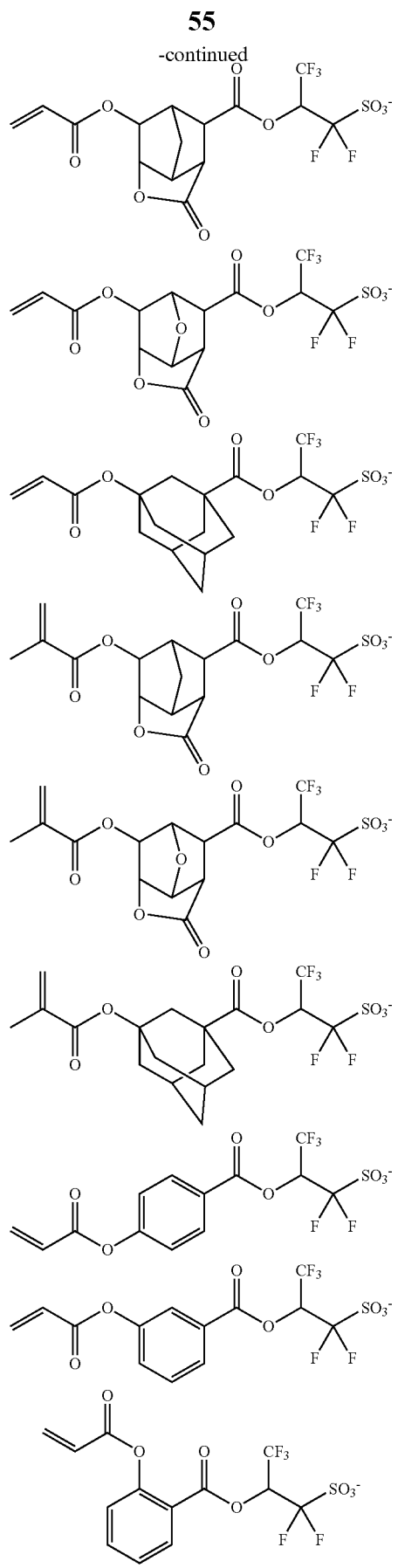
-continued
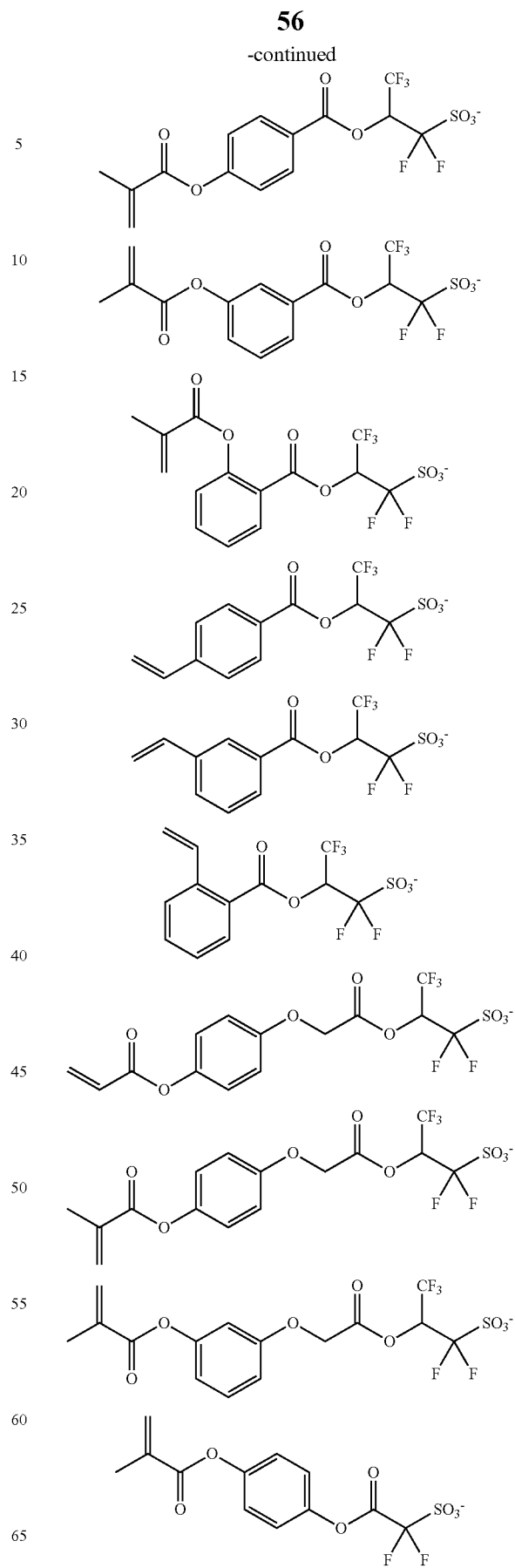

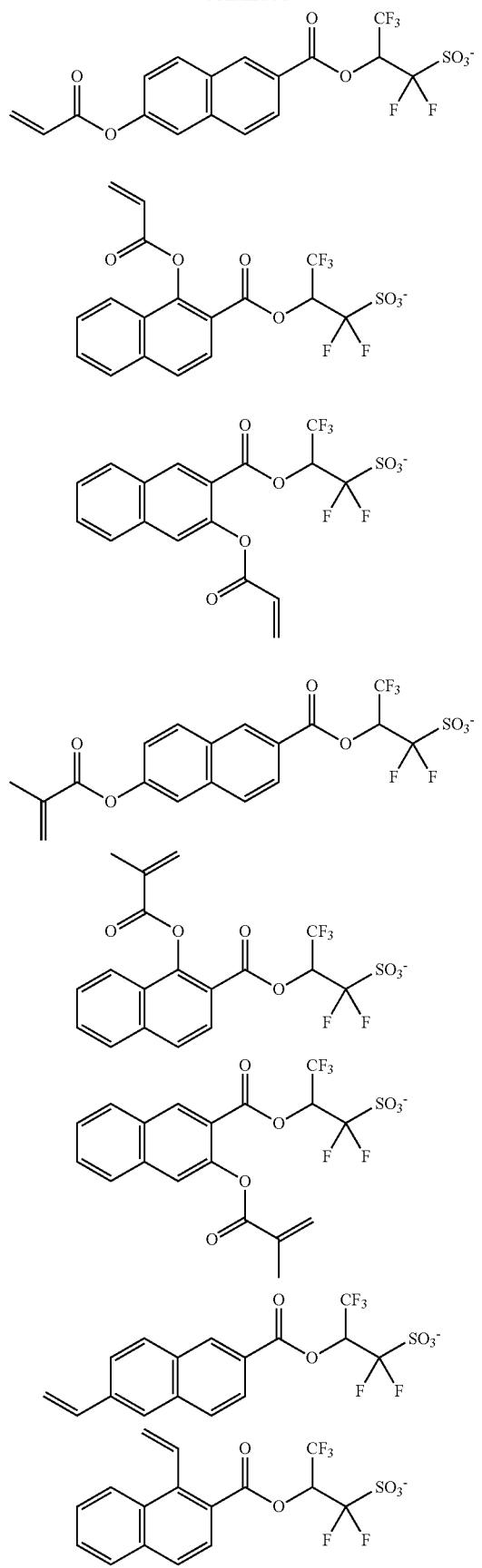
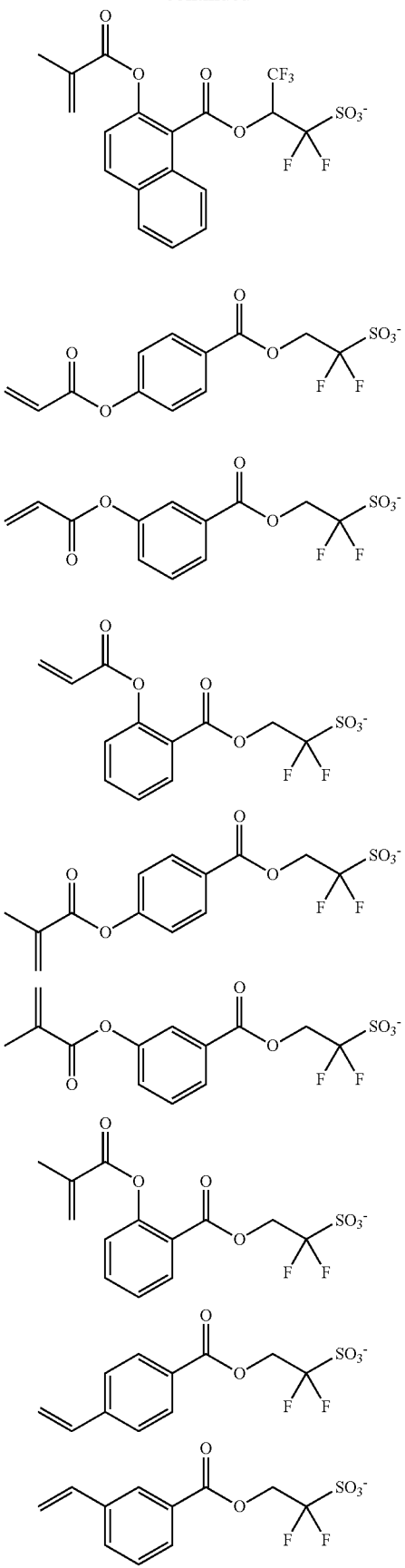

-continued

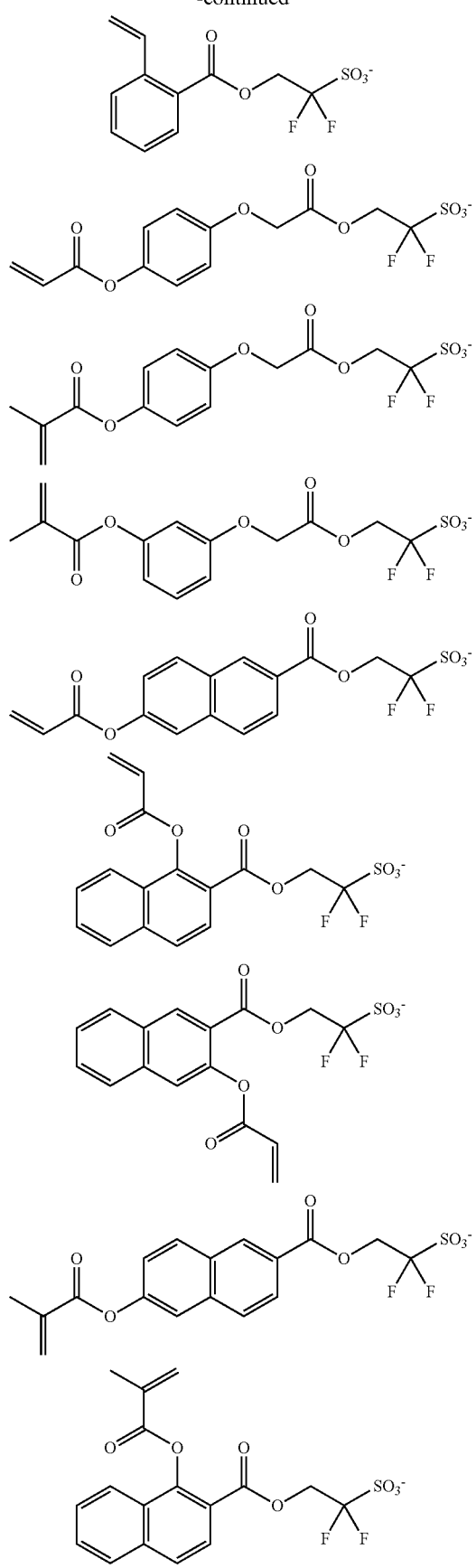

-continued

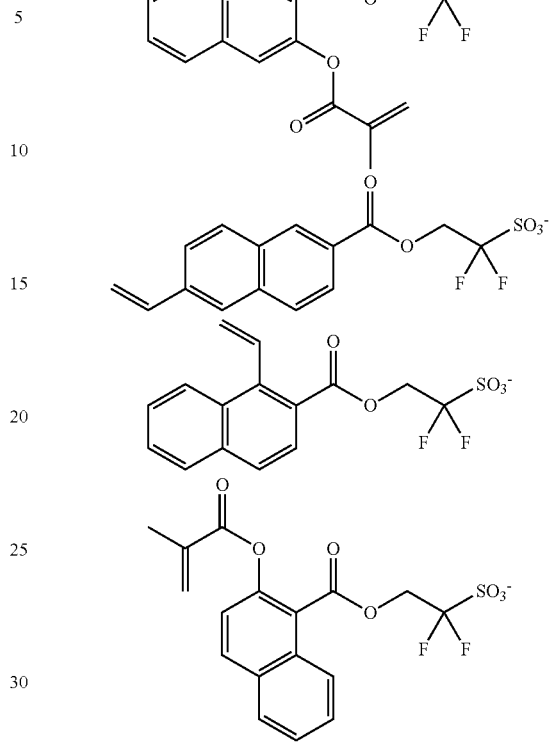

The recurring units of formula (3) may be used as a homopolymer or copolymerized with other recurring units. The unit may also be used in monomeric form. Preferably, the recurring units of formula (3) are copolymerized with the acid labile group-containing units of formula (1) prior to use.

With respect to the synthesis of the sulfonium salt having formula (3), reference should be made to JP-A 2008-133448, JP-A 2009-217253, JP-A 2010-077404, and JP-A 2010-116550.

The polymer used herein may further comprise recurring units derived from monomers having a carbon-carbon double bond other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[$6.2.1.1^{3.6}.0^{2.7}$] dodecene derivatives, unsaturated acid anhydrides such as itaconic anhydride, and other monomers. As the hydrogenated ROMP polymer, those described in JP-A 2003-66612 may be used.

The polymer used herein generally has a weight average molecular weight (Mw) of 1,000 to 500,000, and preferably 3,000 to 100,000, as measured by GPC using polystyrene standards. Outside the range, there may result an extreme drop of etch resistance, and a drop of resolution due to difficulty to gain a dissolution rate difference before and after exposure.

The polymer may be synthesized by any desired method, for example, by dissolving an unsaturated bond-containing monomer or monomers in an organic solvent, adding a radical initiator, and effecting heat polymerization. Suitable organic solvents used herein include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the polymer may be protected or partially protected therewith at the end of polymerization.

In the polymer (A), appropriate molar fractions (mol %) of the respective recurring units derived from the monomers are given below although the invention is not limited thereto. The polymer may comprise:

I) constituent units of at least one type having formula (1) in a fraction of 1 to 50 mol %, preferably 5 to 40 mol %, and more preferably 10 to 30 mol %, II) constituent units of at least one type having formula (2) in a fraction of 50 to 99 mol %, preferably 60 to 95 mol %, and more preferably 70 to 90 mol %, and optionally, III) constituent units of at least one type derived from another monomer in a fraction of 0 to 80 mol %, preferably 0 to 70 mol %, and more preferably 0 to 50 mol %.

In the embodiment wherein recurring units having formula (3) are incorporated, the polymer may preferably comprise: 1 to 50 mol %, more preferably 5 to 40 mol %, and even more preferably 10 to 30 mol % of recurring units of at least one type having formula (1),
48.2 to 98.8 mol %, more preferably 59.5 to 94.5 mol %, and even more preferably 69.5 to 89.5 mol % of recurring units of at least one type having formula (2), and
0.2 to 20 mol %, more preferably 0.5 to 15 mol % of recurring units having formula (3).

The polymers may be used alone or in admixture of two or more. The performance of a resist composition may be adjusted by using two or more polymers.

(B) Photoacid Generator

When a photoacid generator (PAG) is used, it may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxylmide, O-arylsulfonyloxime, and O-alkylsulfonyloxime compounds. The PAGs may be used alone or in admixture of two or more. It is understood that when a polymer comprising recurring units having formula (3) or (5) is used as component (A), the PAG (B) may be omitted or added in combination.

Sulfonium salts are salts of sulfonium cations with sulfonates, bis(substituted alkylsulfonyl)imides and tris(substituted alkylsulfonyl)methides. Exemplary sulfonium cations include those sulfonium cations described in conjunction with formula (3). Exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate,
2-benzoyloxy-1,1,3,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethane-sulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate. Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxylmide, O-arylsulfonyloxime, and O-alkylsulfonyloxime acid generators are described in JP-A 2009-269953.

Preferred examples of the PAG include triphenylsulfonium nonafluorobutanesulfonate, triphenylsulfonium bis(trifluoromethylsulfonyl)imide, triphenylsulfonium perfluoro(1,3-propylenebissulfonyl)imide, triphenylsulfonium tris(trifluoromethanesulfonyl)methide, N-nonafluorobutanesulfonyloxy-1,8-naphthalenedicarboxylmide, 2-(2,2,3,3,4,4-hexafluoro-1-(nonafluorobutylsulfonyloxy-imino)butyl)fluorene, and 2-(2,2,3,3,4,4,5,5-octafluoro-1-(nonafluorobutylsulfonyloxy-imino)pentyl)fluorene.

Preferred among the PAGs are compounds having the general formula (6):

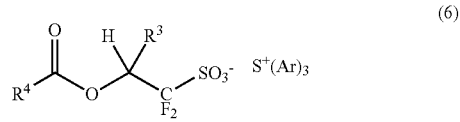

wherein $R^3$ and Ar are as defined above, and $R^4$ is a $C_1$-$C_{30}$ alkyl, alkenyl or aralkyl group which may contain a heteroatom.

In formula (6), $R^4$ is a $C_1$-$C_{30}$ alkyl, alkenyl or aralkyl group which may contain a heteroatom. Typical of the heteroatom contained are oxygen, nitrogen, sulfur and halogen atoms, with the oxygen atom being preferred. The $C_1$-$C_{30}$ alkyl, alkenyl or aralkyl group of $R^4$ may be straight, branched or cyclic, and a carbon count of 6 to 30 is preferred for gaining a high resolution in forming fine patterns. If $R^4$ is aryl, undesirably the resulting resist pattern may have less smooth sidewalls. Examples of the alkyl, alkenyl or aralkyl group represented by $R^4$ include, but are not limited to, methyl, ethyl, propyl, isopropyl, butyl, isobutyl, s-butyl, tert-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having formula (6), reference should be made to JP-A 2007-145797, JP-A 2008-106045, JP-A 2009-007327, and JP-A 2009-258695.

Illustrative examples of the preferred PAG are given below.

-continued
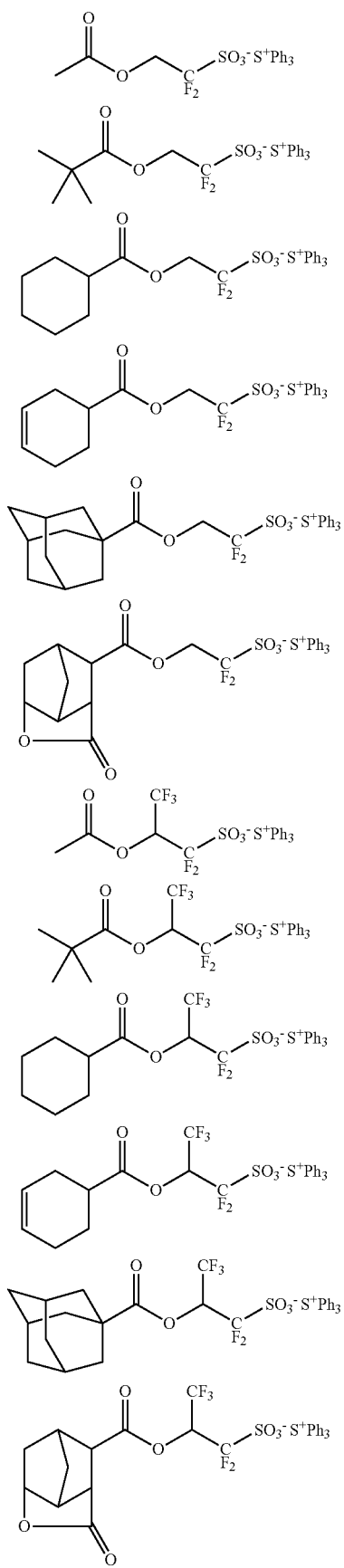
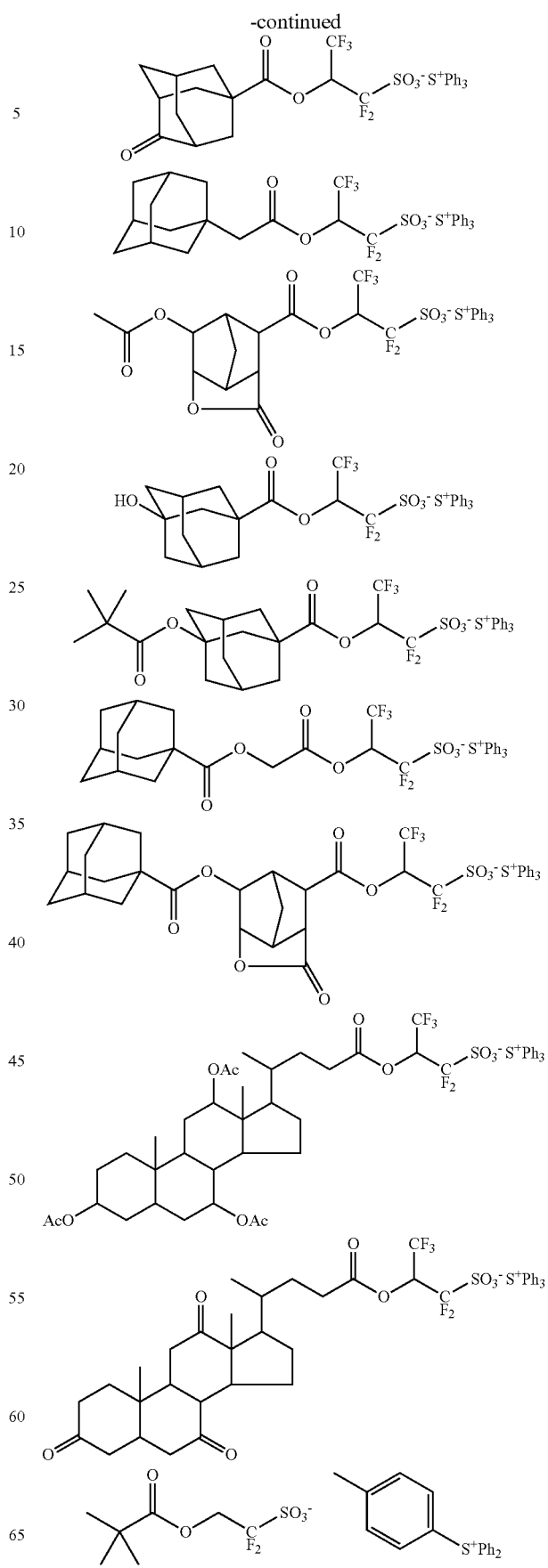

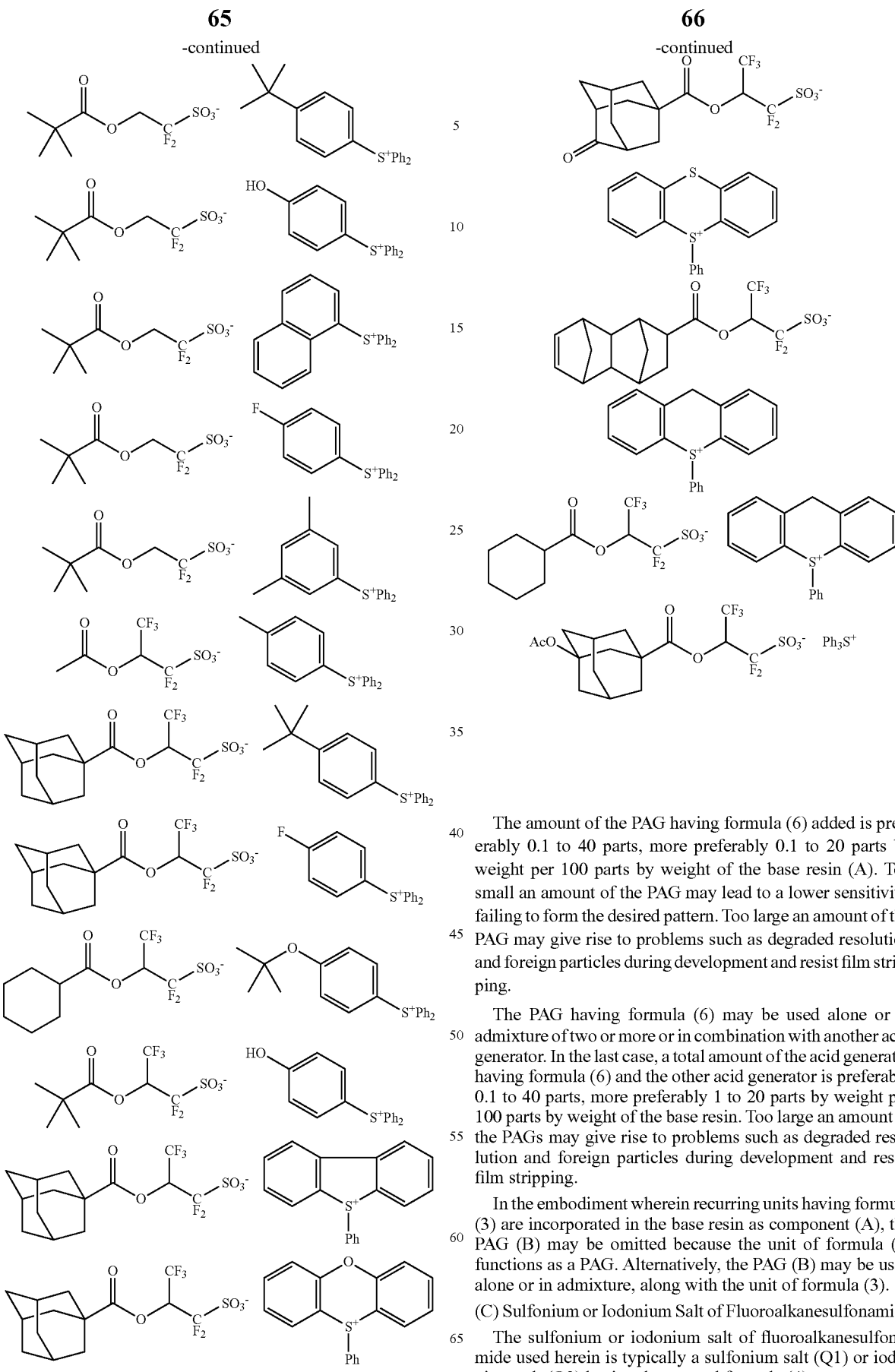

The amount of the PAG having formula (6) added is preferably 0.1 to 40 parts, more preferably 0.1 to 20 parts by weight per 100 parts by weight of the base resin (A). Too small an amount of the PAG may lead to a lower sensitivity, failing to form the desired pattern. Too large an amount of the PAG may give rise to problems such as degraded resolution and foreign particles during development and resist film stripping.

The PAG having formula (6) may be used alone or in admixture of two or more or in combination with another acid generator. In the last case, a total amount of the acid generator having formula (6) and the other acid generator is preferably 0.1 to 40 parts, more preferably 1 to 20 parts by weight per 100 parts by weight of the base resin. Too large an amount of the PAGs may give rise to problems such as degraded resolution and foreign particles during development and resist film stripping.

In the embodiment wherein recurring units having formula (3) are incorporated in the base resin as component (A), the PAG (B) may be omitted because the unit of formula (3) functions as a PAG. Alternatively, the PAG (B) may be used alone or in admixture, along with the unit of formula (3).

(C) Sulfonium or Iodonium Salt of Fluoroalkanesulfonamide

The sulfonium or iodonium salt of fluoroalkanesulfonamide used herein is typically a sulfonium salt (Q1) or iodonium salt (Q2) having the general formula (4).

(4)

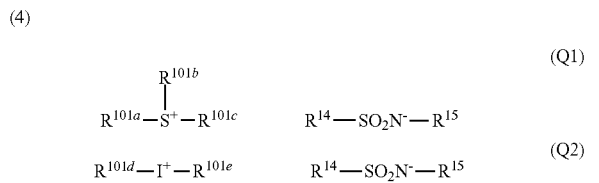

Herein $R^{101a}$, $R^{101b}$ and $R^{101c}$ are each independently a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by an oxygen atom, oxycarbonyl, carbonyl, carbonate, hydroxyl, carboxyl, halogen atom, cyano, amino, amide, nitro, sulfonyloxy, sulfonyl, or sulfonium salt-containing substituent group, or $R^{101b}$ and $R^{101c}$ may bond together to form a ring with the sulfur atom to which they are attached, $R^{101b}$ and $R^{101c}$ stand for a mono- or polycyclic hydrocarbon group having 4 to 16 carbon atoms in total and optionally containing an oxygen or sulfur atom when they form a ring. $R^{101d}$ and $R^{101e}$ are each independently a $C_6$-$C_{20}$ aryl group which may have a straight, branched or cyclic $C_1$-$C_6$ alkyl or alkoxy radical, or $R^{101d}$ and $R^{101e}$ may bond together to form a ring with the iodine atom to which they are attached, $R^{101d}$ and $R^{101e}$ stand for a mono- or polycyclic hydrocarbon group having 4 to 16 carbon atoms in total when they form a ring. $R^{14}$ is a straight, branched or cyclic $C_1$-$C_{10}$ alkyl group or alkenyl group, which has at least one fluorine atom. $R^{15}$ is hydrogen, or a straight, branched or cyclic $C_1$-$C_{20}$ alkyl group, straight, branched or cyclic $C_2$-$C_{12}$ alkenyl group or $C_6$-$C_{10}$ aryl group, which may have an ether bond, ester bond, carbonyl, amide, hydroxyl or carboxyl radical.

Examples of the anion moiety in formula (4), fluoroalkanesulfonamide ion $R^{14}$—$SO_2N^-$—$R^{15}$, are illustrated below.

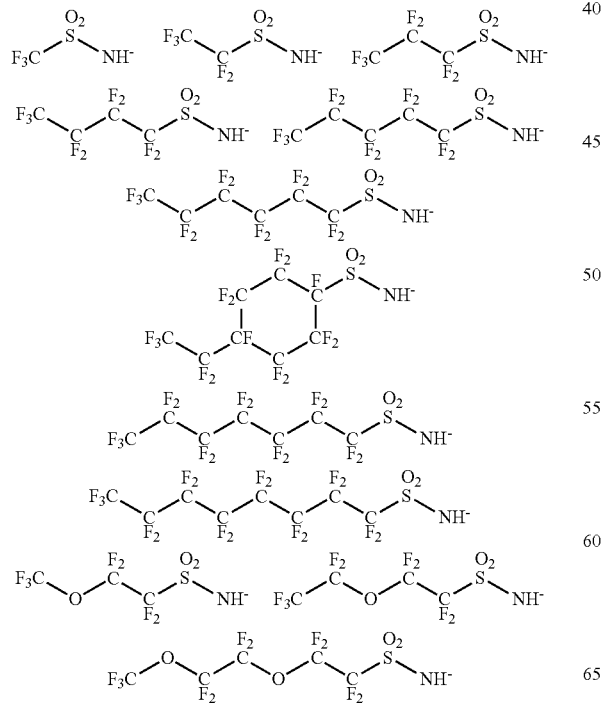

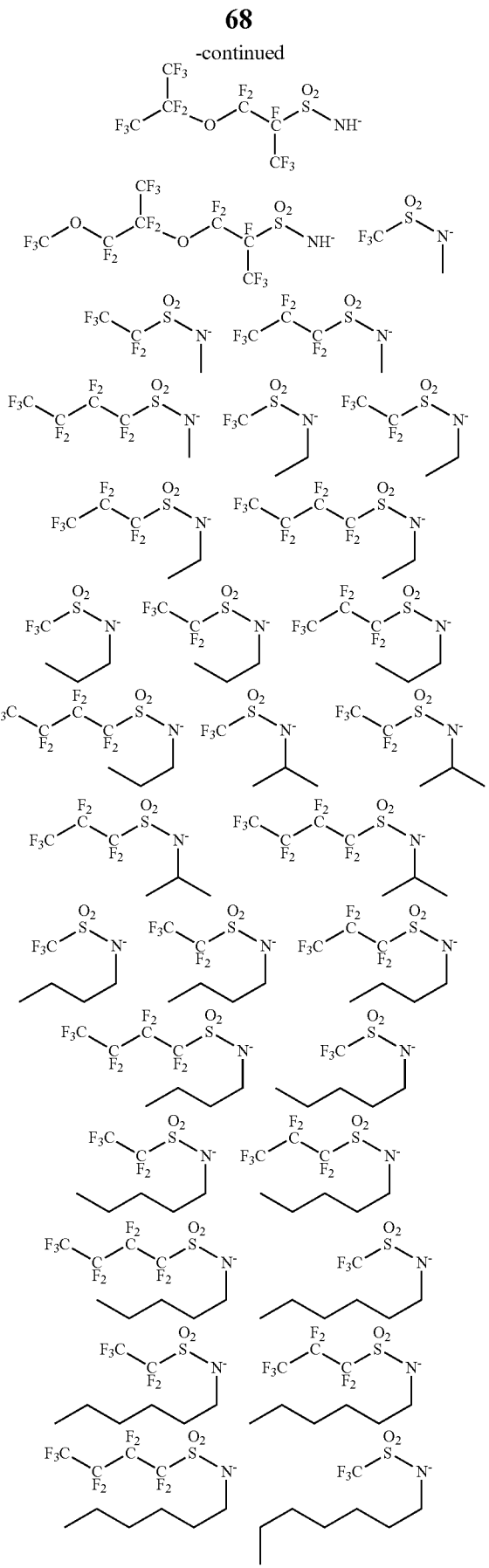

-continued
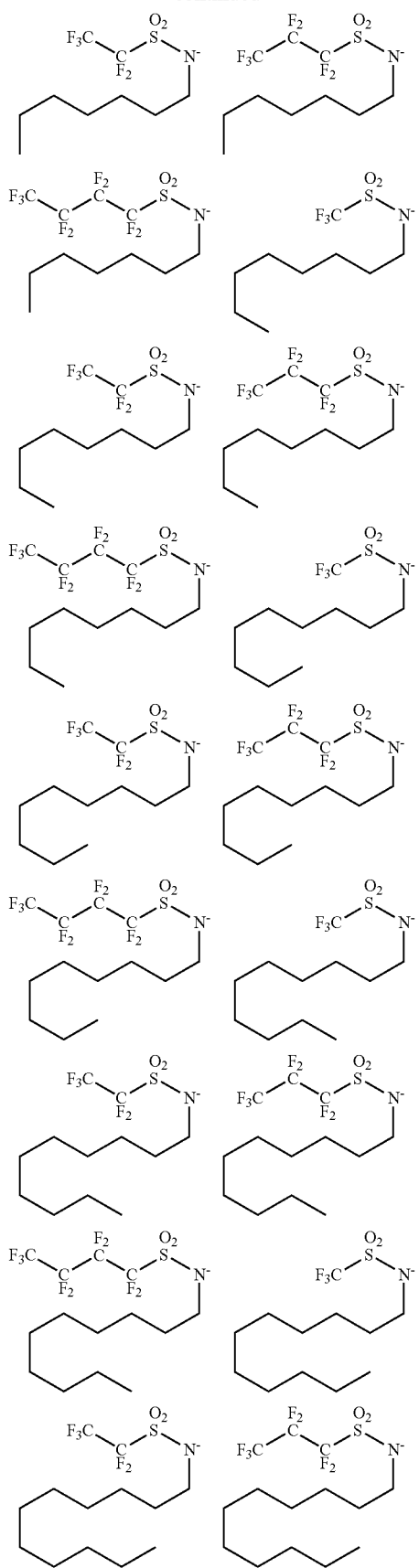
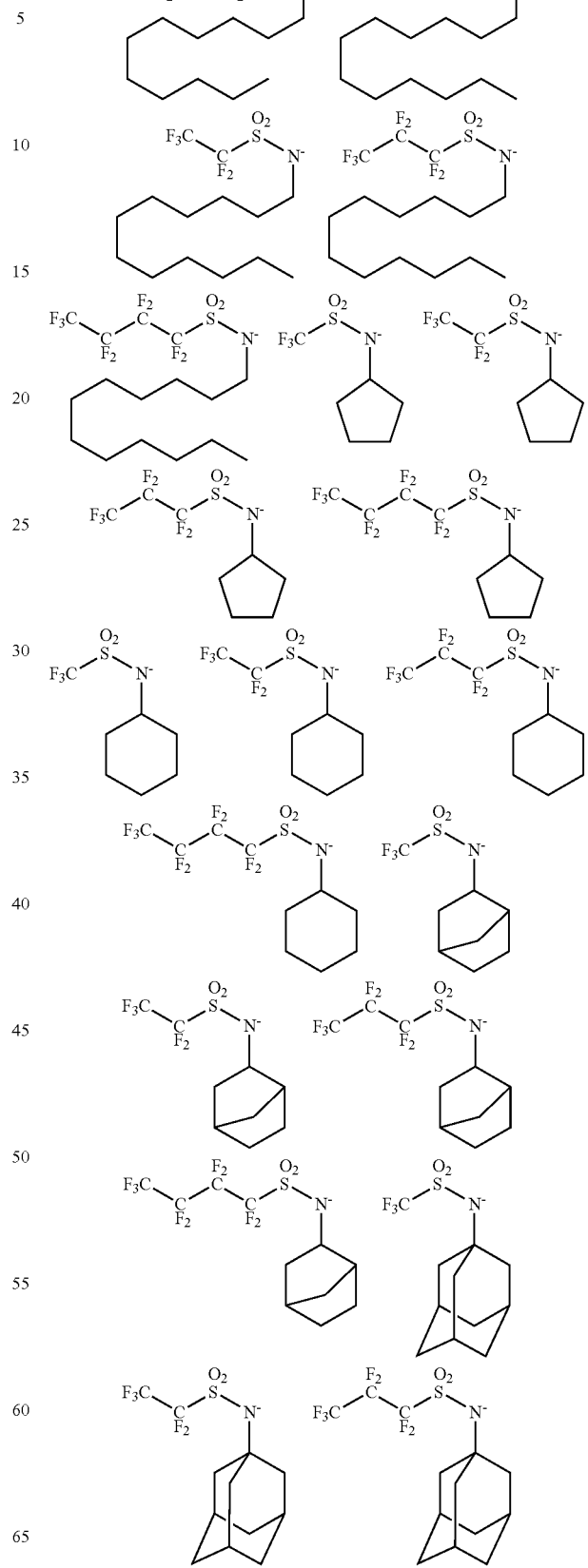

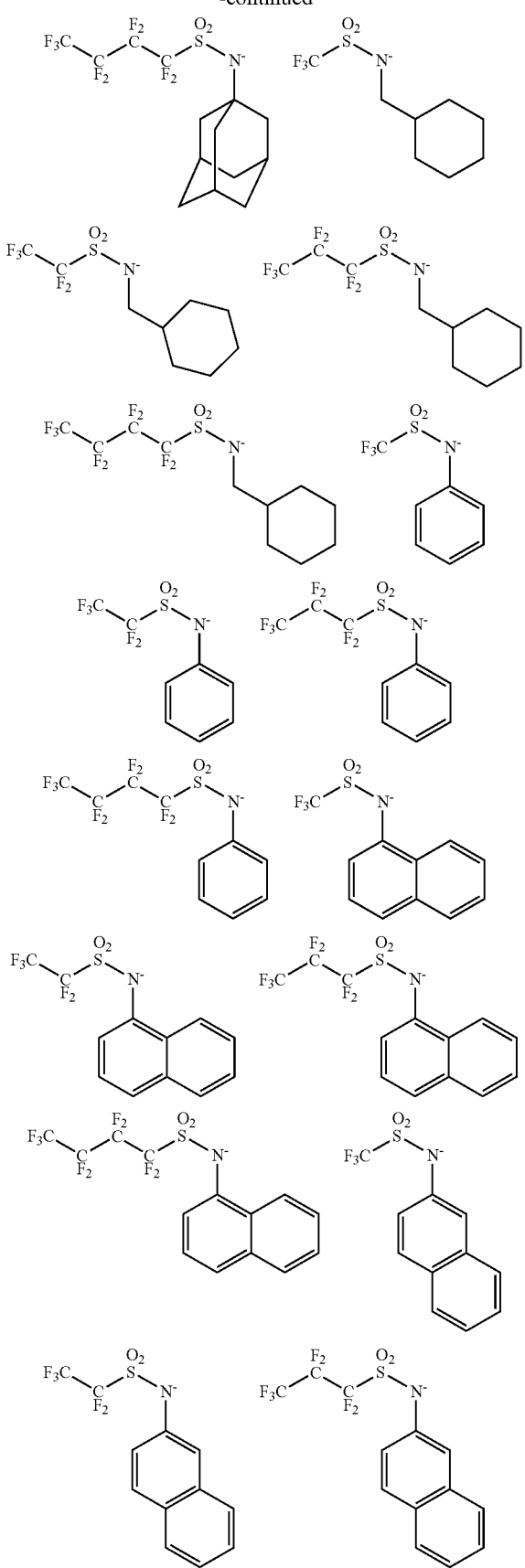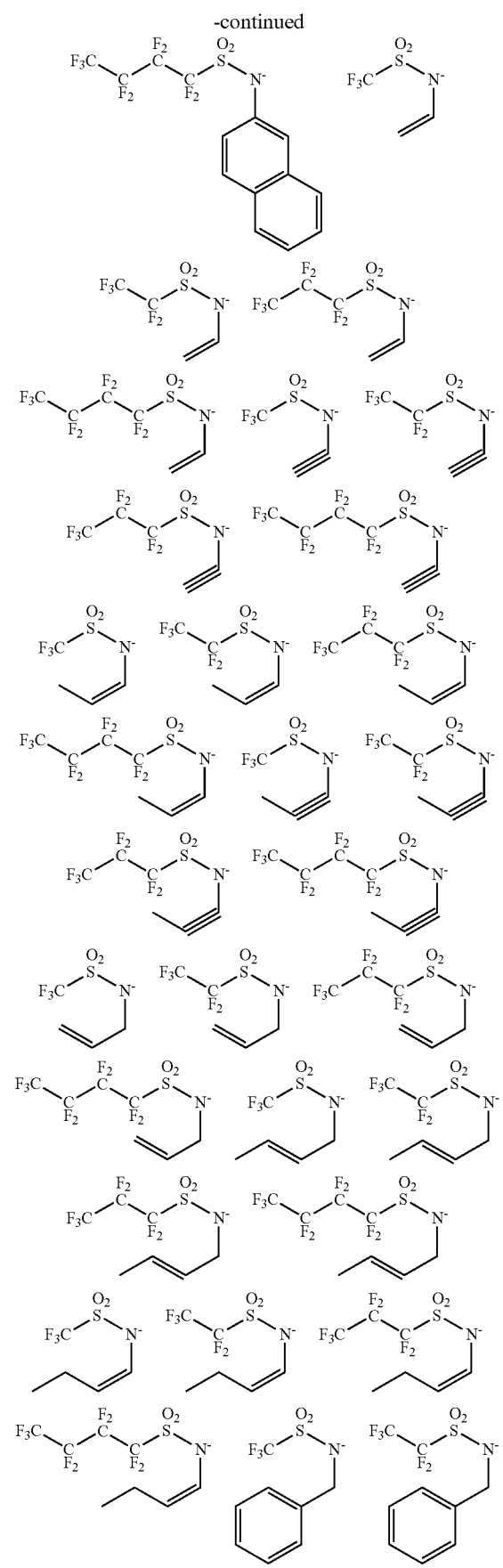

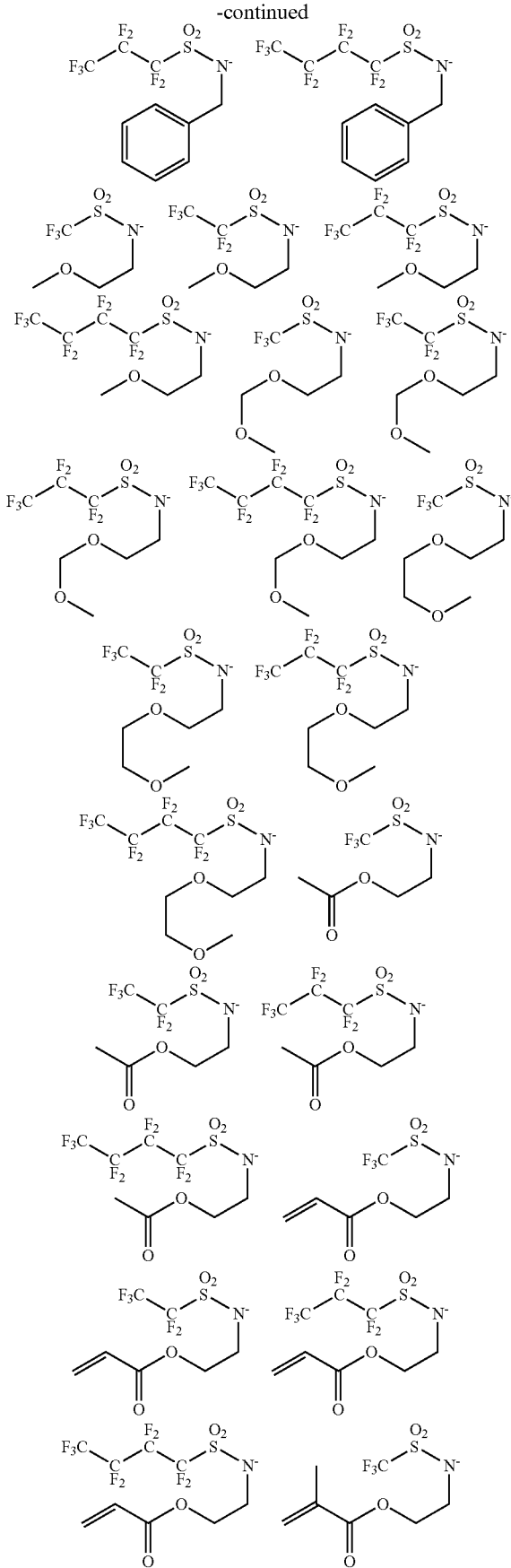
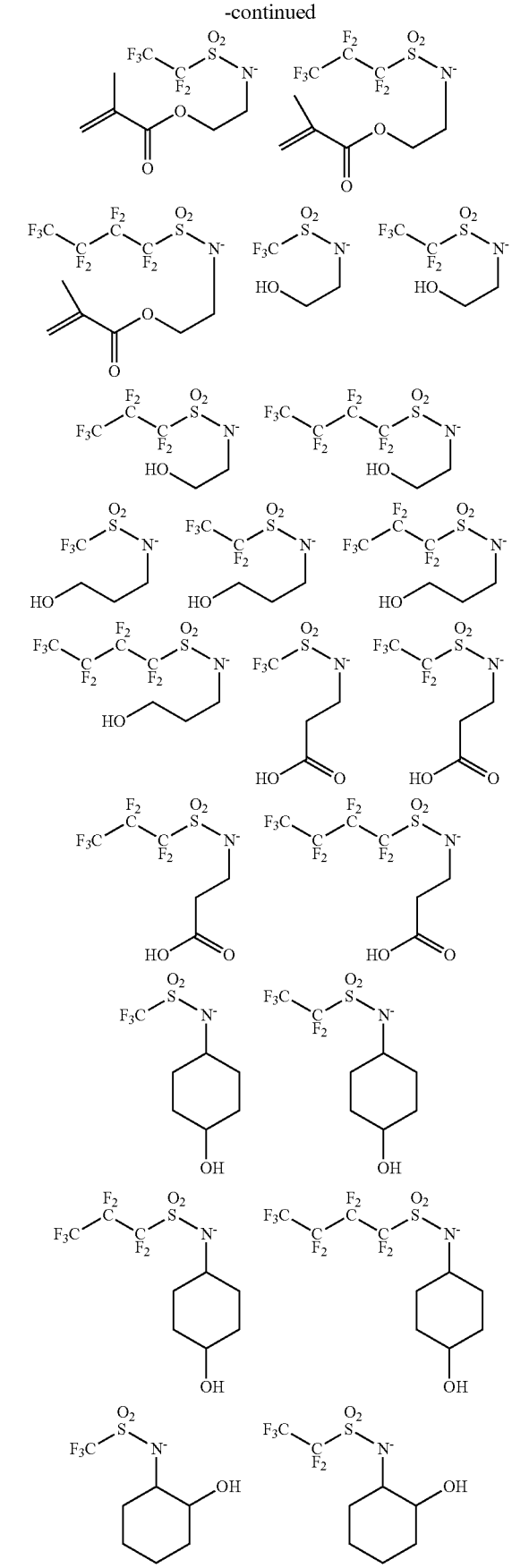

-continued
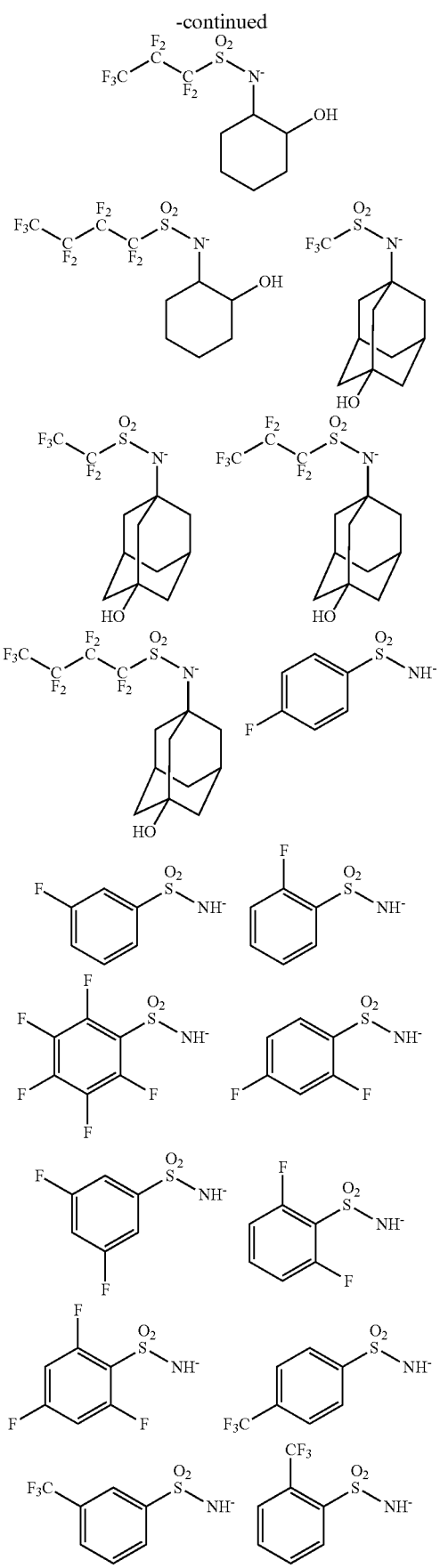
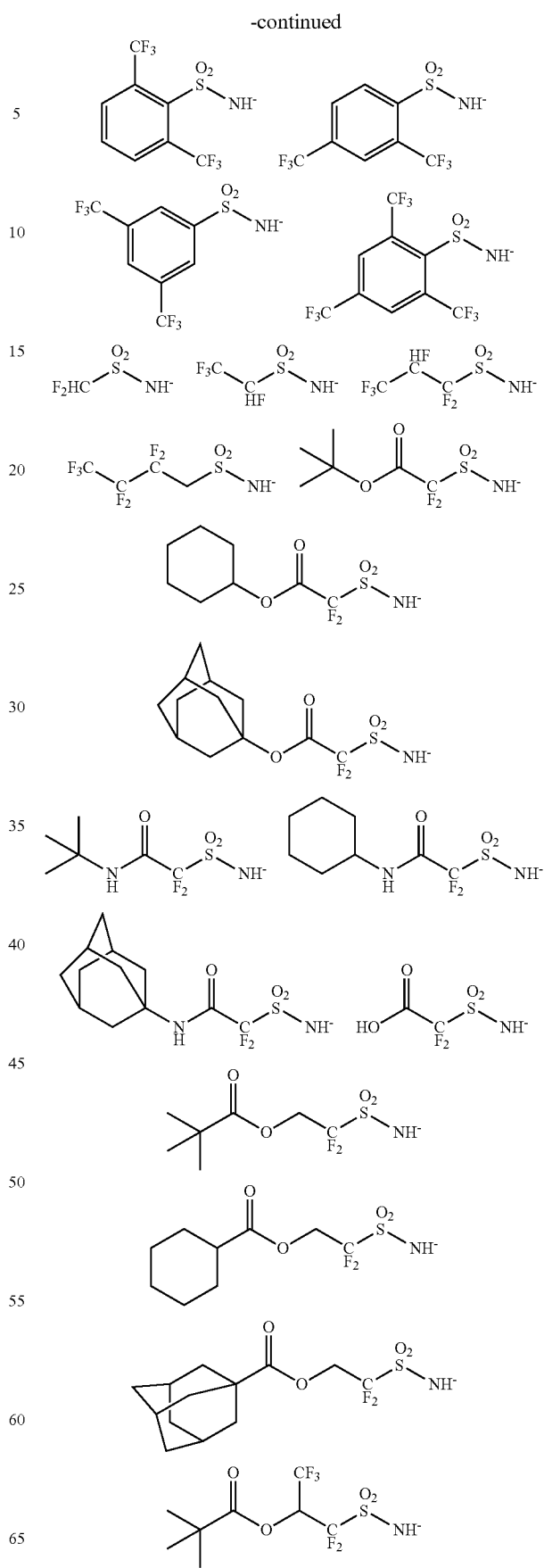

77
-continued
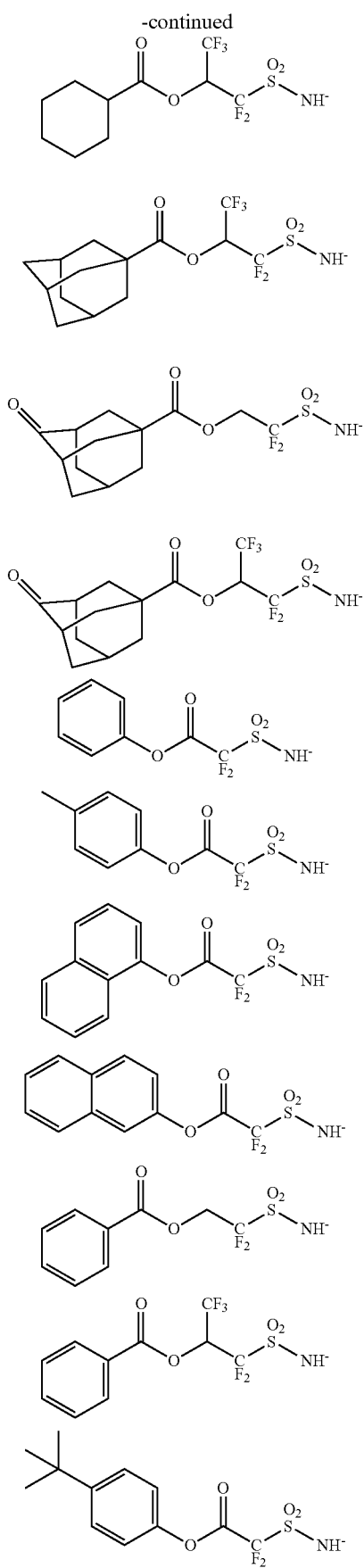
78
-continued
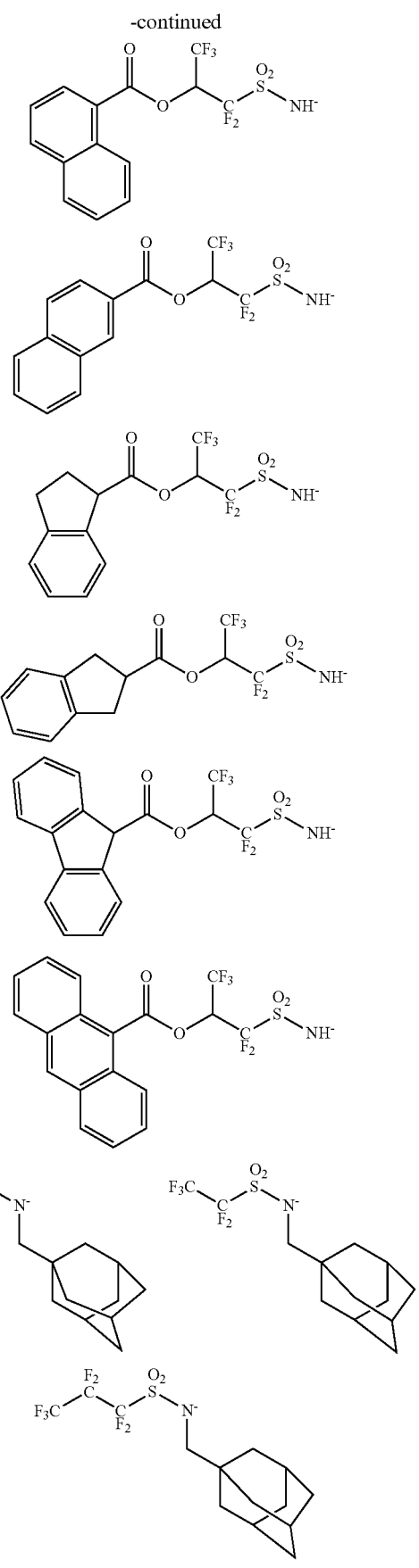

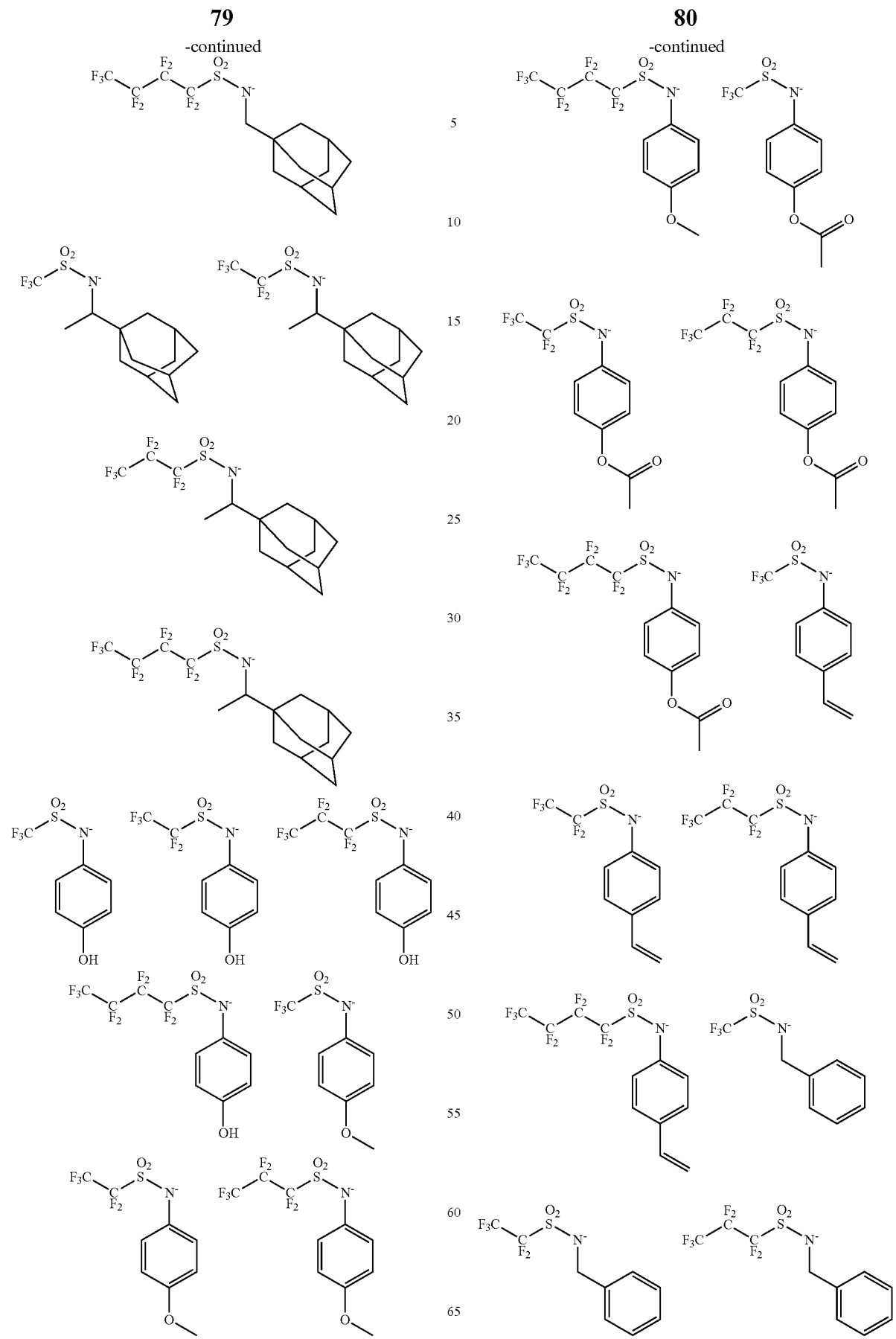

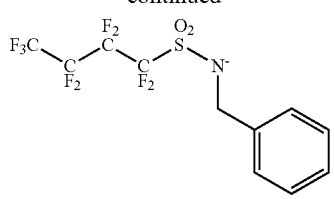
Examples of the cation moiety in formula (4) are illustrated below.
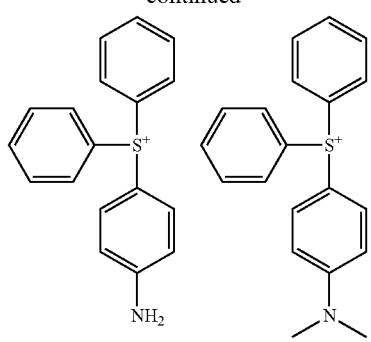
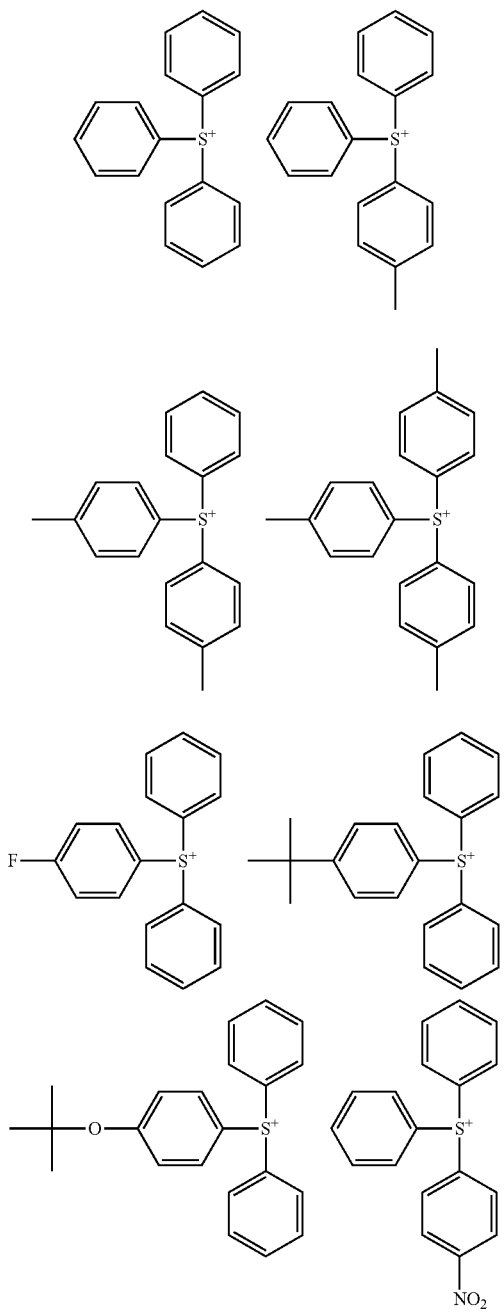

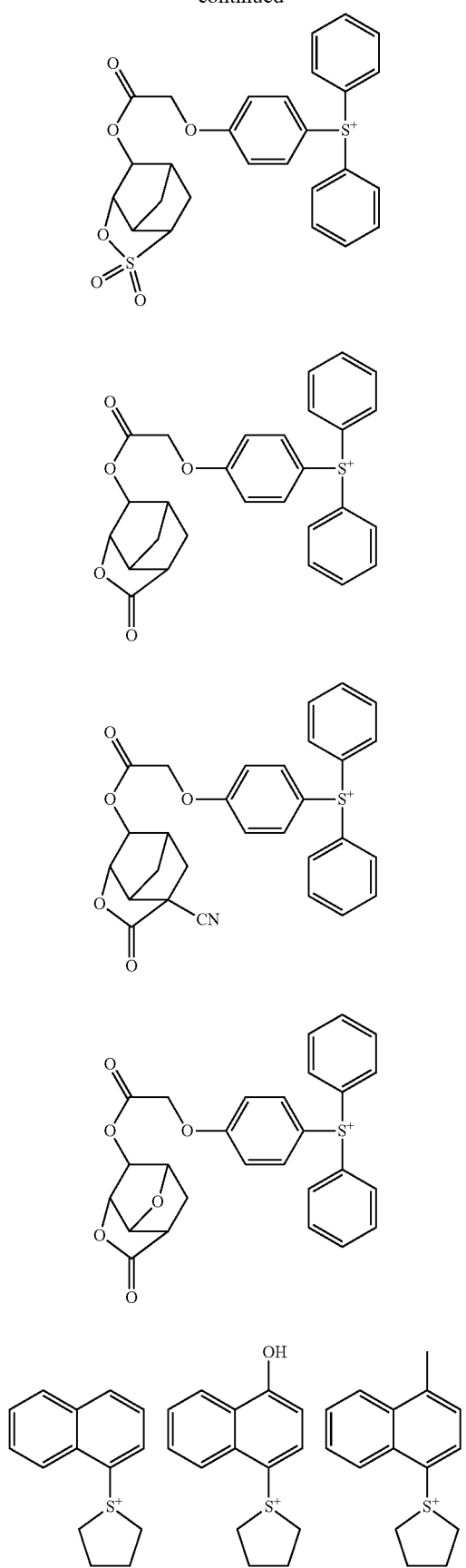

85
-continued
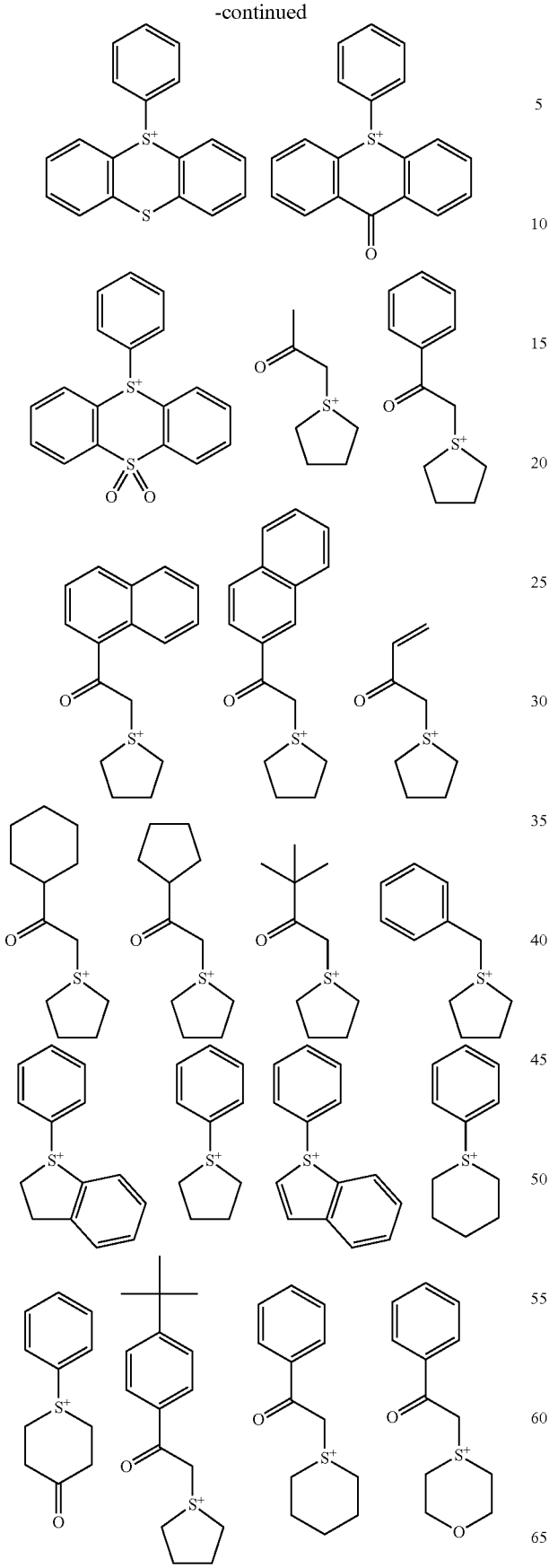
86
-continued
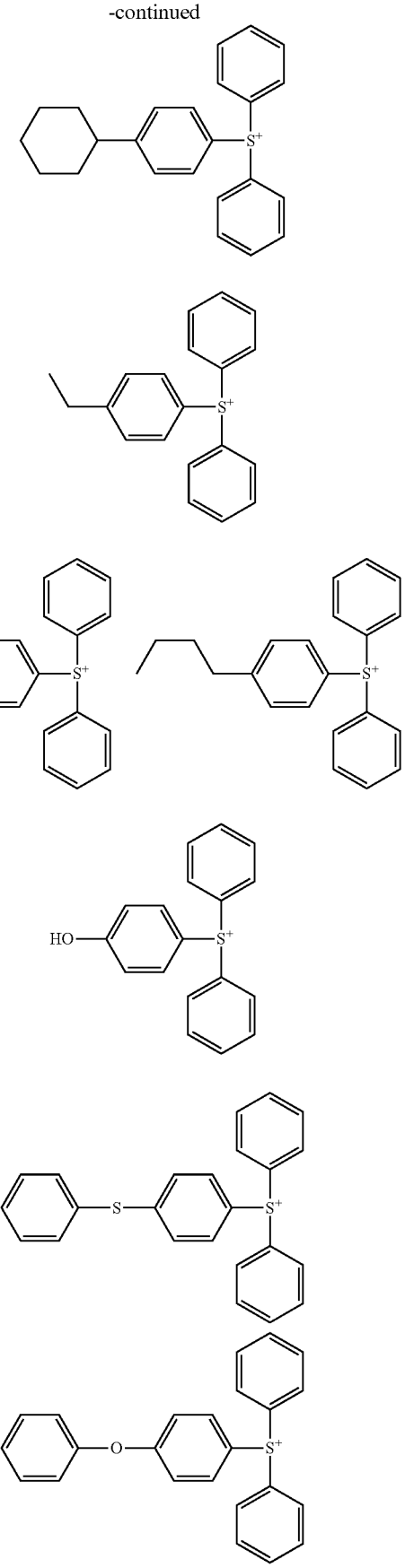

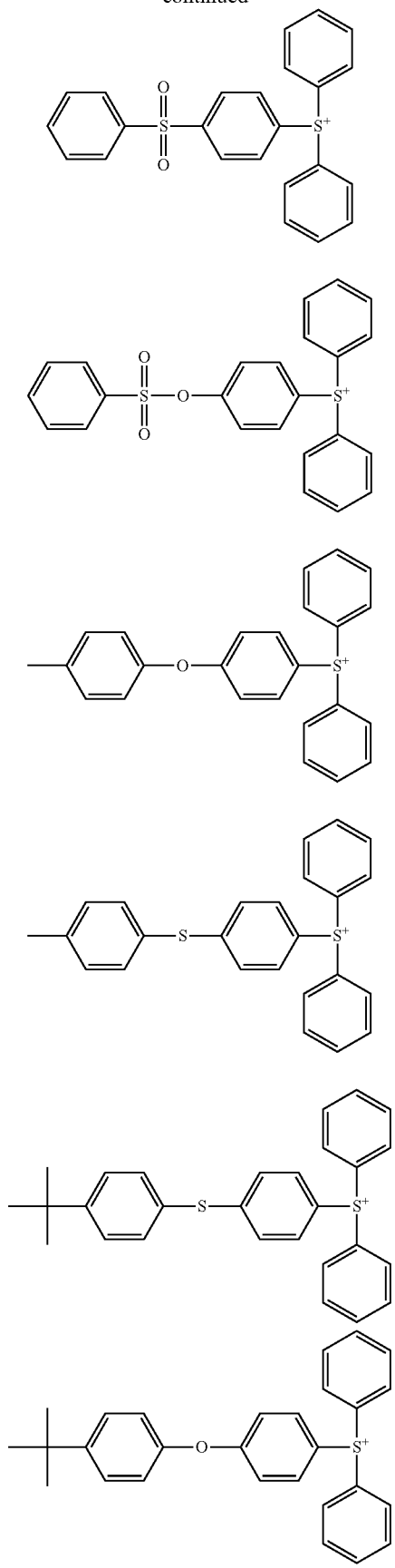

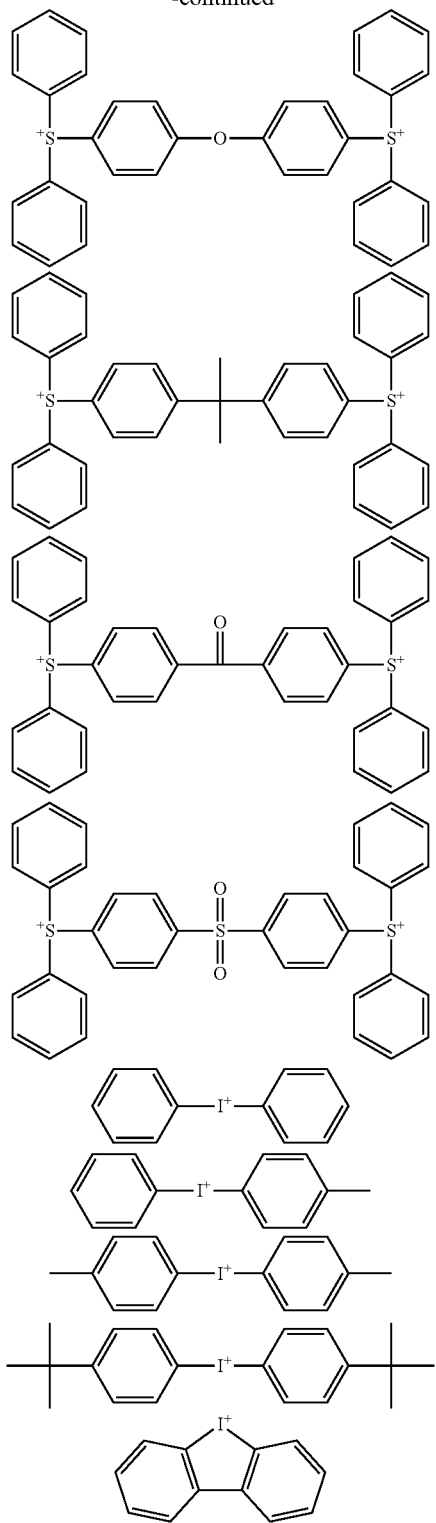

Of the foregoing cations, triarylsulfonium cations are preferred because the corresponding sulfonium salts have thermal stability. Alkylsulfonium cations are less desirable because they have an unstable structure susceptible to nucleophilic attack, and a combination (i.e., onium salt) of alkylsulfonium with fluoroalkanesulfonamide is less stable and sometimes unsuitable on practical use.

The fluoroalkanesulfonamide may be readily synthesized by the well-known ion exchange method. For example, it may be synthesized by mixing a corresponding alkali metal salt of fluoroalkanesulfonamide and a cation having chloride, bromide or iodide as the counter anion in a two-layer system of organic solvent and water. With respect to onium salt synthesis via ion exchange, reference may be made to JP-A 2007-145797, for example.

In a system wherein an onium salt of fluoroalkanesulfonamide and an onium salt capable of generating a strong acid, typically a sulfonic acid having fluorine substituted at α-position, imide acid or methide acid are co-present, fluoroalkanesulfonamide and an α-fluorinated sulfonic acid, imide acid or methide acid generate upon exposure to radiation. In the low dose exposed region, on the other hand, many onium salt molecules are kept undecomposed. The α-fluorinated sulfonic acid, imide acid or methide acid having high acid strength functions as a catalyst for triggering deprotection reaction, but the fluoroalkanesulfonamide does not induce deprotection reaction. The α-fluorinated sulfonic acid, imide acid or methide acid having high acid strength undergoes ion exchange with the onium salt of fluoroalkanesulfonamide, forming an onium salt of α-fluorinated sulfonic acid, imide acid or methide acid and releasing the fluoroalkanesulfonamide. That is, via ion exchange, the α-fluorinated sulfonic acid, imide acid or methide acid serving as the deprotection reaction catalyst is neutralized with the onium salt of fluoroalkanesulfonamide. That is, the onium salt of fluoroalkanesulfonamide functions as a quencher.

During exposure, generation of α-fluorinated sulfonic acid, imide acid or methide acid and salt exchange with the onium salt of fluoroalkanesulfonamide are infinitely repeated.

The site where α-fluorinated sulfonic acid, imide acid or methide acid is generated at the end of exposure shifts from the site where the onium salt of α-fluorinated sulfonic acid, imide acid or methide acid is initially present. Since the cycle of photo-acid generation and salt exchange is infinitely repeated, the acid generation point is averaged, which leads to a resist pattern with reduced LWR after development.

Those compounds capable of exerting a quencher effect through the same mechanism include carboxylic acid onium salts, alkylsulfonic acid onium salts, and arylsulfonic acid onium salts. The onium salts include sulfonium, iodonium and ammonium salts. However, where the carboxylic acid generating onium salt is used, it does not fully function as the quencher because of slow salt exchange with strong acid. Where the alkylsulfonic acid onium salt or arylsulfonic acid onium salt is used, it generates an acid having a relatively high acid strength. Then, the generated acid can induce deprotection reaction on such an acid labile group as acetal protective group. Consequently, the onium salt sometimes does not function as the quencher. In a system wherein the carboxylic acid onium salt or sulfonamide onium salt is incorporated in the base resin, diffusion is largely restricted, the generated strong acid is not fully quenched, and as a result, resolution performance is degraded. In contrast, the onium salt of fluoroalkanesulfonamide, which is a weak acid having a pKa value of about 6, functions as a quencher even in a system having a high reactivity protective group such as acetal protection, and can be used in the system. Additionally, the fluoroalkanesulfonamide generated thereby does not adversely affect the reaction system. For these reasons, a satisfactory pattern profile with minimal LWR and high rectangularity is available.

(D) Organic Solvent

The organic solvent (D) used herein may be any organic solvent in which the base resin, acid generator, onium salt, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in combinations of two or more. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

The resist composition may further comprise one or more of the following components: (E) a quencher, (F) a surfactant which is insoluble or substantially insoluble in water and soluble in alkaline developer, and/or a surfactant which is insoluble or substantially insoluble in water and alkaline developer (hydrophobic resin), a PAG other than the PAG defined above, and (G) an organic acid derivative and/or fluorinated alcohol. With respect to the quencher (E), the surfactant (F), the other PAG, and the organic acid derivative and/or fluorinated alcohol (G), reference may be made to US 20090274978 (JP-A 2009-269953) and JP-A 2010-215608.

The quencher (E) may be a compound capable of suppressing the rate of diffusion when the acid generated by the PAG diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Of these, preferred are tertiary amines, amine oxides, benzimidazoles and anilines having a polar functional group such as ether, carbonyl, ester or alcohol.

Preferred tertiary amines include 2-morpholinoethyl esters of straight, branched or cyclic $C_2$-$C_{20}$ aliphatic carboxylic acids and trialkylamines having a straight, branched or cyclic $C_2$-$C_{10}$ alkyl moiety. Also included are substituted forms of these amines in which some carbon-bonded hydrogen atoms are replaced by hydroxyl groups. These amines may have an ether or ester linkage. Examples include 2-morpholinoethyl 2-methoxyacetate, 2-morpholinoethyl 2-(2-methoxyethoxy) acetate, 2-morpholinoethyl 2-[2-(2-methoxyethoxy)ethoxy] acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, 2-morpholinoethyl adamantanecarboxylate, 4-[2-[(2-methoxyethoxy)methoxy]ethyl]morpholine, 4-[2-[2-(2-methoxyethoxy)ethoxy]ethyl]morpholine, 4-[2-[2-(2-butoxyethoxy)ethoxy]ethyl]morpholine, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, and tris(2-pivaloyloxyethyl)amine.

Preferred examples of the benzimidazoles include benzimidazole, 2-phenylbenzimidazole, 1-(2-acetoxyethoxy) benzimidazole, 1-[2-(methoxymethoxy)ethyl]benzimidazole, 1-[2-(methoxymethoxy)ethyl]-2-phenylbenzimidazole, and 1-(2-(2-(2-methoxyethoxy) ethoxy)ethyl)benzimidazole.

Preferred examples of the anilines include aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine.

Also included are primary or secondary amines protected with tert-butoxycarbonyl (tBOC). Those compounds described in JP-A 2007-298569 and JP-A 2010-020204 are also useful.

The quenchers may be used alone or in admixture of two or more. The quencher is preferably used in an amount of 0.001 to 8 parts, more preferably 0.01 to 4 parts by weight per 100 parts by weight of the base resin. Less than 0.001 part of the quencher may achieve no addition effect whereas more than 8 parts may lead to too low a sensitivity.

As mentioned above, the sulfonium or iodonium salt of fluoroalkanesulfonamide (C) undergoes exchange reaction with a PAG capable of generating a strong acid, for thereby controlling acid diffusion in the resist. While the sulfonium or iodonium salt apparently functions as a quencher, the quencher (E) may be used along with the sulfonium or iodonium salt. In this case, the total amount of the sulfonium or iodonium salt and quencher (E) is 0.001 to 8 parts, more preferably 0.01 to 4 parts by weight per 100 parts by weight of the base resin. Less than 0.001 part may achieve no addition effect whereas more than 8 parts may lead to too low a sensitivity.

To the resist composition, the surfactant (F) may be added. Reference should be made to those compounds defined as component (S) in JP-A 2010-215608 and JP-A 2011-16746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

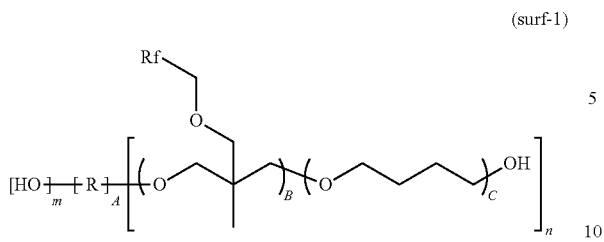

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

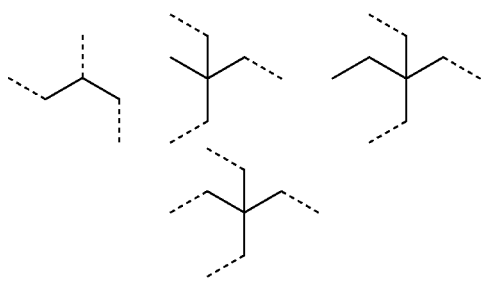

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

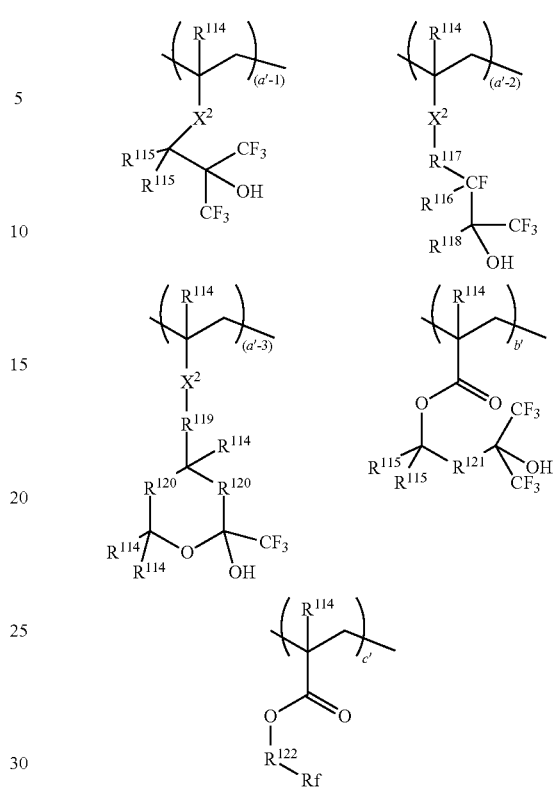

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6 carbon atoms, typically 3H-perfluoropropyl, 4H-perfluorobutyl, 5H-perfluoropentyl, or 6H-perfluorohexyl. $X^2$ is each independently —C(=O)—O—, —O—, or —C(=O)—$R^{123}$—C(=O)—O—. $R^{123}$ is a straight, branched or cyclic $C_1$-$C_{10}$ alkylene group. The subscripts are in the range: $0 \leq (a'-1) < 1$, $0 \leq (a'-2) < 1$, $0 \leq (a'-3) < 1$, $0 < (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

Exemplary units are shown below.
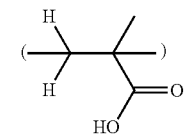 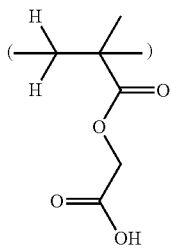 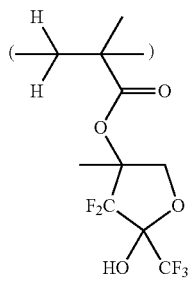 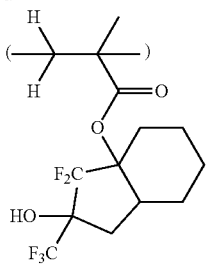
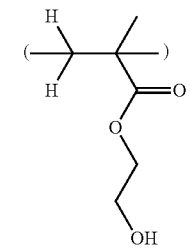 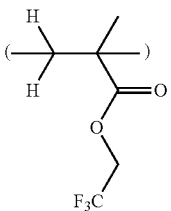 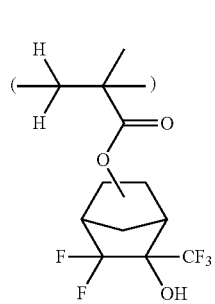 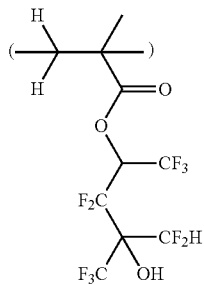
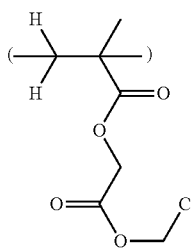 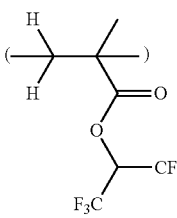 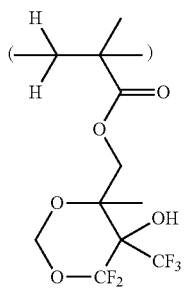 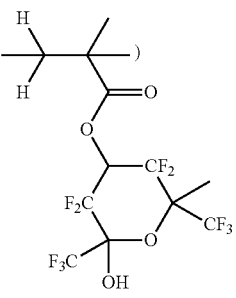
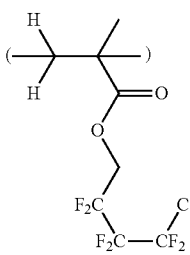 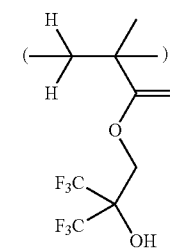 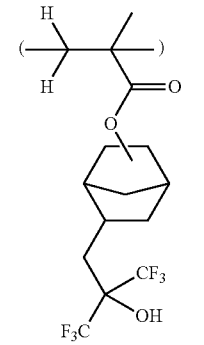 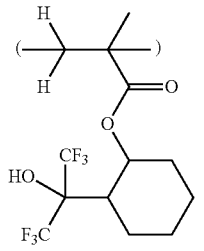
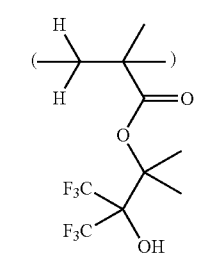 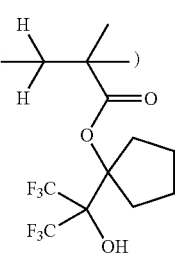 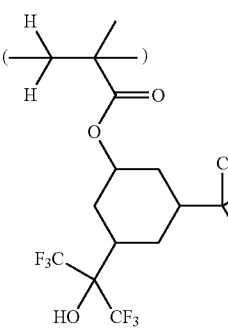 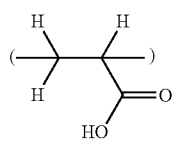
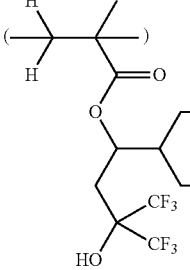 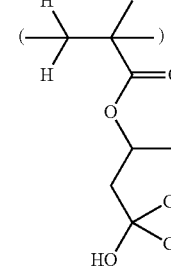

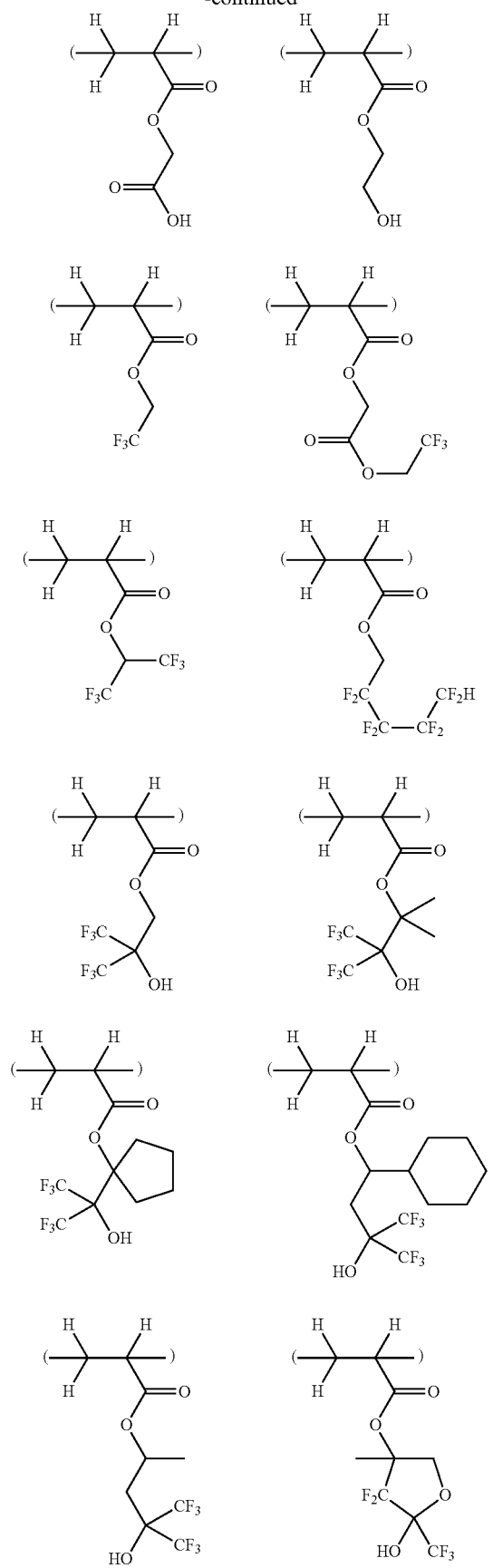
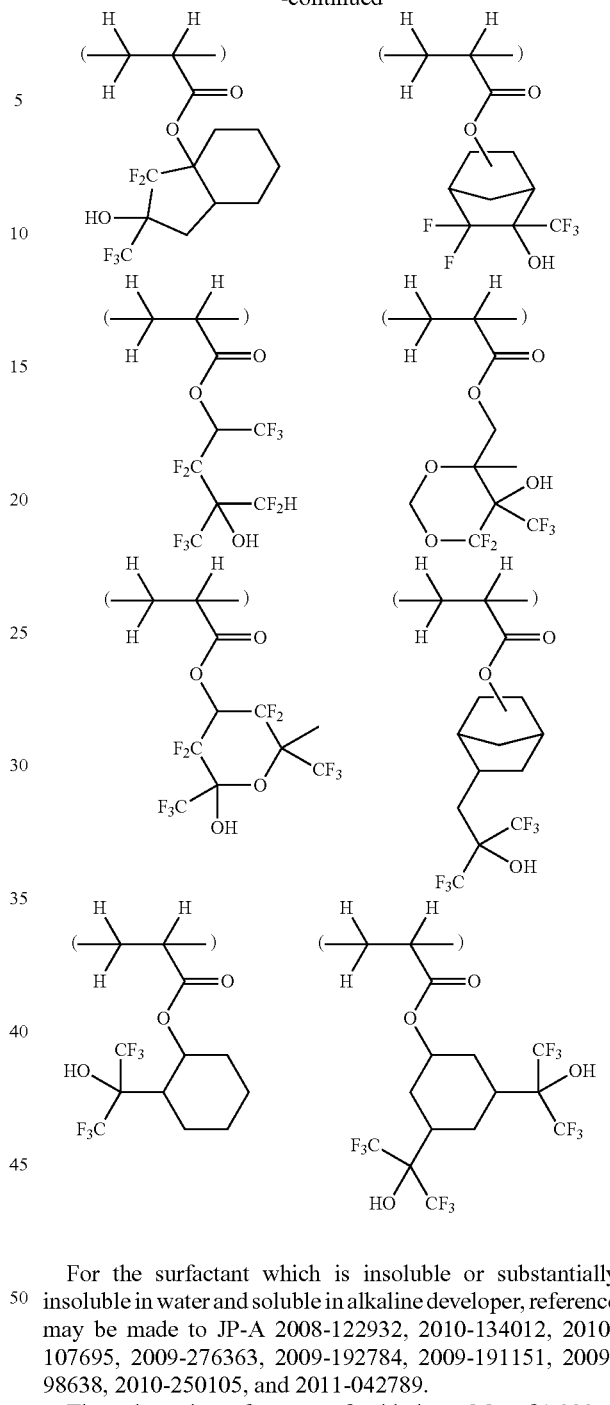

For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-98638, 2010-250105, and 2011-042789.

The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

To the resist composition, a compound which is decomposed with an acid to generate another acid, that is, acid amplifier compound may be added. For these compounds, reference should be made to JP-A 2009-269953 and 2010-

215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Process

Another embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

The resist composition is applied onto a substrate for integrated circuit fabrication (e.g., Si, $SiO_2$, SiN, SiON, TiN, WSi, BPSG, SOG or organic antireflective coating) by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.05 to 2.0 μm thick. The resist film is then exposed by the ArF immersion lithography. A mask having the desired pattern is placed over the resist film, a liquid, typically water, is interposed between the mask and the resist film, and the resist film is exposed to ArF excimer laser radiation in a dose of 1 to 200 $mJ/cm^2$, and preferably 10 to 100 $mJ/cm^2$. Prior to exposure, a protective film which is insoluble in water may be formed on the resist film, if desired.

After exposure, the resist film is baked (PEB) on a hot plate at 60 to 150° C. for 1 to 5 minutes, and preferably at 80 to 140° C. for 1 to 3 minutes. This is followed by development in a developer which is an alkaline aqueous solution, typically an aqueous solution of 0.1 to 5 wt %, more typically 2 to 3 wt % of tetramethylammonium hydroxide (TMAH). Development may be carried out by a conventional method such as dip, puddle, or spray development for 0.1 to 3 minutes, and preferably 0.5 to 2 minutes. These steps result in the formation of the desired pattern on the substrate.

The water-insoluble protective film which is used in the immersion lithography is to prevent any components from being leached out of the resist film and to improve water slippage at the film surface and is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution, typically an aqueous solution of 0.1 to 5 wt %, more typically 2 to 3 wt % of tetramethylammonium hydroxide (TMAH) is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples of the invention are given below by way of illustration and not by way of limitation. Mw and Mn are weight and number average molecular weights, respectively, as measured by GPC versus polystyrene standards, and Mw/Mn is a polydispersity index.

Synthesis Example 1

Synthesis of Triphenylsulfonium Nonafluorobutanesulfonamide (C-1)

3.4 g (0.01 mole) of potassium salt of nonafluorobutanesulfonamide, an amount (corresponding to 0.01 mole) of an aqueous solution of triphenylsulfonium methylsulfate and 25 g of dichloromethane were mixed, from which the organic layer was taken out. The organic layer was washed three times with 10 g of water, the solvent was distilled off in vacuum from the organic layer, and diisopropyl ether was added thereto, followed by decantation. The residue was concentrated in vacuum, obtaining 4.7 g of the target compound as oily matter. Yield 85%.

The compound thus obtained was analyzed by spectroscopy. FIGS. 1 and 2 are nuclear magnetic resonance spectra ($^1$H-NMR and $^{19}$F-NMR in DMSO-$d_6$) of the compound. It is noted that a trace of water was observed in $^1$H-NMR.

Infrared absorption spectroscopy (IR (D-ATR), cm$^{-1}$):
3062, 1477, 1448, 1350, 1271, 1233, 1191, 1130, 1066, 1033, 1014, 997, 976, 748, 729, 684, 591

Time-of-flight mass spectrometry (TOFMS; MALDI)
Positive M$^+$263 (corresponding to $(C_6H_5)_3S^+$)
Negative M$^+$298 (corresponding to $C_4F_9SO_2NH^-$)

Quenchers (C-2) and (C-3) having different cations from Quencher (C-1) were synthesized by ion exchange reaction as in Synthesis Example 1 aside from changing the cation of triphenylsulfonium methylsulfate. Similarly, Quenchers (C-4) to (C-8) having different anions from Quencher (C-1) were synthesized by ion exchange reaction as in Synthesis Example 1 aside from changing the fluoroalkanesulfonamide. Further, Comparative Quenchers (C-9) to (C-12) were synthesized by ion exchange reaction as in Synthesis Example 1.

Quenchers (C-1) to (C-8) and Comparative Quenchers (C-9) to (C-12) have the following structure.

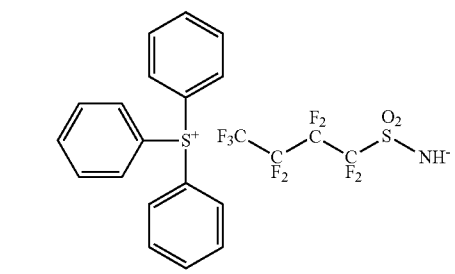

(C-1)

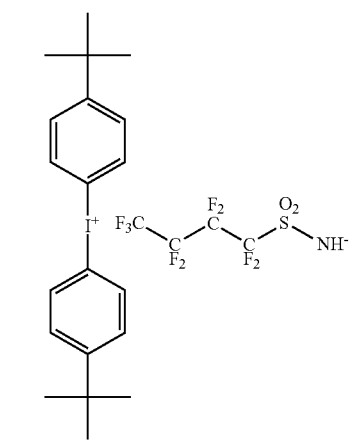

(C-2)

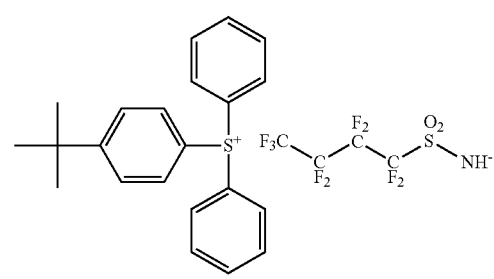

(C-3)

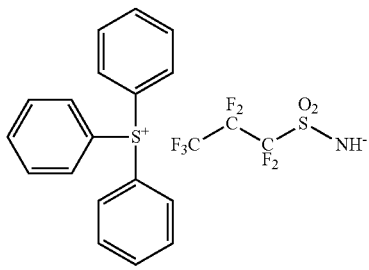

(C-4)

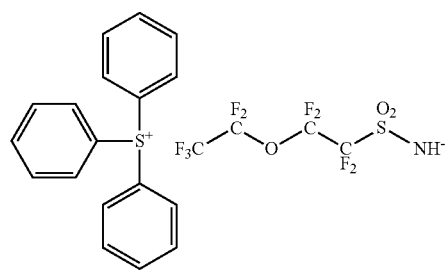

(C-5)

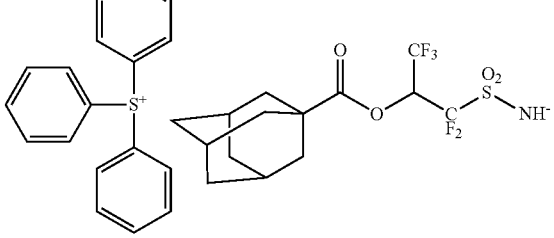

(C-6)

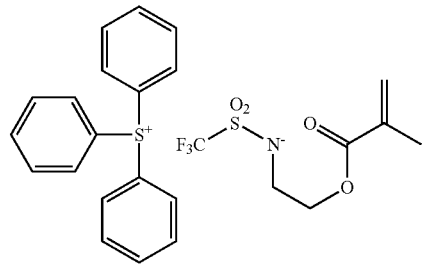

(C-7)

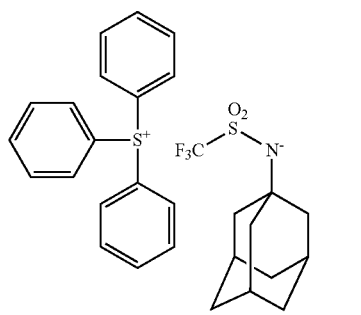

(C-8)

(C-9)
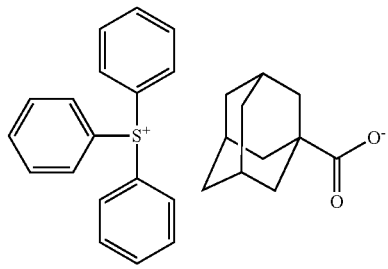

(C-10)
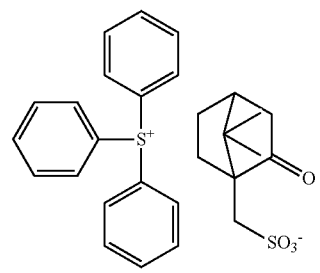

(C-11)
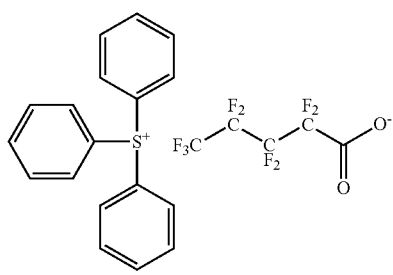

(C-12)
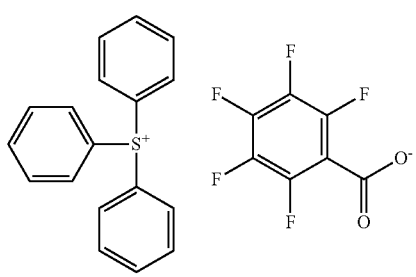

(C-13)
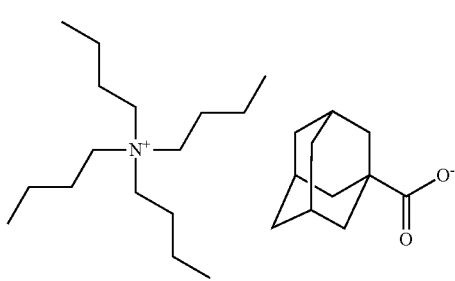

(C-14)
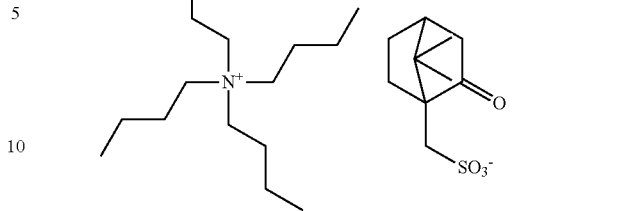

Polymer Synthesis

Polymers (P-1 to 13) for use in resist compositions were prepared by selecting monomers, adding them to methyl ethyl ketone, effecting copolymerization reaction therein, crystallizing from methanol, repeatedly washing with hexane, isolation and drying. The polymers were determined for composition by $^1$H-NMR and for Mw and Mw/Mn by GPC versus polystyrene standards.

The resins are tabulated in Table 1. In Table 1, the fraction of a certain unit is a molar fraction. Of the units shown in Table 1, the structure of the acid labile units which are essential for the invention is shown in Table 2, and the structure of the other units is shown in Table 3.

TABLE 1

| Resin | Unit 1 (fraction) | Unit 2 (fraction) | Unit 3 (fraction) | Unit 4 (fraction) | Unit 5 (fraction) | Mw |
|---|---|---|---|---|---|---|
| P-1 | A-1 (0.50) | B-1 (0.10) | B-2 (0.40) | — | — | 8,400 |
| P-2 | A-5 (0.35) | B-1 (0.20) | B-4 (0.45) | — | — | 8,100 |
| P-3 | A-2 (0.50) | B-2 (0.45) | B-7 (0.05) | — | — | 8,200 |
| P-4 | A-2 (0.45) | B-2 (0.35) | B-4 (0.20) | — | — | 7,600 |
| P-5 | A-1 (0.25) | A-4 (0.25) | B-1 (0.10) | B-4 (0.40) | — | 8,000 |
| P-6 | A-3 (0.50) | B-2 (0.50) | — | — | — | 7,700 |
| P-7 | A-3 (0.50) | B-2 (0.30) | B-4 (0.20) | — | — | 7,900 |
| P-8 | A-1 (0.25) | A-4 (0.15) | B-1 (0.15) | B-3 (0.25) | B-6 (0.20) | 8,100 |
| P-9 | A-6 (0.35) | B-1 (0.20) | B-5 (0.45) | — | — | 8,000 |
| P-10 | A-1 (0.50) | B-1 (0.10) | B-5 (0.40) | — | — | 8,700 |
| P-11 | A-6 (0.50) | B-2 (0.50) | — | — | — | 7,500 |
| P-12 | A-1 (0.50) | B-5 (0.45) | B-8 (0.05) | — | — | 7,400 |
| P-13 | A-1 (0.45) | B-5 (0.45) | B-7 (0.05) | B-8 (0.05) | — | 7,400 |

TABLE 2

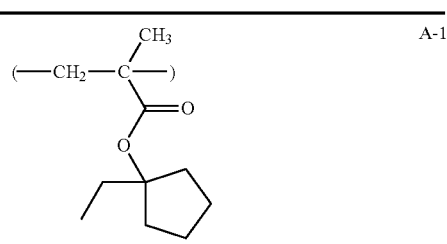

A-1

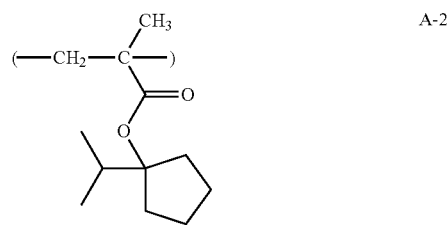

A-2

TABLE 2-continued
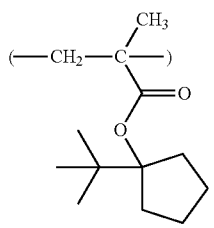 A-3
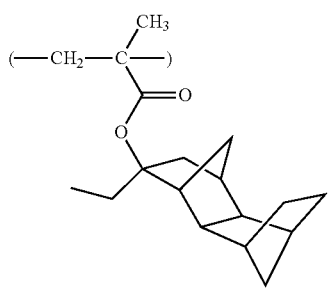 [SMILES: CCC(C)(C)C(=O)OC1(CC)CC2CC1C1C3CCC(C3)C21] A-4
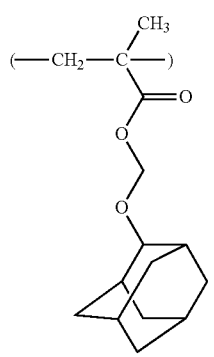 [SMILES: CCC(C)(C)C(=O)OCOC1C2CC3CC(C2)CC1C3] A-5
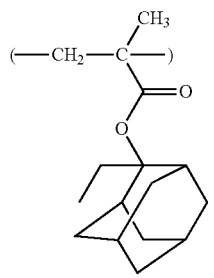 [SMILES: CCC(C)(C)C(=O)OC1(CC)C2CC3CC(C2)CC1C3] A-6
TABLE 3
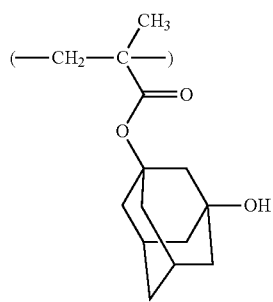 [SMILES: CCC(C)(C)C(=O)OC12CC3CC(CC(O)(C3)C1)C2] B-1
TABLE 3-continued
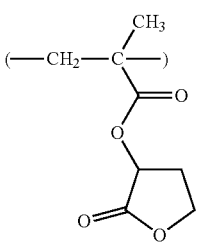 B-2
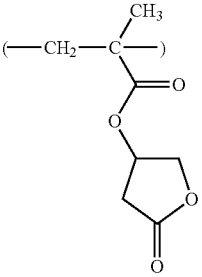 B-3
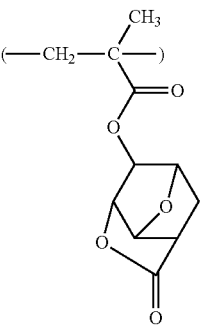 [SMILES: CCC(C)(C)C(=O)OC1C2CC3C(=O)OC1C3O2] B-4
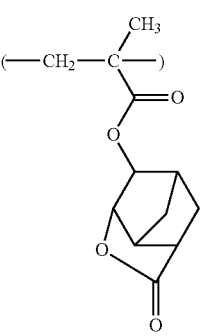 [SMILES: CCC(C)(C)C(=O)OC1C2CC3C(=O)OC1C3C2] B-5
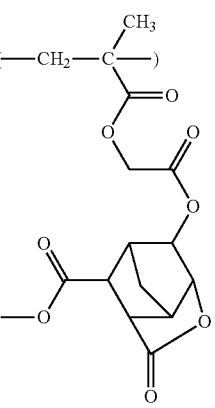 B-6

TABLE 3-continued

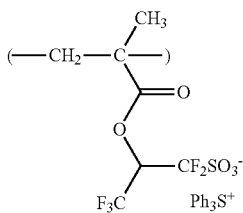
B-7

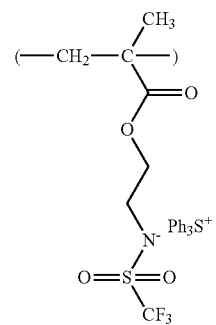
B-8

(Ph stands for phenyl.)

Examples 1-1 to 1-20 and Comparative Examples 1-1 to 1-11

A resist solution was prepared by selecting a quencher (in Synthesis Example), a polymer (in Synthesis Example), PAG, amine quencher, and alkali-soluble surfactant (F-1) in accordance with the formulation shown in Table 4, dissolving the components in a solvent, and filtering through a Teflon® filter having a pore size of 0.2 μm. The solvent contained 0.01 wt % of surfactant (F-2).

The PAG, solvent, amine quencher, alkali-soluble surfactant (F-1) and surfactant (F-2) in Table 4 are identified below.

TABLE 4

|  |  | Resist | Resin (pbw) | PAG (pbw) | Quencher (pbw) | Surfactant (pbw) | Solvent 1 (pbw) | Solvent 2 (pbw) |
|---|---|---|---|---|---|---|---|---|
| Example | 1-1 | R-01 | P-1 (80) | PAG-1 (6.6) | C-1 (6.5) | F-1 (5.0) | PGMEA (1,728) | GBL (192) |
|  | 1-2 | R-02 | P-1 (80) | PAG-2 (7.6) | C-1 (6.5) | F-1 (5.0) | PGMEA (1,728) | GBL (192) |
|  | 1-3 | R-03 | P-1 (80) | PAG-2 (7.6) | C-2 (7.2) | F-1 (5.0) | PGMEA (1,728) | GBL (192) |
|  | 1-4 | R-04 | P-1 (80) | PAG-2 (7.6) | C-3 (8.0) | F-1 (5.0) | PGMEA (1,728) | GBL (192) |
|  | 1-5 | R-05 | P-1 (80) | PAG-2 (7.6) | C-4 (5.9) | F-1 (5.0) | PGMEA (1,728) | GBL (192) |
|  | 1-6 | R-06 | P-1 (80) | PAG-2 (7.6) | C-5 (6.7) | F-1 (5.0) | PGMEA (1,728) | GBL (192) |
|  | 1-7 | R-07 | P-1 (80) | PAG-2 (7.6) | C-6 (7.6) | F-1 (5.0) | PGMEA (1,728) | GBL (192) |
|  | 1-8 | R-08 | P-1 (80) | PAG-2 (7.6) | C-7 (6.1) | F-1 (5.0) | PGMEA (1,728) | GBL (192) |
|  | 1-9 | R-09 | P-1 (80) | PAG-2 (7.6) | C-8 (6.3) | F-1 (5.0) | PGMEA (1,728) | GBL (192) |
|  | 1-10 | R-10 | P-2 (80) | PAG-2 (7.6) | C-1 (6.5) | F-1 (5.0) | PGMEA (1,728) | GBL (192) |
|  | 1-11 | R-11 | P-3 (80) | PAG-2 (7.6) | C-1 (6.5) | F-1 (5.0) | PGMEA (1,344) | CyHO (576) |
|  | 1-12 | R-12 | P-4 (80) | PAG-2 (7.0) PAG-4 (2.0) | C-1 (6.5) | F-1 (5.0) | PGMEA (1,728) | GBL (192) |
|  | 1-13 | R-13 | P-5 (80) | PAG-2 (7.6) | C-1 (6.5) | F-1 (5.0) | PGMEA (1,344) | CyHO (576) |
|  | 1-14 | R-14 | P-4 (80) | — | C-1 (4.5) E-1 (0.2) | F-1 (5.0) | PGMEA (1,728) | GBL (192) |
|  | 1-15 | R-15 | P-6 (80) | PAG-2 (7.6) | C-1 (6.5) | F-1 (5.0) | PGMEA (1,728) | GBL (192) |
|  | 1-16 | R-16 | P-7 (80) | PAG-2 (7.6) | C-1 (6.5) | F-1 (5.0) | PGMEA (1,728) | GBL (192) |
|  | 1-17 | R-17 | P-8 (80) | PAG-2 (7.6) | C-1 (6.5) | F-1 (5.0) | PGMEA (1,344) | CyHO (576) |
|  | 1-18 | R-18 | P-9 (80) | PAG-2 (7.6) | C-1 (6.5) | F-1 (5.0) | PGMEA (1,344) | CyHO (576) |
|  | 1-19 | R-19 | P-10 (80) | PAG-2 (7.6) | C-1 (6.5) | F-1 (5.0) | PGMEA (1,344) | CyHO (576) |
|  | 1-20 | R-20 | P-11 (80) | PAG-2 (7.6) | C-1 (6.5) | F-1 (5.0) | PGMEA (1,344) | CyHO (576) |
| Comparative Example | 1-1 | R-21 | P-1 (80) | PAG-2 (7.6) | C-9 (5.1) | F-1 (5.0) | PGMEA (1, 728) | GBL (192) |
|  | 1-2 | R-22 | P-1 (80) | PAG-2 (7.6) | C-10 (5.7) | F-1 (5.0) | PGMEA (1,728) | GBL (192) |
|  | 1-3 | R-23 | P-1 (80) | PAG-2 (7.6) | C-11 (6.1) | F-1 (5.0) | PGMEA (1,728) | GBL (192) |
|  | 1-4 | R-24 | P-1 (80) | PAG-2 (7.6) | C-12 (5.5) | F-1 (5.0) | PGMEA (1,728) | GBL (192) |
|  | 1-5 | R-25 | P-1 (80) | PAG-2 (7.6) | C-13 (4.9) | F-1 (5.0) | PGMEA (1,728) | GBL (192) |
|  | 1-6 | R-26 | P-1 (80) | PAG-2 (7.6) | C-14 (5.5) | F-1 (5.0) | PGMEA (1,728) | GBL (192) |
|  | 1-7 | R-27 | P-1 (80) | PAG-2 (7.6) | PAG-3 (6.3) | F-1 (5.0) | PGMEA (1,728) | GBL (192) |
|  | 1-8 | R-28 | P-2 (80) | PAG-2 (7.6) | C-10 (5.7) | F-1 (5.0) | PGMEA (1,728) | GBL (192) |
|  | 1-9 | R-29 | P-1 (80) | PAG-2 (7.6) | E-1 (1.1) | F-1 (5.0) | PGMEA (1,728) | GBL (192) |
|  | 1-10 | R-30 | P-12 (80) | PAG-2 (7.6) | — | F-1 (5.0) | PGMEA (1,344) | CyHO (576) |
|  | 1-11 | R-31 | P-13 (80) | — | — | F-1 (5.0) | PGMEA (1,344) | CyHO (576) |

Acid Generator
PAG-1: triphenylsulfonium nonafluoro-1-butanesulfonate
PAG-2: triphenylsulfonium 2-(adamantane-1-carbonyloxy)-1,1,3,3-pentafluoropropane-1-sulfonate
PAG-3: triphenylsulfonium bis(trifluoromethanesulfonyl)-imide
PAG-4: N-(perfluorobutanesulfonyloxy)-1,8-naphthylimide
Organic Solvent
PGMEA: propylene glycol monomethyl ether acetate
GBL: γ-butyrolactone
CyHO: cyclohexanone
Amine Quencher
E-1: 2-morpholinoethyl laurate
Surfactant
F-1: (described in JP-A 2008-122932) poly(3,3,3-trifluoro-2-hydroxy-1,1-dimethyl-2-trifluoromethylpropyl methacrylate/1,1,1-trifluoro-2-hydroxy-6-methyl-2-trifluoro-methylhept-4-yl methacrylate)

Mw=7,300
Mw/Mn=1.86

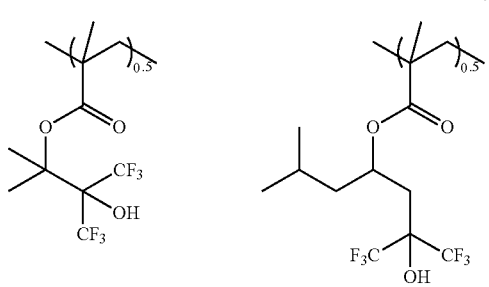

Polymer 1

F-2: 3-methyl-3-(2,2,2-trifluoroethoxymethyl)olxetane/
tetrahydrofuran/2,2-dimethyl-1,3-propane diol copolymer (Omnova Solutions, Inc.) of the structural formula shown below

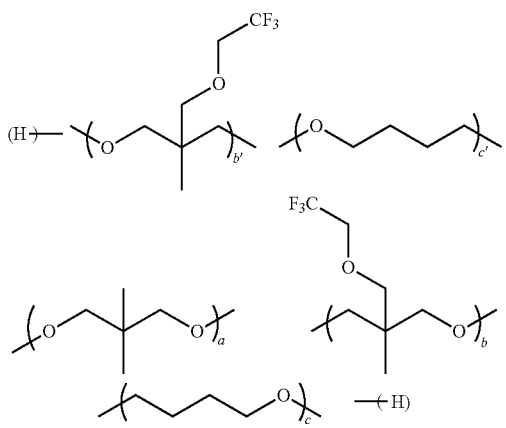

a:(b+b'):(c+c') = 1:4-7:0.01-1 (molar ratio)
Mw = 1,500

Resist Evaluation 1

Examples 2-1 to 2-20 and Comparative Examples 2-1 to 2-11

An antireflective coating solution (ARC-29A by Nissan Chemical Industries, Ltd.) was coated onto a silicon substrate and baked at 200° C. for 60 seconds to form an ARC film of 100 nm thick. The resist solution was spin coated onto the ARC and baked on a hot plate at 100° C. for 60 seconds to form a resist film of 90 nm thick. The resist film was exposed according to the ArF immersion lithography using an ArF excimer laser scanner (model NSR-S610C, Nikon Corp., NA 1.30, dipole illumination, 6% halftone phase shift mask). The resist film was baked (PEB) at an arbitrary temperature for 60 seconds and developed in a 2.38 wt % tetramethylammonium hydroxide aqueous solution for 60 seconds.

Evaluation Method

The resist was evaluated by observing a 40-nm 1:1 line-and-space pattern under an electron microscope. The optimum dose (Eop) was a dose (mJ/cm$^2$) which provided a line width of 40 nm. The profile of a pattern at the optimum dose was compared and judged passed or rejected according to the following criterion.

Passed: pattern of rectangular profile with perpendicular sidewall

Rejected: pattern of tapered profile with sharply graded sidewall or of top-rounded profile due to top loss The width of lines of a 40-nm 1:1 line-and-space pattern was measured under SEM to determine a line width variation (30 points measured, 3σ value computed), which was reported as line width roughness (LWR). A smaller value of LWR indicates a line pattern with a less fluctuation and of better profile. In this test, the sample was rated good when LWR is equal to or less than 3.0 nm and poor when LWR is equal to or more than 3.1 nm.

The collapse limit was a minimum width (nm) of lines which could be resolved without collapse when the line width was reduced by increasing the exposure dose. A smaller value indicates better collapse resistance. In this test, the sample was rated good when the collapse limit is equal to or less than 33 nm and poor when the collapse limit is equal to or more than 34 nm.

Defects in the pattern as developed were inspected by a flaw detector KLA2800 (KLA-Tencor). A defect density (count/cm$^2$) was computed by dividing the total number of detected defects by a detection area. The pattern formed was an iterated 40-nm 1:1 line-and-space pattern. The defect inspection conditions included light source UV, inspected pixel size 0.28 μm, and cell-to-cell mode. In this test, the sample was rated good for a defect density of less than 0.05 defect/cm$^2$ and poor for a density of equal to or more than 0.05 defect/cm$^2$.

The test results of the resist materials are shown in Table 5.

TABLE 5

| | | Resist | Eop (mJ/cm$^2$) | Collapse limit (nm) | LWR (nm) | Defect density (count/cm$^2$) | Profile |
|---|---|---|---|---|---|---|---|
| Example | 2-1 | R-01 | 35 | Good 31 | Good 2.9 | 0.03 | Passed |
| | 2-2 | R-02 | 32 | Good 29 | Good 2.8 | 0.03 | Passed |
| | 2-3 | R-03 | 36 | Good 31 | Good 2.8 | 0.02 | Passed |
| | 2-4 | R-04 | 34 | Good 30 | Good 2.9 | 0.04 | Passed |
| | 2-5 | R-05 | 38 | Good 31 | Good 2.7 | 0.03 | Passed |
| | 2-6 | R-06 | 33 | Good 32 | Good 2.8 | 0.02 | Passed |
| | 2-7 | R-07 | 32 | Good 31 | Good 2.9 | 0.03 | Passed |
| | 2-8 | R-08 | 35 | Good 30 | Good 2.9 | 0.04 | Passed |
| | 2-9 | R-09 | 33 | Good 31 | Good 2.8 | 0.04 | Passed |
| | 2-10 | R-10 | 35 | Good 31 | Good 2.7 | 0.02 | Passed |
| | 2-11 | R-11 | 31 | Good 31 | Good 2.7 | 0.02 | Passed |
| | 2-12 | R-12 | 42 | Good 29 | Good 2.7 | 0.03 | Passed |
| | 2-13 | R-13 | 40 | Good 30 | Good 2.8 | 0.04 | Passed |
| | 2-14 | R-14 | 44 | Good 30 | Good 2.7 | 0.03 | Passed |
| | 2-15 | R-15 | 40 | Good 28 | Good 2.7 | 0.04 | Passed |
| | 2-16 | R-16 | 42 | Good 30 | Good 2.7 | 0.03 | Passed |
| | 2-17 | R-17 | 42 | Good 31 | Good 2.9 | 0.02 | Passed |
| | 2-18 | R-18 | 40 | Good 30 | Good 2.8 | 0.03 | Passed |
| | 2-19 | R-19 | 40 | Good 32 | Good 2.9 | 0.02 | Passed |
| | 2-20 | R-20 | 38 | Good 32 | Good 2.9 | 0.03 | Passed |
| Comparative Example | 2-1 | R-21 | 33 | Poor 35 | Poor 3.4 | 0.10 | Rejected |
| | 2-2 | R-22 | 30 | Poor 35 | Poor 3.3 | 0.08 | Rejected |
| | 2-3 | R-23 | 33 | Poor 35 | Poor 3.5 | 0.12 | Rejected |
| | 2-4 | R-24 | 30 | Poor 34 | Poor 3.6 | 0.11 | Rejected |
| | 2-5 | R-25 | 33 | Poor 36 | Poor 3.4 | 0.20 | Rejected |
| | 2-6 | R-26 | 30 | Poor 36 | Poor 3.5 | 0.09 | Rejected |
| | 2-7 | R-27 | 25 | Poor 34 | Poor 3.2 | 0.08 | Rejected |
| | 2-8 | R-28 | 26 | Poor 34 | Poor 3.2 | 0.07 | Rejected |
| | 2-9 | R-29 | 33 | Poor 34 | Poor 3.3 | 0.13 | Rejected |
| | 2-10 | R-30 | 30 | Poor 37 | Poor 3.5 | 0.12 | Rejected |
| | 2-11 | R-31 | 37 | Poor 37 | Poor 3.6 | 0.15 | Rejected |

It is evident from the data of Table 5 that the resist compositions within the scope of the invention form patterns of good profile having a minimal LWR and collapse resistance, indicating good resolution. Also a low defect density was confirmed.

Resist Evaluation 2

Examples 3-1 to 3-3 and Comparative Examples 3-1 to 3-2

A trilayer process substrate was prepared by forming a spin-on carbon film (ODL-50 by Shin-Etsu Chemical Co., Ltd., carbon content 80 wt %) of 200 nm thick on a silicon wafer and forming a silicon-containing spin-on hard mask (SHB-A940 by Shin-Etsu Chemical Co., Ltd., silicon content 43 wt %) of 35 nm thick thereon. The resist solution in Table 4 was spin coated on the trilayer process substrate, then baked (PAB) on a hot plate at 100° C. for 60 seconds to form a resist film of 90 nm thick.

Using an ArF excimer laser immersion lithography scanner (NSR-610C by Nikon Corp., NA 1.30, σ 0.98/0.74, dipole opening 90 deg., s-polarized illumination), exposure was carried out with a varying exposure dose. After exposure, the resist film was baked (PEB) at an arbitrary temperature for 60 seconds, developed in butyl acetate developer for 30 seconds, and rinsed with diisoamyl ether.

The mask used herein is a binary mask having an on-mask design corresponding to a 45 nm line/90 nm pitch pattern (actual on-mask size is 4 times because of ¼ image reduction projection exposure). The line pattern printed on the resist through the light-transmissive region was observed under an electron microscope. The optimum dose (Eop) was the dose (mJ/cm$^2$) that gave a line width of 45 nm. The cross-sectional profile of the pattern formed at the optimum dose was observed under an electron microscope and judged passed or rejected according to the following criterion.

Passed: pattern of perpendicular sidewall; acceptable profile

Rejected: T-top profile with surface layer substantially clogged or inversely tapered profile of pattern with graded sidewall (greater line width nearer to surface layer); unacceptable profile The collapse limit was a minimum width (nm) of lines which could be resolved without collapse when the line size was narrowed by decreasing the exposure dose. A smaller value indicates better collapse resistance. In this test, the sample was rated good when the collapse limit is equal to or less than 33 nm and poor when the collapse limit is equal to or more than 34 nm.

The test results of the resist materials in Table 4 are shown in Table 6.

TABLE 6

|  |  | Resist | Eop (mJ/cm$^2$) | Collapse limit (nm) | Profile |
|---|---|---|---|---|---|
| Example | 3-1 | R-01 | 35 | Good 30 | Passed |
|  | 3-2 | R-02 | 32 | Good 29 | Passed |
|  | 3-3 | R-12 | 36 | Good 29 | Passed |
| Comparative Example | 3-1 | R-21 | 33 | Poor 38 | Rejected |
|  | 3-2 | R-22 | 30 | Poor 37 | Rejected |

It is evident from the data of Table 6 that when the resist compositions within the scope of the invention are subjected to organic solvent negative development, patterns of good profile having collapse resistance are formed.

While the invention has been described with reference to a preferred embodiment, it will be understood by those skilled in the art that various changes may be made without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2012-004701 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer, an acid generator, a sulfonium salt or iodonium salt of fluoroalkanesulfonamide, and an organic solvent, said polymer comprising acid labile group-substituted recurring units having the general formula (1):

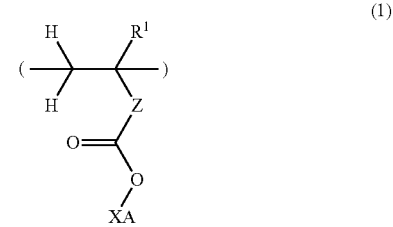

wherein $R^1$ is hydrogen, fluorine, methyl or trifluoromethyl, Z is a single bond, phenylene, naphthylene or (backbone)-C(=O)-O-Z'-, Z' is a straight, branched or cyclic $C_1$-$C_{10}$ alkylene group which may contain a hydroxyl radical, ether bond, ester bond, or lactone ring, or a phenylene or naphthylene group, and XA is an acid labile group, said sulfonium salt or iondonium salt of fluoroalkanesulfonaminde being at least one selected from the group consisting of the following compounds:

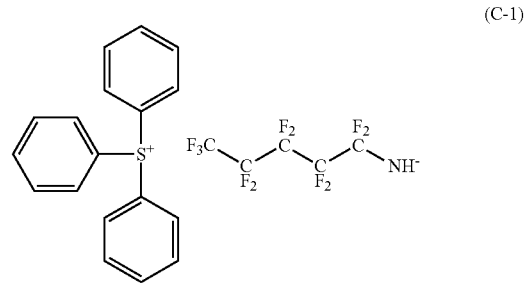

-continued

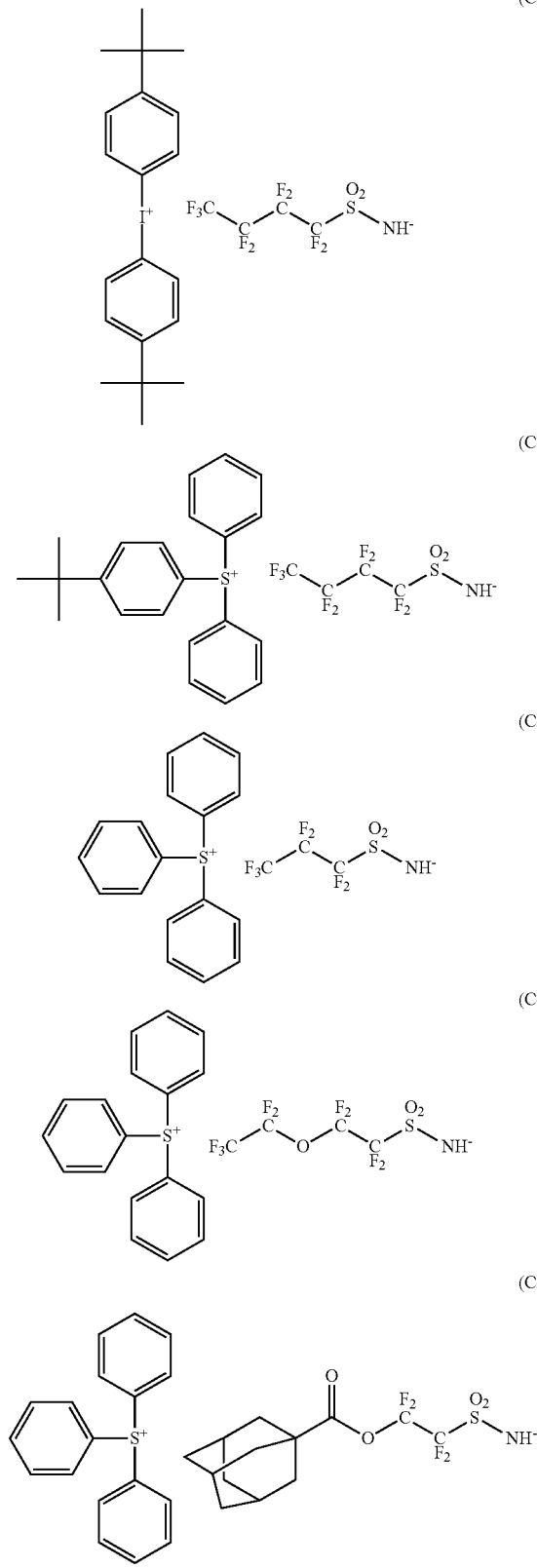

2. A pattern forming process comprising the steps of applying a resist composition onto a substrate, prebaking to form a resist film, exposing the resist film to high-energy radiation, baking, and immersing in an alkaline developer to form a positive pattern wherein the exposed region of resist film is dissolved away, but not the unexposed region, the resist composition comprising a polymer comprising recurring units having a carboxyl group substituted with an acid labile group and an acid generator, or a polymer comprising recurring units having a carboxyl group substituted with an acid labile group and recurring units capable of generating acid upon exposure, a sulfonium or iodonium salt of fluoroalkanesulfonamide, and an organic solvent, the sulfonium or iodonium salt of fluoroalkanesulfonamide being at least one selected from the group consisting of the following compounds:

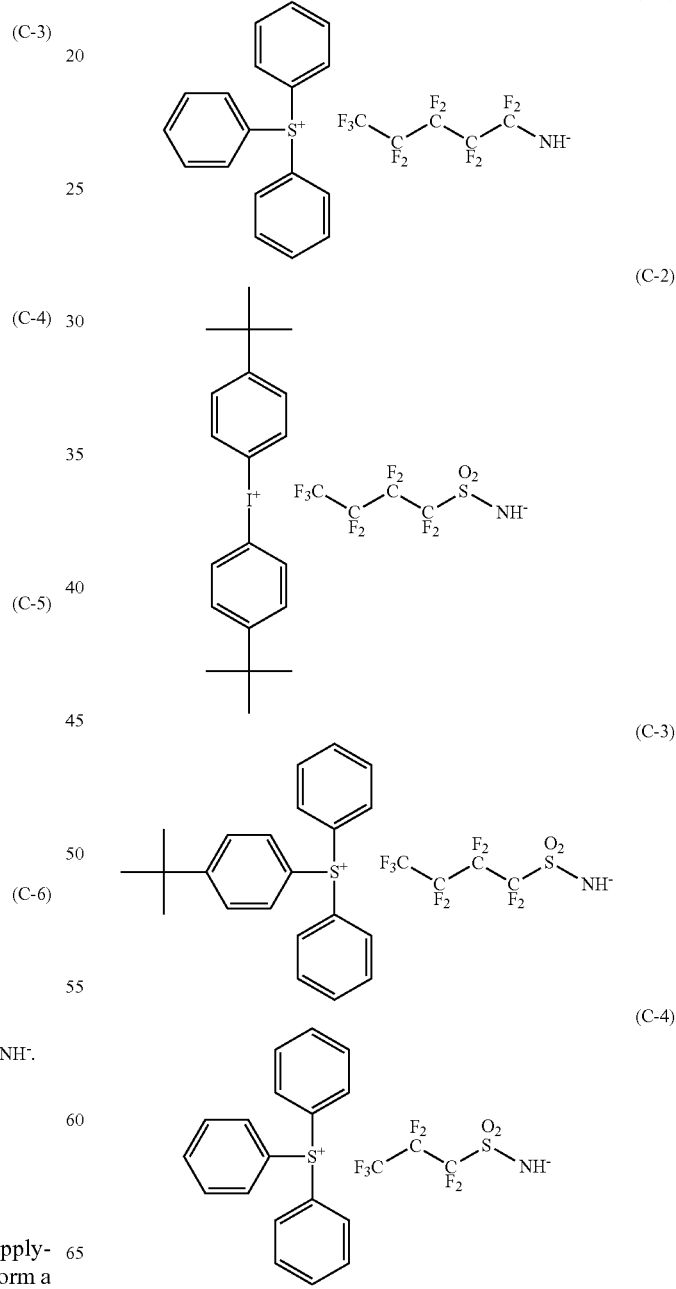

-continued (C-5)

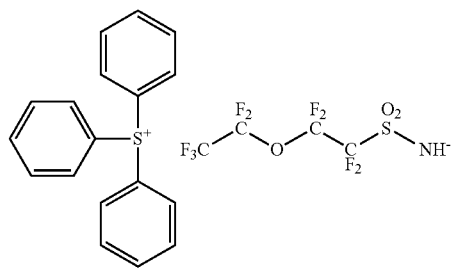

(C-6)

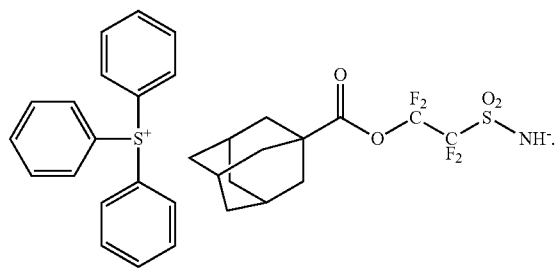

3. The pattern forming process of claim 2 wherein the polymer comprising recurring units having a carboxyl group substituted with an acid labile group is a polymer comprising recurring units having an acid labile group represented by the general formula (1) and recurring units of at least one type selected from the general formulae (2) and (3):

(1)

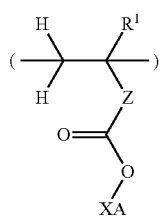

(2)

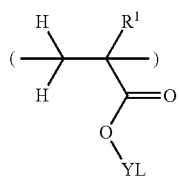

(3)

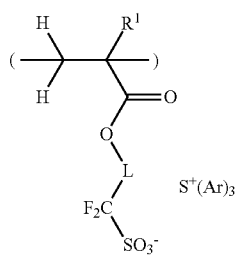

wherein $R^1$ is hydrogen, fluorine, methyl or trifluoromethyl, Z is a single bond, phenylene, naphthylene or (backbone)-C(=O)—O—Z'—, Z' is a straight, branched or cyclic $C_1$-$C_{10}$ alkylene group which may contain a hydroxyl radical, ether bond, ester bond, or lactone ring, or a phenylene or naphthylene group, XA is an acid labile group, YL is hydrogen, or a polar group having one or more structures selected from the group consisting of hydroxyl, cyano, carbonyl, carboxyl, ether bond, ester bond, sulfonic acid ester, carbonate bond, lactone ring, sultone ring, and carboxylic anhydride, L is a single bond, or a divalent hydrocarbon group which may have an ether bond or ester bond, and Ar is a substituted or unsubstituted $C_6$-$C_{20}$ aryl group which may contain a heteroatom, a plurality of Ar groups may bond together directly or via an oxygen atom, methylene, sulfonyl or carbonyl moiety.

4. The pattern forming process of claim 2 wherein the step of exposing the resist film to high-energy radiation includes dry or immersion lithography using ArF excimer laser of wavelength 193 nm, EUV lithography of wavelength 13.5 nm, or EB imaging.

5. The pattern forming process of claim 2, comprising the steps of applying the resist composition onto a substrate, prebaking to form a resist film, forming a protective film on the resist film, exposing the resist film to high-energy radiation, baking, and immersing in a developer to dissolve away the protective film and the exposed region of resist film, but not the unexposed region, for thereby forming a positive pattern.

* * * * *